United States Patent [19]

Matsuyama et al.

[11] Patent Number: 5,296,036
[45] Date of Patent: Mar. 22, 1994

[54] APPARATUS FOR CONTINUOUSLY FORMING A LARGE AREA FUNCTIONAL DEPOSIT FILM INCLUDING MICROWAVE TRANSMISSIVE MEMBER TRANSFER MEAN

[75] Inventors: Jinsho Matsuyama, Nagahama; Masahiro Kanai, Hikone, both of Japan

[73] Assignee: Canon Kabushiki Kaisha, Tokyo, Japan

[21] Appl. No.: 800,456

[22] Filed: Nov. 27, 1991

[30] Foreign Application Priority Data

Nov. 29, 1990 [JP] Japan .................................. 2-332679

[51] Int. Cl.5 .................... C23C 16/54; C23C 16/50
[52] U.S. Cl. ................... 118/718; 118/723 ME; 118/725; 118/730; 118/733; 156/345
[58] Field of Search ............... 118/715, 718, 724, 725, 118/729, 723, 723 MW, 723 ME, 723 MR, 723 MA; 427/569, 575; 156/345

[56] References Cited

U.S. PATENT DOCUMENTS

| 3,814,983 | 6/1974 | Weissfloch et al. | 315/39 |
|---|---|---|---|
| 4,400,409 | 8/1983 | Izu et al. | 427/39 |
| 4,438,723 | 3/1984 | Cannella et al. | 118/718 |
| 4,504,518 | 3/1985 | Ovshinsky et al. | 427/38 |
| 4,517,223 | 5/1985 | Ovshinsky et al. | 427/39 |
| 4,521,717 | 6/1985 | Kieser | 315/39 |
| 4,729,341 | 3/1988 | Fournier et al. | 118/723 |
| 4,869,931 | 9/1989 | Hirooka et al. | 427/755.2 |
| 4,909,184 | 3/1990 | Fujiyama | 118/723 |
| 4,951,602 | 8/1990 | Kanai | 118/719 |
| 4,995,341 | 2/1991 | Matsuyama | 118/723 |
| 5,002,617 | 3/1991 | Kanai et al. | 136/256 |
| 5,038,713 | 8/1991 | Kawakami et al. | 118/723 |
| 5,114,770 | 5/1992 | Echizen et al. | 427/575 |
| 5,130,170 | 7/1992 | Karai et al. | 427/575 |

FOREIGN PATENT DOCUMENTS 55-141729 11/1980 Japan.
57-133636 8/1982 Japan.
61-288074 12/1986 Japan.

Primary Examiner—Brian E. Hearn
Assistant Examiner—Jonathan D. Baskin
Attorney, Agent, or Firm—Fitzpatrick, Cella, Harper & Scinto

[57] ABSTRACT

In a method for continuously forming a large area functional deposit film comprising the steps of forming a column-shaped film deposition space with a strip type member being conveyed as the side walls thereof in the longitudinal direction of the strip type member on the way of its continuous conveyance, introducing deposit film formation material gas into the film deposition space through gas supplying means, generating microwave plasma in the film deposition space simultaneously by emitting microwave energy from the microwave applicator means which enables the emission of the microwave energy in the direction parallel to the progressing direction of the microwave, and forming such a deposit film on the surface of the strip type member to form the side walls which are exposed to the microwave plasma, the microwave applicator means is arranged either on one side or on both sides of the both end faces of the column-shaped film deposition space, a microwave transmitting member is arranged on the leading end portion of the microwave applicator means to separate it from the film deposition space airtightly and transmit the microwave energy emitted therefrom to the film deposition space through the microwave transmittable member which is adjacently coupled to the film deposition space and which is transferred from the film deposition space intermittently to an airtightly separable auxiliary chamber while maintaining the airtightness of the film deposition space, and the microwave transmittable member is replaced or a dry etching is performed in the auxiliary chamber.

6 Claims, 14 Drawing Sheets

APPARATUS FOR CONTINUOUSLY FORMING A LARGE AREA FUNCTIONAL DEPOSIT FILM INCLUDING MICROWAVE TRANSMISSIVE MEMBER TRANSFER MEAN

BACKGROUND OF THE INVENTION

1. Field of the Invention

The present invention relates to a method for continuously forming a large area functional deposit film by resolving and exciting material gas with plasma reaction caused by the microwave plasma which is generated evenly over a large area and an apparatus therefor.

More particularly, the invention relates to a method capable of continuously forming a functional deposit film over a large area uniformaly at high speeds with a significant enhancement of the utilization efficiency of the aforesaid material gas and an apparatus therefor, thereby making possible the implementation of a large scale fabrication of large area thin film semiconductor devices such as photovoltaic elements at low cost specifically.

2. Related Background Art

In recent years, electric power consumption has been rapidly increasing worldwide, and along with the active generation of electric power to meet such an enormous demand, the problem of environmental pollution is becoming more serious.

In this regard, in the nuclear power generation which is anticipated as a power generation to take the place of thermal power generation and which has already come into the stage of practical use, there has occurred a serious situation as represented by the accident in Chernobyl Atomic Power Station where serious radioactive contamination have caused damage to the human body as well as have polluting natural environments, leading to the slow down of the future promotion of the nuclear power generation. In fact, there are even some nations that have enacted laws banning the new construction of atomic power stations.

Also, in thermal power generation, the consumption of fossil fuel represented by coal and petroleum has just been on the increase to meet the growing demands on the power, and along with this, the amount of discharged carbon dioxide has increased causing the greenhouse effect gas density of carbon dioxide in the atmosphere to increase, introducing the phenomenon which causes the surface temperature of the earth to be increased. As a matter of fact, the annual average of the earth's temperature is steadily on the increase year after year, and IEA (International Energy Agency) has proposed that the discharge of carbon dioxide should be reduced by 20% by the year 2005.

Whereas such a background as this exists, it is inevitable that the demands on the power will increase in the developing countries along with the increasing populations there. Then, together with the more popularized use of electronics in the life style in the developed nations, resulting in the increased power consumption per capita, the subject of the power supply has reached the stage where its solution should be discussed globally.

Under such circumstances, the power generation by the solar cells which utilize the solar rays of light is now the subject attracting attention as a clean power generation system which can be employed to meet the increasing demand on the power in the future without creating environmental destruction not only because this system does not present such problem as the aforesaid radioactive contamination or temperature rise of the earth surface, but also because there is almost no uneven distribution of energy source thanks to the fact that the solar rays of light cover all over the earth and further a comparatively high generation efficiency without the necessity of complicated large facilities. Various researches and developments of this type of power generation are in progress for its practical use. Now, in order to implement the power generation system using the solar cells to meet the demands on the power, it is fundamentally necessary that the solar cells which are adopted for the purpose should be sufficiently high in the photoelectric conversion efficiency and excellent in the characteristic stability thereof, and that those solar cells can be fabricated in a large scale production.

In this regard, it should be required to provide a solar cell capable of outputting approximately 3 kW per household is order to supply the power generally needed by a family. Then, assuming that the photoelectric efficiency of such a solar cell is approximately 10%, for example, the required area of the solar cell for the needed output should become approximately 30 $m^2$. Then, to supply the 100,000 households with the power, for example, it is necessary to provide the solar cells having an area of as much as 3,000,000 $m^2$.

In this respect, there have been proposed various manufacturing methods for fabricating solar cells in a large scale by using a material gas such as gaseous silane which is easily obtainable and by resolving it with glow discharging so as to deposit a semiconductor thin film such as amorphous silicon on a comparatively low cost substrate such as glass or metal sheet in consideration of the possibility of a low-cost production of the solar cells as compared with the solar cells using single crystal silicon and others.

In the power generation using solar cells, it is often adopted to connect the unit modules in series or parallel to unify them for obtaining a desired current and voltage. In this respect, it is a prerequisite that there occur no disconnection or short circuit between each of the modules. It is equally important that there is no irregularity in the output voltage and output current among the modules. Consequently, at least in the stage where the unit modules are fabricated, it is a prerequisite to secure the characteristic uniformity of semiconductor layer itself which is the most significant element to determine its characteristics. Then, from the viewpoint of easier module designing and simpler module assembling process, it is required to provide a semiconductor deposit film having the characteristic uniformity over its large area for enhancing the capability of producing solar cells in a large scale as well as for achieving a significant reduction of manufacturing cost.

Regarding solar cells, the semiconductor layer which is its important component is of the so-called pin junction, and other semiconductor junctions. These semiconductor junctions are implemented by stacking semiconductor layers of different conductivity sequentially or by implanting dopant of different conductivity into a conductive semiconductor layer by the ion implantation method or performing diffusion by thermal diffusion.

If these aspects are observed from the standpoint of the solar cells using the semiconductor thin film of the aforesaid amorphous silicon and others which attract the attention of those who are in the art, the semiconductor film having a desired type of conductivity can be obtained by mixing material gas containing the element which acts as dopant such as phosphine (PH$_3$), diboran (B$_2$H$_6$), and the like with the silane and others which are main material gas and resolving the mixture by glow discharging in the process of forming such semiconductor films, which are subsequently stacked on a desired substrate sequentially to form deposit layers to implement the semiconductor junction easily. Then, based on this, there has been proposed a method for fabricating amorphous silicon solar cells in such a manner that individual film-formation chambers are provided for forming each of the semiconductor layers and the respective formation of the semiconductor layers is performed in each individual chamber.

In this respect, a continuous plasma CVD apparatus adopting Roll to Roll method is disclosed in the patent specification of U.S. Pat. No. 4,400,409. According to this apparatus, a plurality of glow discharging areas are provided and a sufficiently long plastic substrate having a desired width arranged along the path whereby the aforesaid substrate can be conveyed to penetrate each of the aforesaid glow discharging areas. In each of the glow discharging areas, while the deposit formation of the semiconductor layer of the required type of conductivity is being performed, the aforesaid substrate is continuously conveyed in its longitudinal direction to form the element having the semiconductor junction in succession. Here, in the aforesaid specification, gas gates are employed to prevent the dopant gas used for each of the semiconductor layers from being diffused into the other glow discharging areas so that the gases are mixed. More specifically, the aforesaid glow discharging areas themselves are separated from each other by slit type separating passages and in addition, a means for forming a flow of cleaning gas such as Ar, H$_2$, or the like is employed in each of the separating passage. With this in view, the Roll to Roll method can be regarded as a method suited for fabricating semiconductors in a large scale. Nevertheless, the aforesaid formation of each semiconductor layer being performed by the plasma CVD using RF (radio frequency), there is automatically a limit in implementing the improvement of the film deposition speed while maintaining the characteristics of the film to be formed continuously. In other words, it is necessary to generate a specific plasma for a considerable length and large area at all times even for forming a semiconductor layer of just 5,000 Å thick as well as to maintain the aforesaid plasma uniformly. However, in order to fulfill such requirements, a considerable displine is needed, making it difficult to generalize various plasma parameters related thereto. Also, the resolving efficiency and utilization efficiency of the material gas for the film formation are rather low, resulting in one of the reasons to make the manufacturing costs high.

Also, in this respect, a deposit film formation apparatus using an improved Roll to Roll method is disclosed in Japanese Patent Laid-Open Application No. 61-288074. In this apparatus, a hood type slacking portion is formed in a part of flexible continuous sheet substrate to be accommodated in its reaction container, and an active seed produced in an activated space which is different from the aforesaid reaction container and some other material gas as required are introduced into the container. Then, this apparatus is characterized by causing the gases to be chemically interacted by thermal energy to form the deposit film on the inner plane of the sheet substrate having the aforesaid hood type slacking portion formed thereon. Thus, by making the deposit film on the inner plane of the hood type slacking portion thereof, it is possible to make the apparatus compact. Furthermore, as the active seed which has been activated in advance is used, it is possible to make the film formation speed faster than the conventional deposit film formation apparatus.

Nevertheless, this apparatus utilizes the deposit film formation reaction by the chemical interaction with the presence of thermal energy, and in order to make a further improvement of the film formation speed, it is necessary to introduce more amount of the active seed and more supply of the thermal energy. There are automatically limits in the method of supplying a large amount of thermal energy uniformly and in the method of generating a large amount of active seed having a high reactivity to be introduced in a reaction space without loss.

Meanwhile, a plasma process using microwave has attracted the attention of those who are in the art recently. Since the microwave has a shorter frequency band, it is possible to intensify the energy density as compared with the conventional method using the RF, and this process is considered more suitably adaptable to generating plasma more efficiently.

For example, in the specifications of U.S. Pat. No. 4,517,223 and U.S. Pat. No. 4,504,518, a method of forming thin deposit film on a small area substrate in a low-pressure microwave glow discharging plasma is disclosed. According to this method, it is not only possible to obtain a high-quality deposit film because the polimerization of active seed which can be a cause of film characteristic deterioration is prevented because of the low-pressure process, but also possible to restrain the generation of particles of polysilane and others in plasma as well as to implement a substantial improvement of the deposition speed. However, there is no specific disclosure as to the performance of any uniform deposit film formation in a large area.

Meanwhile, in the specification of U.S. Pat. No. 4,729,341, there are disclosed a low-pressure microwave plasma CVD method and apparatus therefor to form a photoconductive semiconductor deposit thin film on a large area cylindrical substrate by using a pair of radiator type waveguide applicators for a high-power processing. However, the large area substrate is limited only to a cylindrical substrate, that is, a drum used as a photoreceptor for electronic photography, and there is no disclosure as to the application to the large area and long substrate. Also, the manufacturing process of the deposit film is of a butch system and the quantity of the deposit film that can be fabricated per charge is limited. There is no disclosure as to the method for forming deposit film in a large quantity continuously on a large area substrate, either.

Now, the plasma using microwave has the short wavelength which is apt to generate the unevenness of energy. Therefore, there are various problems still to be solved as to the application of the plasma using microwave to the large area processing.

For example, a slow-wave circuit can be utilized as an effective means to make the microwave energy uniform, but this slow-wave circuit has its particular problem that a rapid drop in microwave coupling to plasma occurs as the distance increases in the lateral direction of the microwave applicator. Therefore, as a means of solving this problem, a method is attempted to make the energy density uniform in the vicinity of the surface of the substrate where the distance between the processing object and the slow-wave circuit should be changed. Such a method is disclosed in the specifications of U.S. Pat. No. 3,814,983 and U.S. Pat. No. 4,521,717, for example. In the former, it is disclosed that while the slow-wave circuit should be inclined at an angle to the substrate, the transmitting efficiency of the microwave energy to the plasma is not satisfactory. Also, in the latter, while it is disclosed that two non-parallel slow-wave circuits should be provided within the area parallel to the substrate. In other words, the planes themselves which are perpendicular to the center of the microwave applicator should preferably be arranged within the surface parallel to the object substrate in such a manner that these planes intersect each other on the straight line at right angles to the conveying direction of the substrate. Also, it is disclosed that in order to avoid the interference between the two applicators, the applicators themselves should be arranged with a deviation laterally in the conveying direction of the substrate in a length corresponding to half the cross bar of the waveguide. Also, several proposals are made as to methods of maintaining the uniformity of the plasma (i.e., the uniformity of energy). Such proposals are noticed, for example, in the reports published in Journal of Vacuum Science Technology, B-4 (January - February, 1986) pp. 295-298 and in the same journal B-4 (January - February, 1986) pp. 126-130. According to these reports, a microwave reactor called microwave plasma-disc-source (MPDS) has been proposed. In other words, the plasma is of a disc type or table type and its diameter is the function of microwave frequency. Then, the reports disclose the contents such as given below. In other words, at first, the plasma-disc-source can be varied by the microwave frequency. However, in a microwave-plasma disc-source designed to be operated by 2.45 GHz, the confinement diameter of plasma is as small as approximately 10 cm and the plasma volume is also just 118 cm$^3$. This cannot be regards as the area having been enlarged at all. Also, according to the aforesaid reports, in a system designed to be operated at a low frequency as 915 MHz, it is possible to obtain the plasma diameter of approximately 40 cm and the plasma volume of 2,000 cm$^3$ by lowering the frequency. The aforesaid reports disclose further that by operating at a lower frequency, 400 MHz for example, the discharge can be expanded to a diameter of more than 1 m. However, the apparatus which can attain this objective requires an extremely expensive specific system.

In other words, it is possible to attain making the plasma area large by lowering the microwave frequency. However, the microwave source capable of providing a high output in such a low frequency band is not available in general and it is difficult to procure the source or even if it can be procured, only at an extremely high cost. Also, then, it is more difficult to procure a high output variable frequency microwave source.

Likewise, there are proposed in Japanese Patent Laid-Open Application No. 55-141729 and Japanese Patent Laid-Open Application No. 57-133636 a method as means for generating a high density plasma efficiently by the use of microwave, in which the ECR (electron cyclotron resonance) condition is satisfied by arranging electromagnets around a cavity resonator, and in its academic society and others, many reports have been made to disclose the formation of various semiconductor thin films by the utilization of this high density plasma. A microwave ECR plasma CVD apparatus of the kind has already been available commercially on the market.

However, in the methods using the ECR, the magnets are adopted to control the plasma. Thus, in addition to the ununiformity of the plasma due to the wavelength of the microwave, there occurs the ununiformity in the magnetic field distribution, making it technically difficult to form the deposit film evenly over the large area substrate. Also, in a case where an apparatus should be made larger to deal with a large area, the electromagnets become great automatically, hence creating many problems to be solved before the system is put into practice, such as the weight and space which will be increased accompanying the use of the larger magnets, the necessity of countermeasure against the heat generation, and the provision of the stabilized direct current source for supplying a large current.

Further, as regards the deposit film thus formed, the characteristics thereof have not reached the equal level as the one formed by the conventional RF plasma CVD method, and the deposit film formed in the space where the ECR condition is satisfied is extremely different from the deposit film formed in the space other than ECR condition, such as the space of the so-called divergent magnetic field in the characteristics and deposition speeds. As a result, this method cannot be regarded as a suitable method for fabricating the semiconductor device which requires especially a high-quality and uniformity.

In the aforesaid specifications of the U.S. Pat. No. 4,517,223 and U.S. Pat. No. 4,729,341, it is disclosed that the maintenance of extremely low pressures is required in order to obtain the high density plasma. In other words, it is absolutely necessary to perform the processing under low pressures for the enhancement of the gas utilization efficiency. However, in order to maintain the relationship between the high deposition speed, high gas utilization efficiency, high power density, and the low pressure, the application of either the slow-wave circuit or the electron cyclone resonance method disclosed in the aforesaid patent specification is still insufficient.

Therefore, it is desired that a new microwave plasma process should be provided as early as possible by solving the various problems existing in the microwave means mentioned above.

Now, the thin film semiconductors are suitably used not only for the fabrication of the aforesaid solar cells but also for the thin film transistors (TFT) for driving the pixels of a liquid crystal display, photoelectric conversion element for the contact image sensors, switching elements and the like, for which it is imperative that the thin semiconductor device to be used should have a large area and a long length. While some of them have already in practical use as a key component for the aforesaid image input/output apparatus, for example, it is expected that the provision of a new deposit film formation method whereby to fabricate a high-quality large area film having an excellent uniformity at high speeds enables the thin film semiconductor to be used more widely in general.

Also, in the microwave plasma CVD method, when a large current microwave is introduced for the deposit film formation to resolve the film formation gas, it has generally been a practice as a method to propagate the microwaves generated by a microwave source through a waveguide and introduce them into a film formation chamber through a dielectric having an excellent microwave transmissivity (hereinafter referred to as microwave transmittable member) for the resolution of the film formation gas.

According to this method, however, the plasma of the film formation gas using the microwave is in contact with the surface of the aforesaid microwave transmittable member and therefore the problem is created that the deposit film also adheres to the surface of the microwave transmittable member.

The deposit film adhering to the surface of the microwave transmittable member becomes a reflecting element or absorbing element of microwaves although its degree differs depending on the material to be deposited thereon, and causes the microwaves passing through the microwave transmittable member to be reduced, creating the problem that such a deposition results in slowing down the deposition speed of the deposit film or changing the characteristics of the deposit film.

Also, the deposit film adhering to the microwave transmittable member absorbs the microwaves to cause it to be heated and temperature difference is generated in the microwave transmitting member, leading to the possibility that this member will eventually be damaged.

When the deposit film should be formed continuously for a long time or the microwave introducing current is large so that the deposit film formation speed is high, the above-mentioned problem is more serious because the film thickness of the deposit film adhering to the microwave transmittable member becomes great.

Therefore, it is necessary to replace the aforesaid microwave transmitting member or to perform an etching of the deposit film adhering to the microwave transmittable member before a trouble such as the reduction of the microwave transmittance or the damage on the microwave transmitting member may result.

The frequency with which the microwave transmitting member should be replaced depends greatly on the kinds of the deposit film to be formed or the deposition speed of the deposit film adhering to the microwave transmitting member. However, while the microwave transmittable members are being replaced, the formation of the deposit film should be suspended. Consequently, the longer it takes to replace the microwave transmitting members, the more the production speed of the deposit film is reduced. For example, if the film deposition chamber should be leaked for the replacement of the microwave transmittable members, then the air in the film deposition chamber is again exhausted and a time is required until the influence of the water absorbed is reduced. Also, there is a method for performing a dry etching in the film deposition chamber to remove the deposit film which has adhered to the microwave transmittable member, but the composition of the dry etching gas remains in the film deposition chamber, thus causing in some cases the characteristics of the deposit film to be lowered because of the mixture of this remaining composition with the deposit film when its formation is resumed.

SUMMARY OF THE INVENTION

The present invention is designed to overcome the various problems genuine to the conventional methods and apparatus for forming semiconductor thin film as described above, and the object thereof is to provide a new method for forming functional deposit film uniformly over a large area at high speeds and an apparatus therefor.

Another object of the present invention is to provide a method for forming functional deposit film continuously on a strip member and an apparatus therefor.

Still another object of the present invention is to provide a method capable of implementing a substantial enhancement of the utilization efficiency of the material gas used for the deposit film formation and an apparatus therefor.

A further object of the present invention is to provide a method for generating microwave plasma substantially uniformly over a large area and a large volume and an apparatus therefor.

Still a further object of the present invention is to provide a new method for forming photovoltaic elements having high efficiency and high photoelectric conversion efficiency continuously on a comparatively wide and long substrate and an apparatus therefor.

Yet a further object of the present invention is to provide a method for solving the problem presented by the adhesion of deposit film to the microwave transmitting member in the case where microwave plasma is generated to form the deposit film continuously on a substrate and an apparatus therefor.

DETAILED DESCRIPTION OF THE PREFERRED EMBODIMENTS

Figure 1:
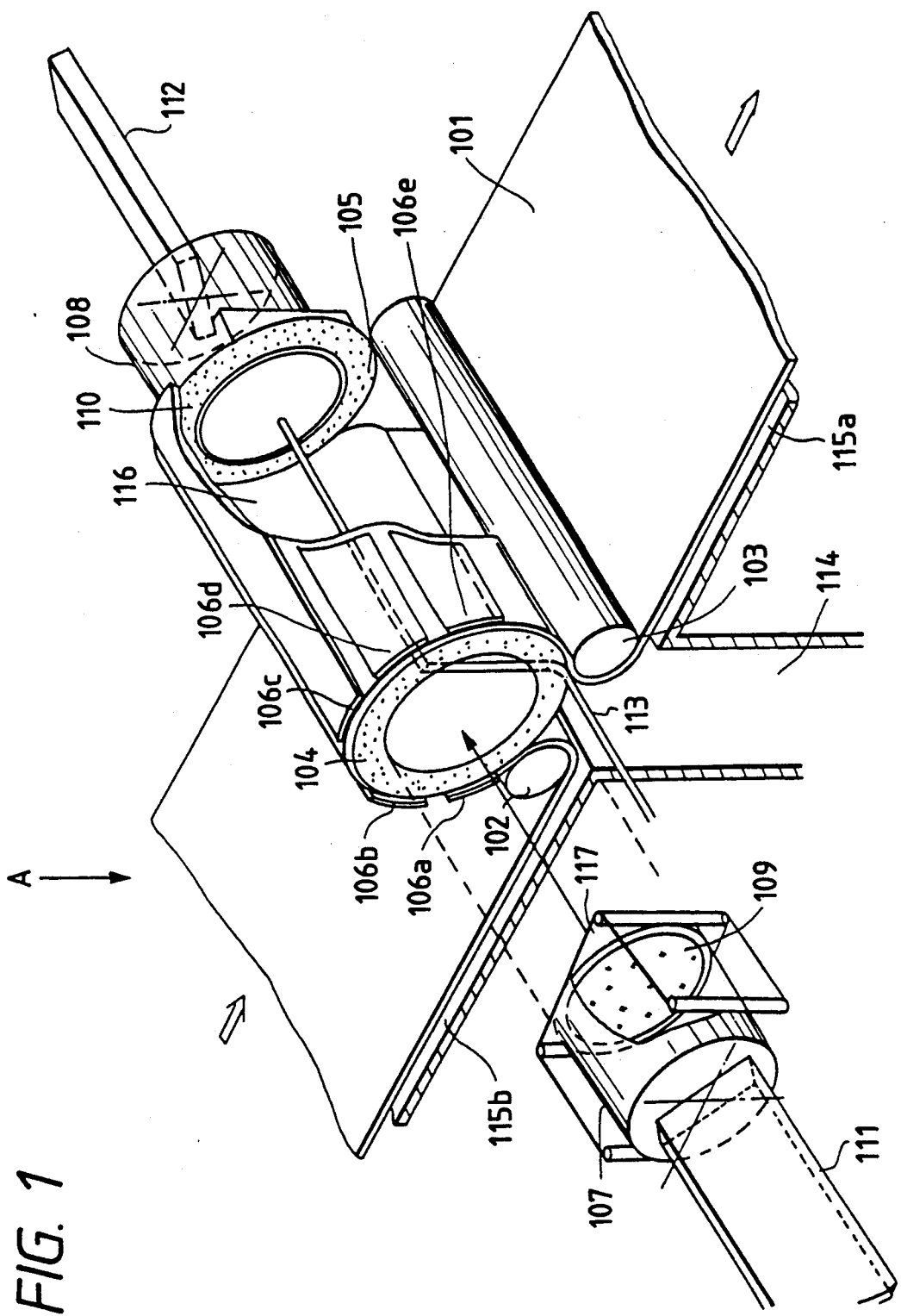
FIG. 1 is a schematic view illustrating an example of a microwave plasma CVD apparatus according to the present invention.

The present inventor et al. hereof have solves the existing problems described above in relation to the conventional apparatus for fabricating the semiconductor devices and have carried out the research and development intensively so as to achieve the above-mentioned objects of the present invention. As a result, it has been discovered that microwave plasma can be generated substantially uniformly in the width direction of a strip type member in a film deposition chamber in such a manner that the strip type member is bent through the holding and conveying ring for forming the holding and conveying roller bending portion to form the bending strating end as well as the holding and conveying roller to form the bending terminating end with a space between the aforesaid holding and conveying rollers themselves, so that a column-shaped film deposition chamber is formed with the aforesaid strip type member as side walls; on both end faces of the aforesaid film deposition chamber, a pair of microwave applicator means are arranged facing each other so as to emit the microwave energy in the direction parallel to the progressing direction of the microwaves; then material gas for deposit film formation is introduced into the aforesaid film deposition chamber; the pressure in the film deposition chamber is maintained under a predetermined deduction; and then the microwave energy is emitted from the aforesaid microwave applicator means substantially in parallel with the aforesaid side walls.

Also, it has been discovered that any adverse effects caused by the deposit film adhering to the microwave transmittable member can be removed in such a manner that the microwave transmittable member is provided adjacent to the aforesaid film deposition chamber and then transferred to an auxiliary chamber which can be separated from the aforesaid film deposition chamber to perform the replacement of the microwave transmittable members or the etching of the deposit film which has adhered to the microwave transmittable member.

The present invention has been completed after further studies on the basis of the above-mentioned discoveries and includes a method for forming a large area functional deposit film continuously by a microwave plasma CVD method the essence of which will be given below and an apparatus therefor.

A method according to the present invention is such as given below. In other words, while a strip type member is being conveyed continuously in the longitudinal direction, a column-shaped film deposition space is formed on its way with the aforesaid strip type member being conveyed as the side walls thereof. Then, into such film deposition space, the deposit film formation material gas is introduced through gas supplying means and at the same time, the microwave energy is emitted from the microwave applicator means which are arranged to emit the microwave energy in the direction parallel to the progressing direction of the microwaves to cause the microwave plasma to be generated in the aforesaid film deposition space, so that the aforesaid side walls are structured to be exposed to the microwave plasma thus generated. Hence, on the surface of the aforesaid strip type member being in conveyance continuously, a large area functional deposit film is formed in succession. In this method, the aforesaid microwave applicator means are at either one side or both sides of the both ends of the column-shaped film deposition space formed with the aforesaid strip type member as the side walls. Then, at the leading portion of the microwave applicator means, there is provided the microwave transmittable member for performing the airtight separation between the film deposition space and microwave applicator means as well as for transmitting the microwave energy emitted from the microwave applicators to the film deposition space, and the microwave energy is caused to be emitted into the film deposition space by the microwave applicator means through the microwave transmittable member and at the same time, the aforesaid microwave transmittable member is adjacently coupled to the film desposition space while maintaining the airtightness between the aforesaid space and this member so as to allow itself to be transferred intermittently into the auxiliary chamber which can be airtightly separated from the film deposition space. Then, the method is characterized by forming the large area functional deposit film continuously with the replacement of the microwave transmittable member or the performance of the dry etching in the aforesaid auxiliary chamber.

According to the present invention, when the aforesaid microwave applicator means are arranged to face each other on the aforesaid both end faces, it is preferable to make an arrangement so that the microwave energy emitted from one microwave applicator means is not received by the other microwave applicator means.

Also, it is preferable to arrange it so that the microwave energy emitted into the aforesaid column-shaped film deposition space does not leak outside the film deposition space.

It is preferable to enable the deposit film formation material gas introduced into the film deposition space to be exhausted from the remaining space in the longitudinal direction of the strip type member between the aforesaid curve starting end formation means and the curve terminating end formation means.

In a method according to the present invention, a conductive processing should be given at least to one of the faces of the aforesaid strip type member.

An apparatus according to the present invention is such as given below. In other words, the apparatus has a column-shaped film deposition chamber capable of maintaining its inside essentially in vacuum, which is formed in such a manner that while a strip type member is being conveyed continuously in the longitudinal direction, the chamber is constructed on its way with the aforesaid strip type member being conveyed as the side walls thereof, and is provided with microwave applicator means arranged to emit the microwave energy in the direction parallel to the progressing direction of the microwaves for generating microwave plasma in the aforesaid film deposition chamber, exhausting means for enabling the air in the film deposition chamber to be exhausted, means for introducing the deposit film formation gas into the film deposition chamber, and temperature control means for heating and/or cooling the aforesaid strip type member, thus constituting a functional deposit film continuous formation apparatus for forming the deposit film continuously on the surface of the aforesaid strip type member, the surface being exposed to the microwave plasma. Here, the aforesaid microwave applicator means are arranged at either one side or both sides of the both ends of the column-shaped film deposition chamber formed with the aforesaid strip type member as the side walls. Then, at the leading portion of the microwave applicator means, there is provided the microwave transmitting member for performing the airtight separation between the film deposition chamber and microwave applicator means as well as for transmitting the microwave energy emitted from the microwave applicators to the film deposition chamber. Then, the functional deposit film continuous formation apparatus is characterized by arranging an auxiliary chamber which is adjacently coupled to the film deposition chamber and can be airtightly separated therefrom, and a mechanism whereby the aforesaid microwave transmitting member can travel between the film deposition chamber and auxiliary chamber while maintaining the airtightness therebetween.

In an apparatus according to the present invention, it is preferable that the aforesaid curve portion formation means is structured at least with a pair or more pairs of the curve starting formation means and curve terminating formation means, and that the aforesaid curve starting formation means and curve terminating formation means are arranged so that a space can remain in the longitudinal direction of the aforesaid strip type member.

It is preferable that the aforesaid curve portion is structured at least with a pair of holding and conveying roller and holdings and conveying rings, and that the aforesaid pair of holding and conveying rollers are arranged in parallel with a remaining space in the longitudinal direction of the aforesaid strip member.

In an apparatus according to the present invention, it is possible to transmit the aforesaid microwave applicator means through a square and/or oval waveguide, for example.

In the case where the aforesaid microwave applicator means are arranged to face each other on both end faces of the aforesaid film deposition chamber, it is preferable that the plane including the longitudinal side of the aforesaid square and/or oval waveguide connected to the aforesaid microwave applicator means, the planes including the major axis, or the plane including the longitudinal side and the plane including the major axis are arranged to be in parallel with each other themselves.

Also, it is preferable that the angles formed by the plane including the longitudinal side and/or the major axis of the square and/or oval waveguide and the plane including the central axis of the aforesaid pair of the holding and conveying rollers are arranged so as not to be perpendicular.

According to a method and apparatus according to the present invention, it is possible to replace the microwave transmitting members or perform the etching thereof without conducting the atmospheric leak of or introducing any etching gas into the film deposition chamber, thereby solving the problem of the slow down of the deposition to the substrate due to the deposit film adhering to the microwave transmitting member or the damage to the microwave transmitting member as well as to significantly shorten the interrupting time in forming the deposit film due to the replacement of the microwave transmittable member or the performance of the etching. As a result, it is possible to eliminate almost all the causes to deteriorate the film quality of the deposit film when the deposit film formation is resumed.

Then, it is possible to improve the operation rate and yield of the deposit film formation.

According to a method according to the present invention, it is possible to form a large area functional deposit film continuously and uniformly in such a manner that while the strip type member which constitutes the side walls of a film deposition space is being conveyed continuously, the microwave applicator means are provided in the width direction of the strip type member which constitutes the aforesaid film deposition space to give orientation to the microwave energy in parallel with the progressing direction of the microwaves or in one vertical direction, or to emit or transmit the microwave energy uniformly in the entire vertical directions, and by confining microwave plasma in the aforesaid film deposition space.

By confining the microwave plasma in the aforesaid film deposition space in accordance with the method and apparatus of the present invention, it is possible to improve the stability and repeatability of the microwave plasma as well as to significantly enhance the utilization efficiency of the deposit film formation material gas. Furthermore, by conveying the aforesaid strip type member continuously, it is possible to make various changes in the curving shape, length, and conveying speed for the formation of a deposit film by a continuous deposition in an arbitrary thickness with an excellent uniformity over a large area.

According to the method and apparatus of the present invention, it is possible to form a functional deposit film continuously with excellent uniformity on the surface of a comparative wide and long strip type member. Therefore, the method and apparatus are particularly suitable for the fabrication of large area solar cells as those usable for a large scale production.

Also, the deposit film can be formed continuously without suspending discharge so that an excellent interfacial characteristic is obtained when a layer built device or the like is fabricated.

Also, the deposit film formation is possible under low pressures so as to restrain the generation of the powdered polysilane as well as the polymerization of active seed and the like, thereby to implement the reduction of the defectives, the improvement of the film characteristics and the enhancement of the stability of the film characteristics.

Consequently, the operation rate and yield can be improved, thus making it possible to implement the large scale production of the high efficiency solar cells at low cost.

Furthermore, the solar cells fabricated by a method and apparatus according to the present invention are high in the photoelectric conversion efficiency and rarely show the characteristic deterioration for a long time.

Now, hereinafter, the description will be made in detail of the experiments that the present inventor et al. have conducted in order to complete the present invention.

EXPERIMENT

Using an apparatus according to the present invention, various experiments have been conducted on the conditions of the microwave plasma generation in order to form a functional deposit film uniformly on a strip type member, the details of which are given below.

EXPERIMENT 1

In the present experiment, an apparatus shown in the apparatus example 2 which will be described later is used. Also, the microwave plasma is generated in the procedures shown in the manufacturing example 1 which will be described later, and the stability of the microwave plasma and the degree of the leakage of the microwave to the film deposition chamber and the like due the difference in the mounting angles of the waveguides 111 and 112 are examined.

Figure 6:
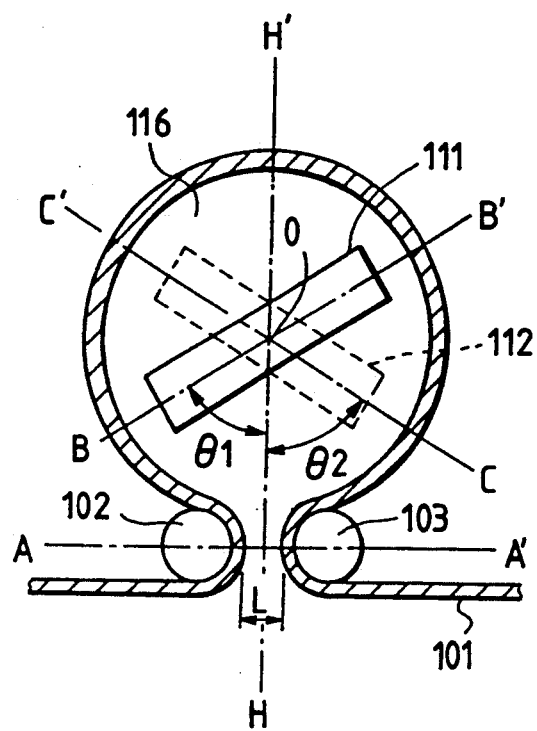
FIG. 6 is a schematic view illustrating the mounting angle of a square waveguide according to the present invention.

FIG. 6 is a schematically cross-sectional view briefly showing the mounting angles of the square waveguides 111 and 112.

In FIG. 6, the square waveguide 111 represented by solid line and square waveguide represented by dotted line are connected to the microwave applicator (not shown) arranged facing the both ends of the film deposition chamber 116, and the square wave guide 111 is arranged in the front side while the square wave guide 112 is arranged in the rear side, for example. A reference numeral 0 designates the center of the curving shape, and A-A', the plane including the central axes of the holding and conveying rollers 102 and 103. The plane perpendicular thereto is given as H-H'. Then, the angle formed by the parallel plane B-B' including the longitudinal side of square waveguide 111 and H-H' is given as $\theta_1$. This is regarded as the mounting angle of the square waveguide 111. Also, the angle formed by the parallel plane C-C' including the longitudinal side of the square waveguide 112 and H-H' is given is $\theta_2$. This is regarded as the mounting angle of the square waveguide 112. Here, in a case where the mounting angles $\theta_1$ and $\theta_2$ of the waveguides 111 and 112 exceed 180° respectively, these are in the symmetrical arrangement with respect to the H-H' in the case of less than 180° with the result that such relationship of the arrangement is identical to the case of less than 180°. The $\theta_1$ and $\theta_2$ face each other and therefore, the relationship of the arrangement is also identical even when these are interchanged with each other as a matter of course.

In the present invention, the space between the curving ends of the strip type member defined by the holding and conveying rollers 102 and 103 is given as L.

Under the conditions of the microwave plasma discharge shown in Table 1, the microwave plasma stability and the like are tested and evaluated in the various conditions of $\theta_1$ and $\theta_2$ combination shown in Table 2.

In this respect, the degrees of the microwave leakage is evaluated by a microwave detector provided at a position approximately 5 cm away from the space between the holding and conveying rollers 102 and 103.

The results of the evaluation are as shown in Table 2.

From these results, it has been found that the microwave plasma stability and the degree of the microwave leakage to the outside of the film deposition chamber vary greatly by changing the mounting angles of the square waveguide of the microwave applicator. Specifically, if $\theta_1$ and/or $\theta_2$ is 0°, then the degree of the microwave leakage becomes the greatest and the discharging state is also unstable. If it is approximately 15°, the leakage degree of the microwave becomes small, but the discharging state is still unstable; also, more than 30°, the microwave leakage is eliminated and the discharging state is also stabilized. However, if the angle formed by the $\theta_1$ and $\theta_2$ is 0° or 180°, i.e., the planes including the longitudinal sides of the square waveguides are positioned in parallel with each other, then the power source noise becomes great due to abnormal oscillation to make the discharge unstable irrespective of the microwave leakage degrees. Here, this discharging experiment has been conducted in a case where the strip type member 101 is at rest and where it is in motion at a conveying speed of 1.2 m/min. No particular difference is observed in the discharging stabilities in both cases.

There are also no particular differences observed in the microwave leakage degrees and discharging stabilities due to the positions of the square waveguides even when the kinds and amounts of flow of the material gas, microwave current, inner diameter of the curving shape, inner pressure of the film deposition chamber and others among the microwave plasma discharging conditions are changed in many ways.

EXPERIMENT 2

In the present experiment, an apparatus shown in the apparatus example 2, which will be described later, is used as in the experiment 1, and the microwave plasma stability, the influence given to the film thickness distribution, and the like are observed when the space L between the holding and conveying rollers 102 and 103 shown in FIG. 6 are varied.

As to the space L, the discharging is conducted for approximately 10 minutes each for various changes within the scope shown in Table 3. For the other discharging conditions of the microwave plasma, the same tests are conducted as shown in Table 1. The mounting angles of the square waveguides $\theta_1$ and $\theta_2$ are set at 45° respectively. However, the changes in pressure in the film deposition chamber have occurred due to the intensifying conductance as the space L has become wider and not due to any particular adjustments of the capacity of the exhaust pump. In this respect, the temperature control mechanisms 106a through 106e are operated so that the surface temperature of the strip type member 101 becomes 250° C., and the conveying speed of the strip type member is set at 35 cm/min.

In Table 3, the evaluation results on the discharging states, film thickness distribution and the like are stated.

In this respect, the discharging states are observed by eyesight while the film thickness distributions are measured by a needle step film thickness detector at 10 points in the width direction and at every 20 points in the longitudinal direction for the evaluation thereof.

From these results, it has been found that by changing the space L without any capacity adjustment of the exhaust pump, the pressure in the film deposition chamber is varied and accompanying such changes, the film thickness distributions of the deposit film to be formed vary particularly in the width direction of the strip type member conspicuously. Also, it has been found that the microwave leakage still occurs in a case where the space L is made too wide even with the mounting angles of the square waveguide being set at the angles where no microwave leakage has occurred in the Experiment 1. Then, the microwave leakage from the space L becomes less when the dimension of the space L is made preferably less than ½ wavelength of the wavelength of the microwave and more preferably, less than ¼ wavelength of the wavelength thereof. Here, the film thickness distributions in the longitudinal direction of the strip type member are almost excellent as far as the strip type member is in conveyance.

The deposition speed of the specimen 4 which has a faster deposition speed and excellent film thickness distributions among the fabricated specimens is approximately 100 Å/sec. Also, the material gas utilization efficiency is 55%, which is obtained by calculating the quantity of the film deposited on the strip type member against the total discharge of the gas.

Furthermore, in the case where the microwave current, inner diameter of the curving shape and the like are changed in many ways among the microwave plasma discharging conditions, slight changes occur in the film thickness distributions and discharging stabilities, but these changes do not present any particular solution to the fundamental problems brought about by the size of the space L.

EXPERIMENT 3

In the present experiment, an apparatus shown in the apparatus example 2, which will be described later, is used as in the Experiment 1, and the microwave plasma stability, the film thickness distribution, and the like are observed when the inner diameter of the curving shape to be formed is changed. As to the inner diameter of the curving shape, various changes are made within the scope shown in Table 4, and all others are the same microwave plasma discharging conditions shown in Table 1. Also, the mounting angles $\theta_1$ and $\theta_2$ are set at 45° respectively. The discharging time is 10 minutes each and the surface temperature of the strip type member is 250° C. as in the Experiment 2 while the conveying speed of the strip type member is set at 35 cm/min.

In Table 4, the evaluation results on the discharging states, film thickness distribution and the like are stated.

In this respect, the discharging states are observed by eyesight while the film thickness distributions are measured by a needle step film thickness detector at 10 points in the width direction and at every 20 cm in the longitudinal direction for the evaluation thereof.

From these results, it has been found that by changing the inner diameter of the curving shape without changing any other discharging conditions, the discharging state varies and accompanying such changes, the film thickness distributions of the deposit film to be formed vary particularly in the width direction of the strip type member conspicuously. Here, the film thickness distributions in the longitudinal direction of the strip type member are almost excellent as far as the strip type member is in conveyance.

Furthermore, it has been found that in the case where the microwave current, inner pressure of the film deposition chamber and the like are changed in many ways among the microwave plasma discharging conditions, the film thickness distribution and discharging stability are affected by the variation of each of the parameters.

EXPERIMENT 4

In the present experiment, an apparatus shown in the apparatus example 2, which will be described later, is used as in the Experiment 1, and the microwave plasma stability, and others are observed when the material gas flow rate, microwave current are varied in many ways while the pressure in the film deposition chamber remains constant. With the exception that the film deposition chamber pressure and material gas flow rate are changed variously within the scope shown in Table 5, the microwave plasma discharging conditions are the same as those stated in Table 1. Also, the mounting angles of the square waveguides $\theta_1$ and $\theta_2$ are both set at 60° and 60°.

In Table 5, the evaluation results on the discharging states are stated. Here, the reference mark ⊚ indicates that the discharge is stable; ○, almost stable although slight variations are observed; and △, although slight variations are observed, the discharge is stable to the extent that it is usable. In either case, the discharging becomes unstable or shows almost limiting values whereby no discharge occurs if the microwave current is lowered, film deposition chamber pressure is lowered, or flow rate of $H_2$ is increased as the material gas. Therefore, if, on the other hand, the microwave current is raised, film deposition chamber pressure is intensified, or flow rate of $SiH_4$ is increased as the material gas, the discharging is found to be more stable. Here, in this discharging experiment, the observations are performed when the strip type member 101 is at rest and is in motion at a conveying speed of 1.2 m/min. There are no particular differences are recognized as to the discharging stabilities in both cases.

EXPERIMENT 5

In the present experiment, an apparatus shown in the apparatus example 2, which will be described later, is used as in the Experiment 1, and the influences to the microwave plasma stabilities and film thickness distributions are observed when the dimension of the width of the strip type member is changed.

As to the width dimensions of the strip type member, the various changes are attempted within the scope shown in Table 6. The discharging is given for 10 minutes each. The other microwave plasma discharging conditions are the same as those stated in Table 1. The kinds of waveguides are replaced with EIAJ and WRI-32, and the mounting angles $\theta_1$ and $\theta_2$ are arranged to be set at 60° and 60°. Then, the surface temperature of the strip type member is 250° C. as in the Experiment 2 while the conveying speed, 50 cm/min.

In this respect, the microwave applicator is arranged only on one side for the specimens No. 15 to No. 17, and a pair of the microwave applicators are arranged facing each other for the specimens No. 18 to No. 21.

In Table 6, the results of the evaluation on the discharging states, film thickness distributions, and the like are stated. The evaluation method is the same as the Experiment 2.

From these results, it has been found that the microwave plasma stabilities and film thickness distributions are varied when the width dimension of the strip type member is changed. Then, the cases where the microwave plasma stability becomes less or the film thickness distribution becomes great due to the supply of the microwave current from only one side are corrected in every instance by the arrangement of a pair of microwave applicators which face with each other.

Also, it has been found that if the kind of the material gas and flow rate, microwave current, inner pressure of the film deposition chamber and the like are changed in many ways among the microwave plasma discharging conditions, the film thickness distribution and microwave plasma stability are affected by the variation of each of the parameters.

EXPERIMENT 6

In the present experiment, an apparatus shown in the apparatus example 7, which will be described later, is used, and a continuous deposition of allopanic silicon film on PET (polyethylene terephtalate) strip type substrate is performed for a long time in accordance with the procedures explained in the manufacturing example 6 which will be described later. Then, the affects caused by the deposit film adhering to the microwave transmittable member are examined.

Figure 13:
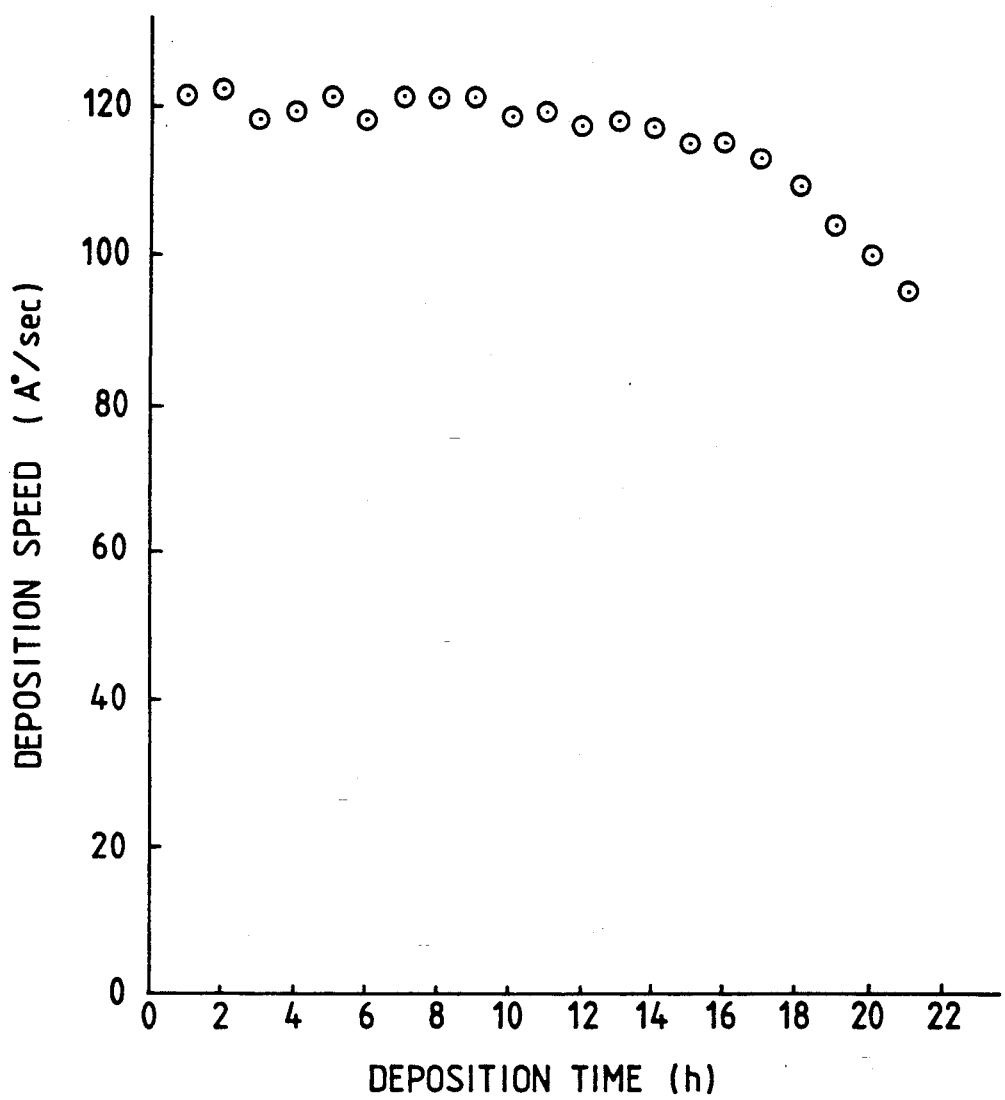
FIG. 13 is a graph showing the relationship between the deposit film adhering to the microwave transmittable member and the deposition speed to the substrate.

The film thickness of the deposit film is measured every hour, and the deposition speed is calculated. Then, as shown in FIG. 13, the deposition speed is on the average 120 Å/sec and is stable until approximately 15 hours after the commencement of the deposit film formation, but thereafter, the deposition speed is gradually lowered, and the microwave transmitting member is broken after 22 hours having elapsed.

Subsequently, after 10 hours have elapsed since the commencement of the deposit film formation, the deposit film formation is suspended once, and the vacuum container 300 and film deposition chamber 116 are leaked to the atmosphere. Then, the microwave transmittable member 1103 is replaced with a new member with the result that the problems of the slow down of the deposition speed and the damage on the microwave transmittable member are solved.

However, it takes 6.5 hours to resume the film deposition after its suspension. This is because the water in the atmosphere is absorbed and attached to the inner wall of the vacuum container 300, strip type member, and conveying mechanism for the strip type member due to the leak of the vacuum container 300 and film deposition chamber 116 to the atmosphere and it takes three hours to obtain a sufficient vacuuming degree for the deposit film formation when the vacuuming exhaust is resumed. Further, in a case where the vacuum container 300 and film deposition chamber 116 are leaked to the atmosphere, the strip type member and temperature control mechanism should be cooled. Accordingly, these must be heated again when the deposit film formation is resumed. For these cooling and heating, it takes 1.5 hours and 1 hour respectively. Also, against the conductivity of the amorphous silicon film before the suspension of the deposition, $\sigma_P = 5.2 \times 10^{-5}$ s/cm, $\sigma_a = 1.6 \times 10^{-11}$ s/cm, the conductivity of the amorphous silicon film after the resumption of the deposition is $\sigma_P = 3.0 \times 10^{-5}$ s/cm and $\sigma_a = 2.2 \times 10^{-9}$ s/cm. This represents a significant deterioration of the film quality immediately after the resumption.

Lastly, after 10 hours having elapsed since the commencement of the deposit film formation, the formation of the deposit film is suspended according to the genuine usage of the apparatus example 7, and while the airtightness of the film deposition chamber 116 is maintained, the microwave applicator 1104 including the microwave transmittable member 1103 is transferred from the film deposition chamber 116 to the auxiliary chamber 1101. Then, the film deposition chamber 116 and auxiliary chamber 1101 are separated airtightly and subsequently, the auxiliary chamber 1101 is leaked to the atmosphere for the replacement of the microwave transmittable member 1103 with a new one. After that, the auxiliary chamber is evacuated. Then, after the performance of Ar purge, the microwave applicator 1104 is transferred to the film deposition chamber 116 to resume the deposition.

As a result, not only the aforesaid problem of the slow down of the deposition speed or the damage on the microwave transmittable member has been eliminated, but also the time required from the suspension of the deposit film formation to the resumption thereof is reduced to only one hour. This is because the film deposition chamber 116 is not leaked to the atmosphere and it is unnecessary to cool the strip type member or to heat it again. Also, against the conductivity of the amorphous silicon film before the suspension of the deposition, $\sigma_P = 5.4 \times 10^{-5}$ s/cm, $\sigma_a = 1.7 \times 11^{-5}$ s/cm, the conductivity of the amorphous silicon film after the resumption of the deposition is $\sigma_P = 4.9 \times 10^{-5}$ s/cm and $\sigma_a = 3.3 \times 10^{-11}$ s/cm, and there is almost no deterioration of the film quality immediately after the resumption.

Conceivably, this has resulted from the fact that whereas the inside of the vacuum container 300 of the film deposition chamber 116 is exposed to the atmosphere when the film deposition chamber 116 is leaked to the atmosphere, only the microwave transmittable member is exposed to the atmosphere among the parts related to the film deposition chamber 116 when the method of the present invention is applied, and that the absorption of water and the mixture of the impurities are thus reduced significantly.

THE OUTLINE OF THE EXPERIMENTAL RESULTS

In the method and apparatus of the present invention, the microwave plasma stability, uniformity, and the like are maintained in relation to the complicated combination of the various parameters such as the shape of the microwave applicator and the kinds and arrangements of the waveguides connected thereto, the inner pressure of the film deposition chamber at the time of deposit film formation, the microwave current, the degree of the microwave plasma confinement, the volume and type of the discharging space. Accordingly, while it is difficult to obtain the optimal conditions only by a single parameter, the tendency and conditional scope are roughly grasped as given below from the results of the present experiments.

It is found that the pressure in the film deposition chamber should preferably be from 1.5 m Torr to 100 m Torr and more preferably be from 3 m Torr to 50 m Torr. It is also found that the microwave current should preferably be from $250 \times 2$ W to $3,000 \times 2$ W and more preferably be from $300 \times 2$ W to $1,000 \times 2$ W. The inner diameter of the curving shape should preferably be from 7 cm to 45 cm; more preferably, from 8 cm to 35 cm while it is found that the width of the strip type member should preferably be 60 cm and more preferably be approximately 50 cm to gain its uniformity in the width direction when a facing pair of the microwave applicators are used.

Also, it is found that if the microwave leakage from the microwave plasma region becomes greater, the microwave plasma lacks its stability, and the space L between the curving ends of the strip type member themselves should preferably be less than ½ wavelength of the wavelength of the microwave and more preferably, the space should be set in a dimension less than ¼ wavelength of the wavelength thereof.

Also, it is found that by the method whereby to the microwave transmittable member is transferred to the aforesaid auxiliary chamber while maintaining the aritightness of the film deposition chamber for the replacement of the members or the performance of the etching, the problem of the slow down of the deposition speed to the substrate due to the deposit film adhering to the microwave transmittable member or the damage to the microwave transmittable member is eliminated. It is also found that the problem of the long suspension time due to the film deposition chamber being leaked to the atmosphere or the deterioration of the film quality immediately after the resumption of the deposition can be solved.

Hereinafter, on the basis of the facts which have been found by the aforesaid experiments, a method according to the present invention will be described further in detail.

In the method of the present invention, the strip type member is bent by the use of the curve starting end member and curve terminating end formation means to form a column-shaped film deposition space on the way of the aforesaid strip type member being conveyed, and the major portion of the side walls of such deposition space is being formed by the aforesaid strip type member in conveyance. However, an arrangement is made so that a space should remain between the curve starting end formation means and curve terminating end formation means in the longitudinal direction of the aforesaid strip type member.

Then, in the method of the present invention, in order to allow the microwave plasma to be generated uniformly and confined in the aforesaid column-shaped film deposition space, microwave energy is emitted from either one side of both sides of the both end faces of the aforesaid film deposition space in the direction parallel to the side walls formed by the aforesaid strip type member so that the microwave energy is confined in the aforesaid film deposition space.

If the width of the aforesaid strip type member is comparatively narrow, the uniformity of the microwave plasma to be generated in the film deposition space can be maintained even by the emission of the microwave energy from only one side. However, if the width of the strip type member exceeds the one wavelength of the microwave length, for example, then it is preferable to emit the microwave energy from the both sides for the maintenance of the uniformity of the microwave plasma.

For the uniformity of the microwave plasma in the film deposition space, it is necessary to emit the microwave energy sufficiently in the film deposition space as a matter of course, and it is preferable that the structure of the aforesaid column-shaped film deposition space is similar to the structure of the so-called waveguide. To this end, it should be preferable that the aforesaid strip type member is composed of a conductive material. However, it may be possible to use a material, at least one surface of which is treated by a conductive processing.

Also, for the column-shaped film deposition space formed in the method of the present invention by bending the aforesaid strip type member in conveyance by the use of the aforesaid curve starting end formation means and curve terminating end formation means, it is preferable to make its shape so that the microwave energy transmitted into the film deposition space can be transmitted almost evenly in the film deposition space, and it should preferably be similar to the circle, oval, square, or polygon which is substantially symmetrical in a shape having a comparatively smooth curve. There is of course the case where the end faces of the shape thus formed can be discontinued at a position of the space remaining in the longitudinal direction between the aforesaid curve starting end formation means and curve terminating end formation means.

Furthermore, in order to transmit the microwave energy in the aforesaid film deposition space efficiently and at the same time, to generate, maintain and control the microwave plasma with stability, it is preferable to make the transmitting mode of the microwave in the aforesaid microwave applicator means a single mode. Specifically, $TE_{10}$ mode, $TE_{11}$ mode, $eH_1$ mode, $TM_{11}$ mode, $TM_{01}$ mode and the like can be named, but it is preferable to use $TE_{10}$ mode, $TE_{11}$ mode, and $eH_1$ mode. The transmitting mode may be used individually or in plural combinations. Also, to the aforesaid microwave applicator means, the microwave energy is transmitted through the waveguide capable of the above-mentioned transmitting modes. Further, the microwave energy is emitted into the aforesaid film deposition space through the microwave transmittable member having airtightness which is provided at the leading end portion of the microwave applicator means.

Also, in the method of the present invention, when the aforesaid microwave transmittable member is transferred to the aforesaid auxiliary chamber, the emission of the microwave is suspended at first to suspend the formations of the deposit film, and then to stop introducing the material gas. When the material gas in the film deposition chamber is exhausted, a rear gas such as Ar, He, Ne, Kr, Xe, Rn or the deposit film formation rear gas, such as $H_2$ is introduced. At the same time, the same type of gas introduced to the film deposition chamber is introduced to the auxiliary chamber adjacent to the film deposition chamber. When the pressures in the film deposition chamber and auxiliary chamber are equalized, the microwave transmitting member is transferred to the auxiliary chamber while maintaining the airtightness of the film deposition chamber. At this juncture, it may be possible to perform the transfer with the gas introduced to the film deposition chamber and auxiliary chamber being sealed, or to perform the transfer with the exhaust while introducing the aforesaid gas.

After the microwave transmitting member has been transferred to the auxiliary chamber, the film deposition chamber and auxiliary chamber are separated airtightly by a separation means for separating these chambers airtight so that the gas in these chambers is not diffused. Then, the auxiliary chamber is leaked to the atmospheric pressure by Ar, He, Ne, Kr, Xe, Rn or the other rear gas, and the microwave transmittable member to which the deposit film has adhered is withdrawn to be replaced with a new one, or by introducing etching gas into the auxiliary chamber, the deposit film which adhered to the microwave transmittable member may be etched. In case of the etching, RF wave or high frequency wave such as microwave or electromagnetic wave such as light may be introduced, or DC field may be applied or thermal energy may be added. Also, as an etching gas, $CF_4$, $NF_3$, HF, HCl, $F_2$, $ClF_3$, $C_2F_6$, $C_3F_8$, $C_4F_{10}$, $CCl_4$, $CCl_2F_2$, $CClF_3$, $CBrF_3$, $CHF_3$, $SiF_4$, $SiCl_4$, $Cl_2SF_6$ or the like or a plurality of compound gases of the above-mentioned gas and $O_2$, $N_2$, Ar, $H_2$, He or the like may be used.

After the microwave transmitting member has been replaced or the etching has been performed, the air or etching gas in the auxiliary chamber is exhausted by its own exhausting device. Then, purging is performed by the aforesaid rear gas sufficiently, and the pressures in the film deposition chamber and auxiliary chamber are equalized by the aforesaid method to open the aforesaid separation means so that the microwave transmitting member is transferred to the film deposition chamber. Subsequently, the inside of the film deposition chamber is purged by aforesaid rear gas or dilution gas, and then the rear gas or dilution gas is exhausted. After this, the deposit film formation material gas is introduced and the microwave is emitted to resume the deposit film formation.

Also, if the above-mentioned process of the replacement of the microwave transmitting members or the etching should be performed in the process of replacing the strip type substrate simultaneously, then the suspension time of the deposit film formation is shortened and the production speed is improved effectively in a case where the strip type member is continuously conveyed for the continuous formation of the deposit film as in the present invention.

Also, in the method of the present invention, there is a space remaining between the aforesaid curb starting end formation means and curve terminating end formation means in the aforesaid film deposition space, thus the aforesaid material gas being exhausted from this space so that the inside of the film deposition chamber is maintained in a predetermined level of the reduced pressure. However, a special consideration is needed here to define the dimension of the aforesaid space in order to gain a sufficient exhausting conductance and at the same time, to prevent the leakage of the microwave energy emitted into the film deposition space to the outside thereof.

Specifically, the aforesaid microwave applicator means is arranged so as not to parallel the direction of the electric field of the microwave progressing in the microwave applicator means with the plane including the central axis of the holding and conveying roller serving as the aforesaid curve starting end formation means and the central axis of the holding and conveying roller serving as the aforesaid curve terminating end formation means.

Then, in a case where the microwave energy is emitted into the film deposition space through a plurality of the aforesaid microwave applicator means, the above-mentioned consideration should be given to each of the microwave application means.

Further, the maximum dimension of the space remaining between the aforesaid curve starting end formation means and curve terminating end formation means in the longitudinal direction of the aforesaid strip type member should preferably be less than $\frac{1}{2}$ wavelength of the wavelength of the microwave and more preferably be less than $\frac{1}{4}$ wavelength.

In the method of the present invention, if a plurality of the microwave applicator means are arranged to face each other, a special consideration is needed so as not to allow any adverse effect such as giving damage to the microwave power source or generating abnormal oscillation of the microwave to occur by causing the microwave energy emitted from one microwave applicator means which has been received by the other microwave applicator means to reach the microwave power source connected to the aforesaid other microwave applicator means. Specifically, the aforesaid microwave applicator means should be arranged so as not to parallel the directions of the electric fields themselves of the microwave progressing in the aforesaid microwave applicator means.

In the method of the present invention, if the microwave energy is emitted only from one side of the both end faces of the aforesaid film deposition space, it is necessary to prevent the microwave energy from being leaked from the other end face, and this end face should preferably be sealed with a conductive material or a wire netting having preferably less than $\frac{1}{2}$ wavelength of the wavelength of the microwave used by the hole diameter or more preferably less than $\frac{1}{4}$ wavelength thereof or covered by a punching board or the like.

In the method of the present invention, the microwave energy emitted into the aforesaid film deposition space shows a tendency that it is significantly reduced as the distance from the microwave transmittable member provided in the aforesaid microwave applicator increases while having a close interrelation with the pressure in the film deposition space although depending on the kinds of the material gas introduced thereinto. Therefore, in a case where a comparatively wide strip type member is used, it is preferable to maintain the pressure in the film deposition space sufficiently low and emit the microwave energy into the film deposition space through at least a pair or more of the microwave applicator means for the uniform generation of the microwave plasma in the width direction.

In the method of the present invention, it is preferable to arrange the aforesaid microwave applicator means perpendicular to the end face of the aforesaid film deposition space so that the progressing direction of the emitting microwave energy is substantially in parallel with the side walls formed by the aforesaid strip type member. Also, the microwave applicator means should preferably be arranged at the position substantially in the same distance from the aforesaid side walls. However, if the curving state of the aforesaid side walls is asymmetrical, the arrangement position is not particularly restrained. When a plurality of microwave applicator means are arranged to face each other, the central axes of these means may be set on the same line or otherwise as a matter of course.

In the method of the present invention, the curving state formed by the aforesaid strip type member should preferably be of a constant shape so as to maintain the stability and uniformity of the microwave plasma generated therein. It is preferable to support the strip type member in such a manner that any puckering, sagging, lateral dislocation, or the like should not be created by the aforesaid curve starting end formation means and curve terminating end formation means. Then, it may be possible to provide a supporting means to support the curving state in addition to the curve starting end formation means and curve terminating end formation means. Specifically, a supporting means for continuously supporting a desired curving state may be provided inside or outside the aforesaid curved strip type member. In a case where such a supporting means is provided inside the curved strip type member, a consideration is required to make the portion to be in contact with the surface on which deposit film is formed as small as possible. It is preferable to provide such a supporting means at both end portions of the aforesaid strip type member, for example.

For the aforesaid strip type member, a flexible material capable of forming the aforesaid curving state continuously should be used, and it is desirable to enable such a material to form a smooth shape at the curve starting end, curve terminating end, and the midway curving portion.

The deposit film formation material introduced into the film deposition space by the gas supplying means should be exhausted outside the film deposition space efficiently so that the inside of the film deposition space should be pressurized to the extent where the aforesaid microwave plasma is generated uniformly.

In order to generate and maintain the microwave plasma evenly with stability in the aforesaid column-shaped film deposition space, there should be the optical conditions respectively for the shape and volume of the film deposition space, the kinds and flow rate of the material gas to be introduced into the film deposition space, the pressure in the film deposition space, the intensity of the microwave energy emitted into the film deposition space, the adjustment of the microwave, and the like. However, these parameters are interrelatedly coupled to each other functionally, and cannot be defined summarily. It is preferable to set desirable conditions appropriately.

In other words, according to the method of the present invention, a film deposition space is formed with a strip type member as its side walls, and at the same time that the aforesaid strip type member forming the side walls of the aforesaid film deposition space is continuously conveyed, microwave applicator means is arranged in such a manner that the microwave energy is emitted with a substantial uniforming in the width direction of the strip type member forming the side walls of the aforesaid film deposition space, and by enabling the generation and maintenance conditions of the microwave plasma to be adjusted and optimized, it is possible to form a large area functional deposit film continuously with an excellent uniformity.

The event with which the method of the present invention can be objectively discriminated from the conventional deposit film formation method is that the film deposition space is of a column-shape, and its side walls serve as a structural member while being conveyed continuously as well as serving as a substrate for the deposit film formation or supporting member therefor.

Here, the function as a structural member means particularly a function that can separate the atmospheric space for the film deposition, i.e., the film deposition space and the atmospheric space which does not participate in the film deposition physically and chemically, and specifically, it means a function that can form, for example, gaseous composition and atmosphere of different state thereof, or control the flowing direction of gas, or, further, form the atmosphere having pressure differences.

In other words, the method of the present invention enables the aforesaid strip type member to be bent to form the side walls for the column-shaped film deposition space, and from a location in the other remaining wall, that is, a space remaining both end faces and a part of the aforesaid side walls, the material gas for the deposit film formation and microwave energy are supplied into the aforesaid film deposition space or exhausted therefrom, thus confining the microwave plasma in the aforesaid film deposition space to form a functional deposit film on the strip type member constituting the aforesaid side walls. The aforesaid strip type member itself executes an important function as the structural member to separate the film deposition space from the outer atmospheric space which does not participate in the film deposition. At the same time, the strip type member can be used as a substrate for the deposit film formation or a supporting member therefor.

Therefore, the atmosphere outside the film deposition space structured by the aforesaid strip type member as the side walls is in a considerably different state from the inside of the film deposition space as to the gaseous composition and state thereof, pressure, and the like.

On the other hand, in the conventional deposit film formation method, the substrate or supporting member for the deposit film formation is arranged in the film deposition space for forming the deposit film and is dedicated only to functioning as a member on which a precursor or the like for the deposit film formation such as being generated in the aforesaid film deposition space, and is not functioned as a structural member constituting the aforesaid film deposition space as in the method of the present invention.

Also, in the conventional method such as RF plasma CVD method, sputtering method or the like, the aforesaid substrate or the supporting member for the deposit film formation cannot confine plasma sufficiently although in some cases it serves as an electrode to generate or maintain discharging simultaneously, and it can hardly be said that it serves as a structural member because it cannot perform the separation sufficiently from the outer atmospheric space which does not participate in the film deposition.

On the other hand, the method of the present invention uses the strip type member capable of functioning as the substrate or supporting member for the functional deposit film formation as the side walls of the aforesaid film deposition space, hence making it possible to allow the strip type member to serve as the aforesaid structural member as well as to form the functional deposit film thereon continuously.

In the method of the present invention, the side walls of the column-shaped space are formed using the aforesaid strip type member, and the microwave energy is emitted into the column-shaped space in the width direction of the strip type member with the substantial uniformity. Then, the microwave is confined in the column-shaped space so that the microwave energy is consumed in the column-shaped space efficiently to generate the uniform microwave plasma. Thus, the deposit film to be formed has a high uniformity. Furthermore, the strip type member constituting the side walls which are exposed to the aforesaid microwave plasma is always conveyed continuously and moved to the outside of the film deposition space. Hence, in this way, a highly uniform deposit film can be formed on the aforesaid strip type member in the conveying direction thereof.

In the method of the present invention, with the aforesaid strip type member, the film deposition space is formed, and the conditional set up is made to allow the gaseous composition and state thereof to differ from those in the inside of the film deposition space so that the deposit film is fabricated only within the aforesaid film deposition space. For example, as to the gaseous composition outside the film deposition space, it may be possible to prepare a gaseous atmosphere which is not directly related to the deposit film formation, or to provide a atmosphere which includes the material gas exhuasted from the aforesaid film deposition space. Also, while in the film deposition space the microwave plasma is confined as a matter of course, it is important not to allow the aforesaid microwave plasma to be leaked to the outside of the film deposition space for the enhancement of the plasma stability and repeatability as well as for the effective prevention of the film deposition on a location where it is not needed. Specifically, it is effective to made a pressure difference between the inside and outside of the film deposition space, to form a atmosphere of the so-called inert gas, $H_2$ gas or the like which has a small ionization cross-sectional area, or to provide a means whereby any leakage of the microwave from the film deposition space is positively prevented. As for the microwave leakage preventive means, it may be possible to seal the spatial portion connecting the inside and outside of the film deposition space with a conductive member, or to cover it with a netting having preferably less than ½ wavelength of the microwave or more preferably less than ¼ wavelength thereof used by hole diameter or by punching. Also, it is desirable to define the maximum dimension of the space connecting the inside and outside of the film deposition space to be preferably less than ½ wavelength of the wavelength of the microwave or more preferably less than ¼ wavelength thereof. Also, by making the pressure outside the film deposition space extremely low or high as compared with the pressure inside the film deposition space, it is possible to set a condition that the microwave plasma cannot be generated outside the film deposition space.

Hence, the method of the present invention is characterized by providing the aforesaid strip type member with a function to constitute the film deposition space, thereby discriminating it from the conventional deposit film formation method and making it possible to bring about more significant effects.

Also, another feature of the present invention is that the microwave transmitting member is transferred to the auxiliary chamber capable of performing an airtight separation from the film deposition chamber to which it is adjacently located, and subsequent to the airtight separation of the film deposition chamber and auxiliary chamber, the microwave transmitting member is replaced or dry etching is performed in the auxiliary chamber.

In a case where a deposit film is continuously formed by microwave energy, the problem that the deposition speed is lowered, the degradation of the film quality, or damage to the microwave transmitting member is encountered due to the deposit film which has adhered to the microwave transmitting member as described earlier.

In order to evade the above-mentioned problem, the microwave transmitting members are replaced or etching is attempted. Then, as described earlier, another problem is encountered in that the adverse effect is produced on the subsequent formation of the deposit film when the film deposition chamber is leaked to the atmosphere or any dry etching is attempted in the film deposition chamber.

In this respect, the method of the present invention makes it possible to perform the replacement of the microwave transmittable members or etching without causing the film deposition chamber to be leaked to the atmosphere or without any introduction of the etching gas into the film deposition chamber. Therefore, while evading the aforesaid problem due to the adhesion of the deposit film to the microwave transmittable member, it is possible to eliminate any adverse effect that is otherwise produced to result in the degradation of the deposit film fabricated at the early stage of the subsequent deposit film formation. Also, as the film deposition chamber is not leaked to the atmosphere or exposed to any etching gas, it is possible to shorten considerably the time required for the replacement of the microwave transmitting members or the performance of the etching before the next deposit film formation is started, thus improving the production speed of the continuous formation of the deposit film significantly.

Now, hereinafter, the structure and features of a microwave plasma CVD apparatus according to the present invention will be sequentially described in detail.

According to an apparatus of the present invention, by the microwave plasma region being confined by the strip type member in conveyance, it is possible to capture on a substrate with a high yield the precursor generated in the aforesaid microwave plasma region, which contributes to the deposit film formation, and further, to form the deposit film continuously on the strip type member, hence enhancing the utilization efficiency of the deposit film formation material gas significantly.

Furthermore, microwave plasma is generated uniformly in the aforesaid film deposition space using microwave applicator means according to the present invention, and therefore, not only the uniformly of the deposit film formed in the width direction of the aforesaid strip type member is exellent as a matter of course, but also the uniformity of the deposit film formed in the longitudinal direction of the strip type substrate is excellent because the strip type member is continuously conveyed in the direction substantially perpendicular to the aforesaid microwave applicator means.

Also, according to the apparatus of the present invention, the discharge is maintained continuously with stability and uniformity. It is therefore possible to perform deposition to form a functional deposit film having a constant characteristics on a long strip type member in succession as well as to fabricate the layered devices which have excellent interfacial characteristics.

In the apparatus of the present invention, when the aforesaid strip type member function as a structural member, the outside of the aforesaid film deposition chamber can be of the atomspheric air, but if the flow of the atmospheric air into the film deposition chamber may affect the characteristics of the functional deposit film to be formed, then an appropriate means for preventing the flow of the atmospheric air should be provided. Specifically, it is preferable to arrange a mechanical sealing structure using an O ring, gasket, helicoflex, magnetic fluid, or the like, or to arrange a separation container in the circumference to create a rare gas atmosphere which can hardly affect the characteristics of the deposit film to be formed or can work effectively or to create an appropriately vaccumized atmosphere. In a case of the aforesaid mechanical sealing structure, a special consideration is required so that the sealing condition can be maintained while the aforesaid strip type member is being conveyed continuously. In a case where the apparatus of the present invention is used to perform the deposition continuously to form the deposit film on the aforesaid strip type member by coupling it to a plurality of the other deposit film formation means, it is preferable to use gas gate means to couple each of them. Also, if only a plurality of the apparatuses of the present invention are coupled, the aforesaid separation container can be single or may be provided in each of the apparatuses because the film deposition chamber has an independent film deposition atmosphere in the respective apparatus.

In the apparatus of the present invention, the pressure outside the film deposition chamber can be of a reduced condition or of a increased condition, but if the aforesaid strip type member is deformed greatly by the pressure difference, then an appropriately auxiliary structural member should be arranged in the film deposition chamber. As to the aforesaid auxiliary structural member, it is preferable to form substantially the same shape as the side walls of the film deposition chamber with wirings or thin plates made of a metal having an appropriate strength, ceramic or reinforced plastic or the like. Also, the surface of the aforesaid strip type member facing the surface of the side of the aforesaid auxiliary structural member which is not exposed to the microwave plasma is essentially is a shaded portion by the auxiliary structural member and the formation of the deposit film is scarcely performed. Therefore, it is desirable to design the projecting area for the auxiliary structural member on the strip type member to be as small as possible.

Also, it is possible to form the mesh pattern or the like given to the aforesaid auxiliary structural member on the aforesaid strip type member by allowing the auxiliary member to be in close contact with the strip type member and rotating or transferring in synchronism with the conveying speed of the strip type member.

As to the material of the strip type member suitably used for the method and apparatus of the present invention, it is preferable to adopt a material which is rarely deformed or distorted by the temperature required for forming the functional deposit film by the microwave plasma CVD method and which has a desired strength as well as conductivity. Specifically, such a material can be a metal thin plate and its compound made of stainless steel, aluminum and its alloys, iron and its alloys, copper and its alloys or the like, and a material made of such a metal, on the surface of which a metallic thin film of different material and/or an insulating thin film such as $SiO_2$, $Si_3N_4$, $Al_2O_3$, AlN is given by a surface coating treatment by sputtering method, deposition method, plating method, or the like, or a thermoresistive plastic sheet such as polyimide, polyamide, polyethylene terephtalate, or epoxy or the like or a material such as on the surface of a compound of these and glass fiber, carbon fiber, boric fiber or metallic fiber, a metallic single substance or its alloy and transparent conductive oxide (TCO) or the like are given by a conductive processing by plating, deposition, sputtering, or coating method.

Also, as to the thickness of the strip type member, it is preferable to make the member as thin as possible in consideration of its cost and storage space within the scope where its thickness has an enough strength to maintain the curving shape to be formed in conveyance by a conveying means. Specifically, the thickness should preferably be from 0.01 mm to 5 mm, more preferably from 0.02 mm to 2 mm and optimally, 0.05 mm to 1 mm. It is comparatively easy to obtain a desired strength using a metallic thin plate when the thickness is made thinner.

Also, as to the width of the aforesaid strip type member, it is preferable to make the member just wide enough to maintain the uniformity of the microwave plasma in its longitudinal direction as well as its curving shape when the aforesaid microwave applicator means. Specifically, the width should preferably be from 5 cm to 100 cm, or more preferably, from 10 cm to 80 cm.

Further, as to the length of the aforesaid strip type member, there is no particular restriction, and it may be possible to make the member just long enough so as to be wound up to a roller or to make a long member longer by welding or the like.

In the apparatus of the present invention, a means for holding and conveying the aforesaid strip type member while bending it should be capable of maintaining the strip type member in the curved shape constantly without creating any puckering, sagging, lateral dislocation, or the like while in conveyance. For example, there are provided at least a pair of holding and conveying rings having a desired curving shape, and preferably, both ends of the strip type member should be held by the holding and conveying rings, thus bending it along its shape and further, by at least a pair of holding and conveying roller arranged in the longitudinal direction of the strip type member, which serve to function as the curve starting end formation means and curve terminating end formation means respectively, the strip type member is drawn in to be bent almost in a column-shape. Then, a driving power is given at least to one of the holding and conveying rings and of the holding and conveying rollers to convey the strip type member in its longitudinal direction while maintaining the curved shape. In this respect, as a method of holding and conveying the aforesaid strip type member by the aforesaid holding and conveying rings, it may be possible to adopt a simple sliding friction or to use a so-called gear type feeding by machining sprocket holes or the like on the strip type member and at the same time, providing the holding and conveying rings with saw-like projections on the periphery thereof.

As to the shape of the aforesaid holding and conveying rings, it is preferable to make them to be of a circular type in consideration of the formation of the curving shape, but there is no particular problem as far as the rings have a mechanism for continuously maintaining a shape constantly whether it is oval, square, or polygon. To keep the conveying speed constantly is important for conveying the strip type member without causing any sagging, puckering or lateral dislocation to be curving shape. It is, therefore, desirable to provide in the aforesaid holding and conveying mechanism a detecting mechanism for detecting the conveying speed of the strip type member and a conveying speed adjusting mechanism capable of performing an adjusted feeding in accordance with the feedback from the detecting mechanism. Also, these mechanisms are effectively applicable to the film thickness control in fabricating semiconductor devices.

Also, the aforesaid holding and conveying rings are arranged in the microwave plasma region due to the objective thereof although there is a difference in the degrees at which the rings are exposed to the plasma. Therefore, it is desirable to use the material for the rings which are resistive against the microwave plasma, i.e., the one having excellent thermal resistivity, corrosion resistivity, or the like because the deposit film adheres to the surface of the rings and the film which has adhered thereto is separated in a long-time deposition operation and splashed onto the deposit film being formed and adheres thereto and becomes a cause to create defective such as pin holes in the deposit film, leading to the cause of the degradation of the characteristics of the semiconductor devices to be fabricated or the lowering yield thereof. Also, it is preferable to construct the rings with a material and surface shape having a low adhesive coefficient against the deposit film or has a capability to maintain a strong adhesiveness for a considerable film thickness even if the deposit film adheres thereto. For a specific material, stainless steel, nickel, titan, vanadium, tangusten, molybdenum, niobum and those processed using the alloys thereof, or those the surface of which is treated by coating process with ceramic material such as almina, quartz, magunesia, zirconia, silicon nitride, aluminum nitride by spraying method, deposition method, sputtering method, ion plating method, CVD method or the like, or the aforesaid ceramic single substance or those processed with molding of its compound can be named. Also, as a surface shape formation, mirror machining, convex or concave machining, or the like can be arbitrarily selected in consideration of the stress of the film to be deposited.

It is preferable to remove the deposit film which has adhered to the aforesaid holding and conveying rings before it is separated and splashed. It is also preferable to remove the deposit film thus having adhered thereto by dry etching in vacuum or wet etching, beads blast or other chemical or physical technique after resolution.

The aforesaid holding and conveying rollers are designed to have wider contacting faces with the aforesaid strip type member than the aforesaid holding and conveying rings, and the heat exchanging factor with the strip type member is great. Therefore, it is desirable to provide a mechanism for adjusting temperature appropriately so that the temperature of the strip type member is not raised or reduced extremely by the holding and conveying rollers. Nevertheless, the temperatures set for at least a pair of the holding and conveying roller can be varied. It is also effective to incorporate a tensioning detecting mechanism for the conveyance of the strip type member with the aforesaid holding and conveying rollers for the maintenance of a constant conveying speed.

Further, it is preferable to provide a crawn mechanism for the aforesaid holding and conveying rollers to prevent the sagging, distortion, lateral dislocation, or the like of the strip type member in conveyance.

The curving shape to be formed in the present invention is of a column type to partially including the leading portion of the aforesaid applicator means.

The shape of both end faces of the column-shaped film deposition chamber formed with the aforesaid strip type member as its side walls is almost circular, oval, square, polygon, or the like, and it is desirable to set the position of the aforesaid microwave applicator means arranged to be almost in the central part of the aforesaid shape. This enables the microwave plasma to be generated uniformly in the aforesaid film deposition chamber and enhances the uniformity of the deposit film to be formed. Also, the inner diameter of the end faces of the aforesaid curving portions determines the transmission mode and the volume of the microwave plasma region. Essentially, the film thickness of the deposit film to be formed in relation to the exposing time of the strip type member to the aforesaid microwave plasma region while in conveyance is determined, and the ratio of the aforesaid side wall area to the inner surface area of the aforesaid film deposition chamber in relation to the width dimension of the strip type member is also determined, hence enabling the utilization efficiency of the deposit film formation material gas to be decided. Then, the microwave current density ($W/cm^3$) required to maintain the stable microwave plasma in the aforesaid microwave plasma region is determined by the interrelationship between the kinds and flow rate of the material gas to be used, pressure, emission of the microwave from the microwave applicator, transmission capability, and absolute volume of the microwave plasma region, and it is difficult to define the required microwave current density summarily.

In a case where the aforesaid strip type member is used as a substrate for solar cells, it may be possible to make the strip type member directly to be an electrode to withdraw current if the aforesaid strip type member is a metal having electric conductivity, or if it is a synthetic resin having electric insulation, it is desirable to conduct a surface treatment in advance by plating, deposition, sputtering method to form an electrode to withdraw current on the surface thereof where the deposit film is fabricated with the so-called metal single substance or its alloy, and transparent conductive oxide (TCO) such as Al, Ag, Pt, Au, Ni, Ti, Mo, W, Fe, V, Cr, Cu, stainless, brass, Nichrome, Sn, $O_2$, $In_2O_3$, ZnO, $SnO_2$-$In_2O_3$ (ITO).

It is a of course possible to form on the surface on which the deposit film is formed a different metallic layer or the like for the purpose of improving the reflection of the long wavelength light on the surface of the substrate or preventing the interrelated diffusion of composite elements between the substrate material and deposit film or forming a interference layer for the short circuit prevention. Also, if the aforesaid strip type member is comparatively transparent and the solar cells are of the layer construction to perform the light incidence from the aforesaid strip type member side, it is desirable to deposit in advance the aforesaid transparent conductive oxide, metallic thin film, or other conductive thin film for its layer formation.

Also, the surface condition of the aforesaid strip type member can be of a smooth plane or may be of a plane having fine convexity and concavity.

In a case of a plane having fine convexity and concavity, the convex and concave shapes are spheric, cone, pyramid, or the like, and the maximum height thereof (Rmax) should preferably be from 500 Å from to 5,000 Å, thus enabling the reflecting light on the aforesaid surface to be diffused reflection to increase the length of the optical path of the reflection light on the aforesaid surface.

The aforesaid microwave transmittable member is provided at the leading end portion of the aforesaid microwave applicator means to separate the vacuum atmosphere in the film deposition chamber and the outside atmosphere in which the aforesaid microwave applicator means are provided, and is designed to withstand the pressure difference existing between the inside and outside thereof. Specifically, its cross-sectional shape in the progressing direction of the microwave should preferably be circular, square, flat oval, belljar, tablet, or cone.

Also, the thickness of the microwave transmittable member in the progressing direction of the microwave should desirably be designed in consideration of the conductivity of the material to be used so as to minimize the reflection of the microwave. For example, it is preferable to make the thickness almost equal to $\frac{1}{2}$ wavelength of the wavelength of the microwave if the member is of a flat plate type. Furthermore, it is preferable to use the material capable of transmitting the microwave energy emitted from the microwave applicator means to the film deposition chamber with the least possible loss and at the same time, having an excellent airtightness so that no flow of atmospheric air is allowed to occur in the film deposition chamber. Specifically, glass or fine ceramic such as quartz, almina, silicon nitride, berylium, magnesia, zirconia, boric nitride, silicon carbide can be named.

Also, the aforesaid microwave transmitting member should preferably be cooled uniformly to prevent any thermal degradation (crack and breakage) or the like due to the heating of the microwave energy and/or plasma energy.

For a specific cooling means, it may be possible to use cooling air current to be blown onto the surface of the microwave transmitting member on the side facing the atmospheric air or to cool the microwave applicator means itself by the use of cooling air, water, oil, Freon, or other cooling medium so that the microwave transmittable member is cooled through its portion which is in contact with the aforesaid microwave applicator means. By cooling the microwave transmittable member to a sufficiently low temperature, the crack and breakage can be prevented from occurring therein even if a comparatively high power microwave energy which generates heat is introduced into the film deposition chamber, thus allowing the plasma of high electron density to be generated.

In the apparatus of the present invention, the auxiliary chamber in which the replacement of the microwave transmittable members are replace or etching is performed is adjacently coupled to the film deposition chamber, and the structure is arranged so that it can be separated from the film deposition chamber airtightly. Also, the auxiliary chamber has a open and close mechanism and exhaust mechanism for the replacement of the microwave transmittable members. Also, in a case where dry etching is performed in the auxiliary chamber, an inlet tube for the etching gas is provided.

Also, separation means for separating the film deposition chamber and auxiliary chamber airtightly should be structured so as to prevent gas flow or diffusion between both chambers, and a gate valve capable of sealing or the like can be adopted suitably.

Also, the mechanism for transferring the microwave transmittable member between the film deposition chamber and auxiliary chamber is structured to transfer it while maintaining the vacuum tightness of the microwave transmittable member because the microwave transmittable member itself serves to keep the vacuum tightness. Also, it may be possible to arrange the structure so that the microwave applicator means including the microwave transmittable member can be transferred as a whole.

Specifically, a mechanism such as bellows can be used suitably. Also, a driving mechanism to drive the aforesaid transfer mechanism is needed. Specifically, a driving means such as a hydraulic cylinder can be used suitably.

Also, in a case where the microwave applicator means is transferred as a whole, a structure should be arranged so that the waveguide can be easily removed or the waveguide or applicator means itself are enabled to extend or contract.

In a case where the waveguide or the applicator means has its own mechanism to allow it to extend or contract, it is desirable to cause the extension and contraction mechanism to hold electric contact for the stable transmission of the microwave. Specifically, a mechanism such as sleeves can be used suitably.

Figure 2:
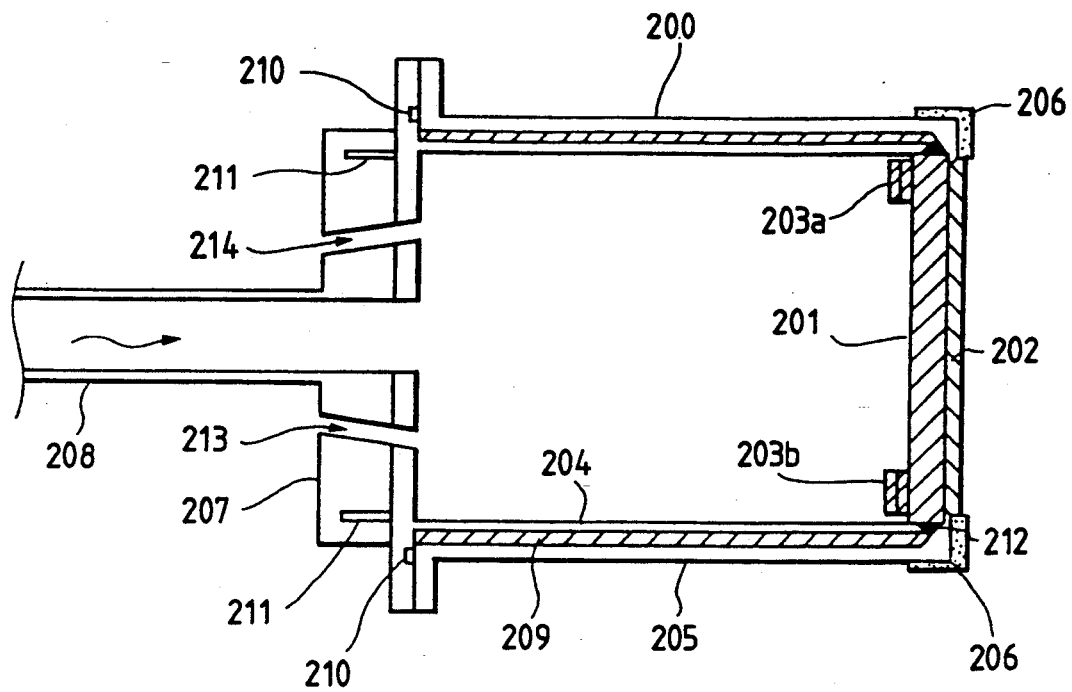
FIG. 2 is a schematic view illustrating a microwave applicator according to the present invention.

Further, in the apparatus of the present invention, it is possible to use a plurality of members by overlapping them as shown in FIG. 2. In this case, a second microwave transmittable member on the side facing the film deposition chamber at 202 in FIG. 2 is the location where the deposit film adheres. Therefore, it is possible to perform the microwave transmitting members or etching in the auxiliary chamber only in regard to the second microwave transmitting member to which the deposit film has adhered. In this case, a mechanism which keeps the vacuum can possibly be arranged only for the first microwave transmitting member at 201 in FIG. 2. Accordingly, it is unnecessary for the second microwave transmitting member to have any mechanism to keep the vacuum, thus enabling the performance of an easier replacement or etching.

Figure 11:
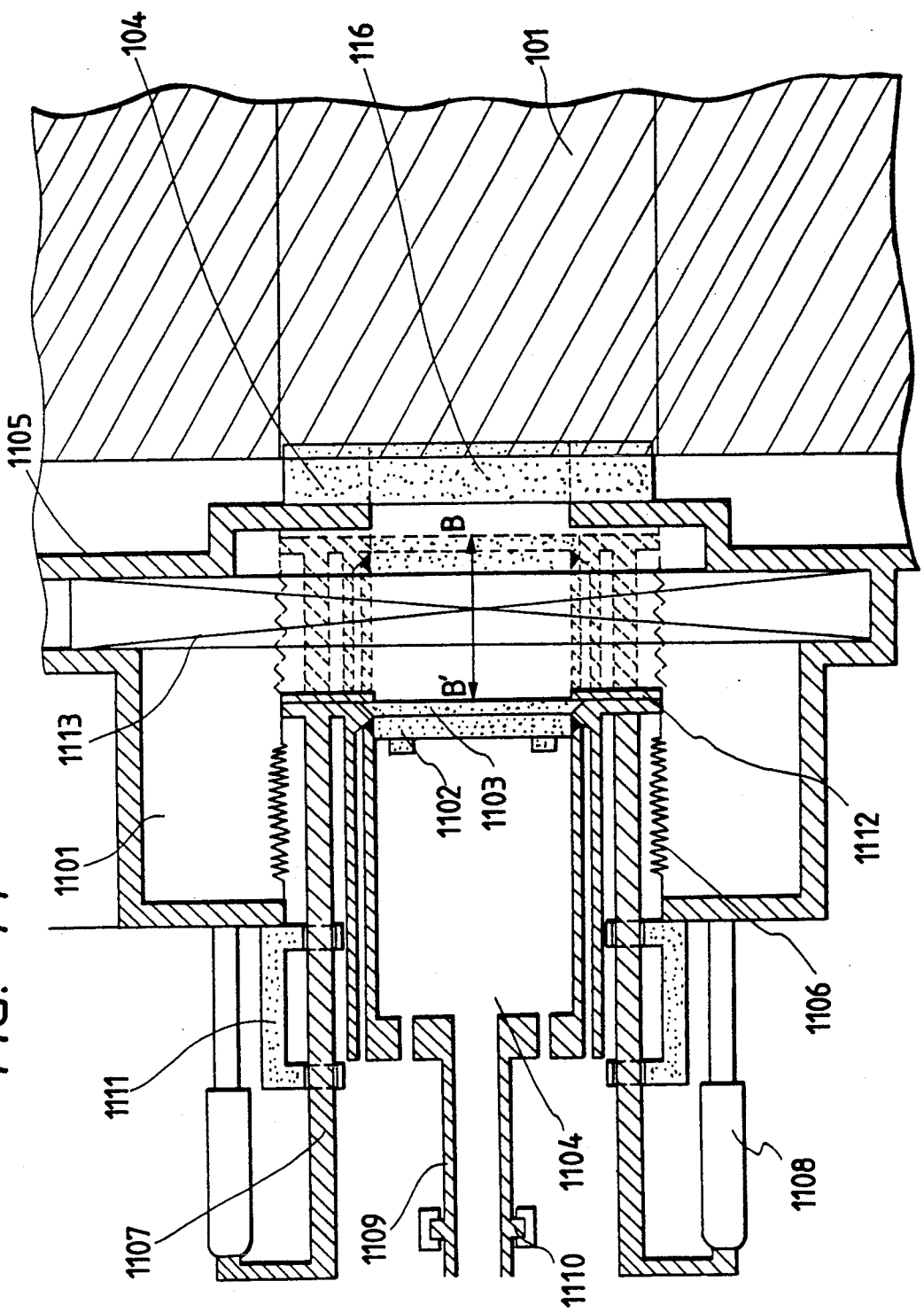
FIG. 11 is a schematic view showing an example of auxiliary chamber for performing the replacement or etching of the microwave transmittable members.
Figure 12:
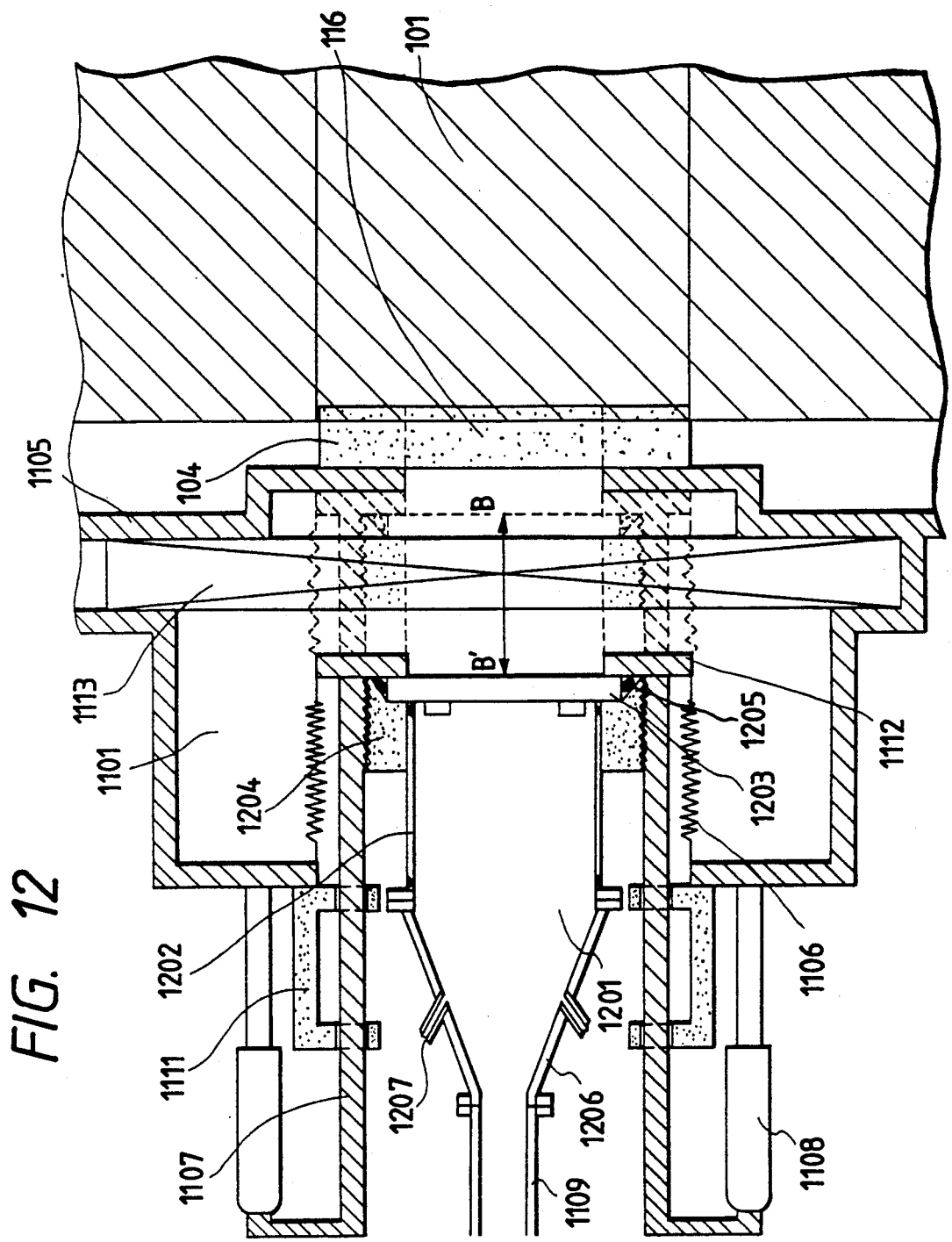
FIG. 12 is a schematic view showing another example of the aforesaid auxiliary chamber according to the present invention.

In this respect, the leading end portion of the microwave applicator, for example, the portion at 1112 in FIG. 11, should desirably be provided with a sealing capability in order to separate the film deposition chamber and auxiliary chamber airtightly.

The microwave applicator means of the present invention is of such a structure that the microwave energy supplied from the microwave power source is emitted into the film deposition chamber and plasma is produced from the deposit film formation material gas introduced by the aforesaid gas introduction means thereby to maintain it therein.

Specifically, it is preferable to use a structure in which the microwave transmittable member is mounted at the leading portion of the microwave transmission waveguide airtightly. Then, it may be possible to use the microwave applicator means which is either the same standard as the microwave transmission waveguide or otherwise. Also, the microwave transmission mode in the microwave applicator means should preferably be able to perform the microwave energy transmission efficiently in the film deposition chamber, and the dimension, shape, and the like of the microwave applicator means should be designed to present a single mode in consideration of the stable generation, maintenance, and control of the microwave plasma. However, it may be possible to use the applicator capable of transmitting plural modes by selecting arbitrarily the microwave plasma generating conditions such as material gas, pressure, microwave current to be used. As to the transmission mode which is designed to become a single mode, $TE_{10}$ mode, $TE_{11}$ mode, $eH_1$ mode, $TM_{11}$ mode, $TM_{01}$ mode, and the like can be named, for example. However, it is preferable to select $TE_{10}$ mode, $TE_{11}$ mode, and $eH_1$ mode. Then, to the aforesaid microwave applicator means, the waveguide capable of transmitting the above-mentioned transmission modes is connected and preferably, the transmission mode in the waveguide and the transmission mode in the microwave applicator means should be matched. The kinds of the aforesaid waveguide should preferably be a kind which can be arbitrarily selected in accordance with the microwave frequency band and its mode to be used and the cut-off frequency thereof should be smaller than the frequency to be used. Specifically, a square waveguide, circular waveguide or oval waveguide of JIS, EIAJ, IEC, JAN standards or a square waveguide having 96 mm wide×27 mm high in terms of the inner dimension at its cross-section for 2.45 GHz of the Company own standard can be named among others.

In the apparatus of the present invention, the microwave energy supplied from the microwave power source is emitted into the film deposition chamber efficiently through the microwave applicator means. Therefore, it is easier to evade the problem related to the reflective wave due to the so-called microwave applicator, and it is possible to maintain a comparatively stable discharging in the microwave circuit without using the three stab tuner or E-H tuner, or the like. However, it is desirable to provide the aforesaid microwave adjustment circuit for the protection of the microwave power source in such a case that an intensified reflective waves may be generated by abnormal discharging or the like before or after the discharing is started.

In the apparatus of the present invention, a space remains between the aforesaid curb starting end formation means and curve terminating end formation means in the film deposition chamber, and the aforesaid material gas is exhausted form such space to maintain the inside of the film deposition chamber in a low pressure state. Then, it is necessary to design this space with a dimension just enough to obtain a sufficient exhausting conductance and at the same time, to prevent the microwave energy emitted into the film deposition chamber from being leaked to the outside the film deposition chamber.

Specifically, the aforesaid microwave applicator means is arranged so that the direction of the electric field of the microwave progressing in the microwave applicator means and the plane including the center axes of the holding and conveying roller serving as the aforesaid curve starting end formation means and the holding and conveying roller serving as the aforesaid curve terminating end formation means should not be in parallel to each other. In other words, the aforesaid waveguide is arranged so that the plane including the longitudinal side or the major axis of the aforesaid waveguide which is connected to the microwave applicator means and the plane including the center axes of the aforesaid pair of the holding and conveying rollers should not be in parallel to each other.

Then, in a case where the microwave energy is emitted into the film deposition chamber through a plurality of the microwave applicator means, the arrangement should be made as described earlier for each of the microwave applicator means.

Futhermore, it is desirable to define the maximum dimension of the opening width in the longitudinal direction of the strip type member for the space remaining between the aforesaid curve starting end formation means and curve terminating end formation means to be preferably less than $\frac{1}{2}$ wavelength of the wavelength of the microwave, more preferably less than $\frac{1}{4}$ wavelength thereof in consideration of the prevention of the microwave leakage.

In the apparatus of the present invention, when a plurality of the microwave applicator means are provided to face each other, an arrangement is necessary so that the microwave energy emitted from one applicator means which is received by the other microwave applicator means should not be allowed to reach the microwave power source connected to this other microwave applicator means to give damage to the microwave power source or cause any abnormal oscillation of the microwave or some other adverse effects.

Specifically, the aforesaid microwave applicator means should be arranged so as not to allow the electric field directions themselves of the microwave progressing in the aforesaid microwave applicator means to be in parallel to each other. In other words, the planes including the longitudinal side or major axes of the aforesaid waveguides connected to the aforesaid microwave applicator means should be arranged so as not be in parallel to each other.

In the method of the present invention, when the microwave energy is emitted from only one side of the both end faces of the aforesaid film deposition chamber, it is necessary to prevent the leakage of the microwave energy from the other end face. Thus, it is preferable to seal the aforesaid end face with a conductive material or to cover with a wire netting having preferably less than $\frac{1}{2}$ wavelength of the wavelength of the microwave used by the hole diameter or more preferably, less than $\frac{1}{4}$ wavelength thereof, or with a punching board.

Figure 10A:
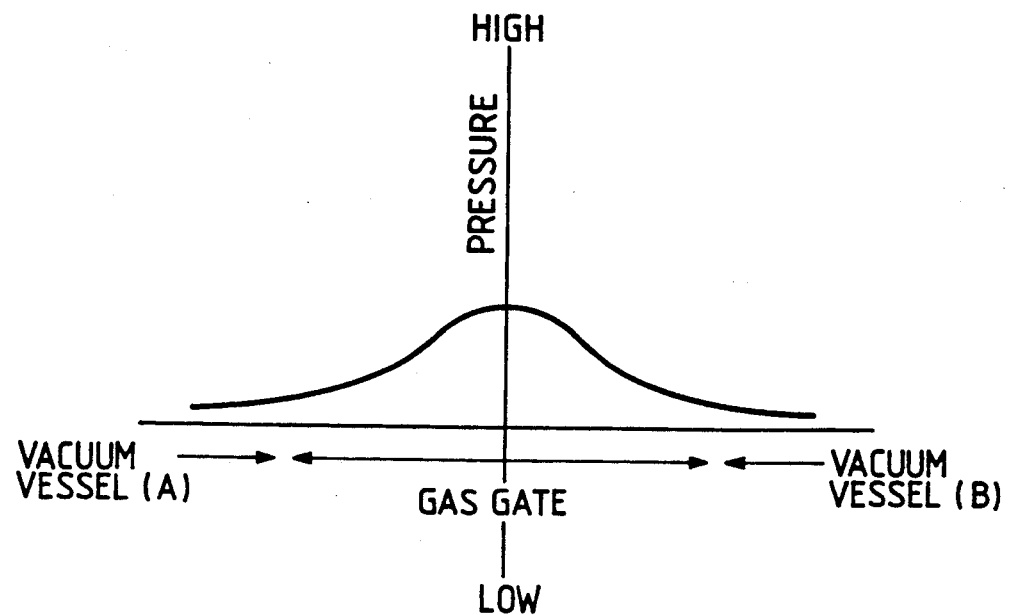
FIGS. 10A and 10B are views schematically showing the pressure gradients of gas gate means according to the present invention.
Figure 10B:
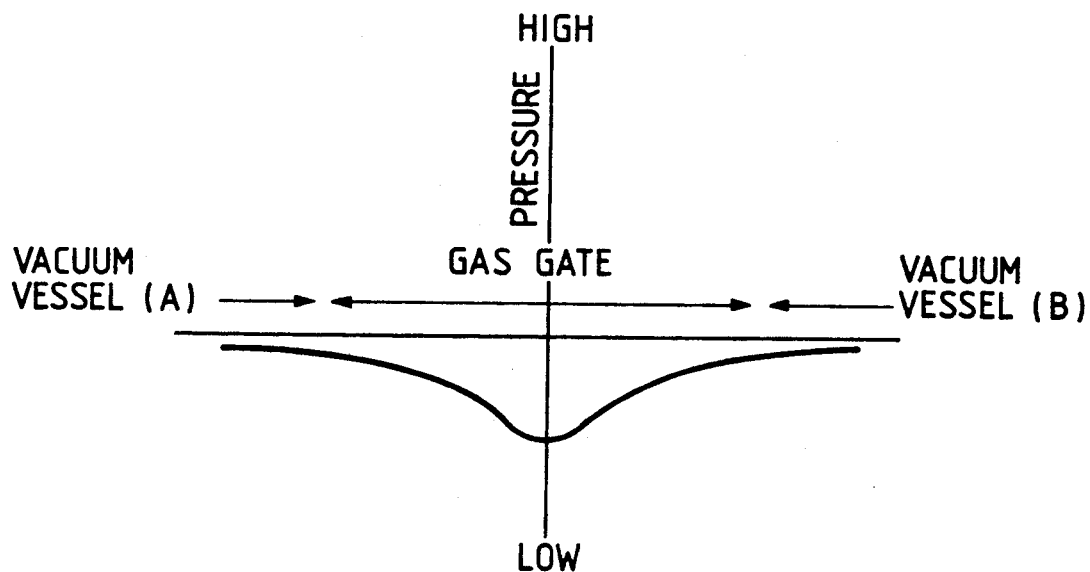

In the apparatus of the present invention, it is possible to use suitably the aforesaid film deposition chamber and/or a separated container with the other vacuum container having a film deposition means in a separated individual vacuum atmosphere as well as gas gate means for allowing the aforesaid strip type member to penetrate through them for the continuous conveyance. In the apparatus of the present invention, as it is desirable to maintain the inside of the aforesaid film deposition chamber and/or separated container at a low pressure required for the operation in the vicinity of the minimum value of the Paschen curve, the pressure in the other vacuum container connected to the aforesaid film deposition chamber and/or the separated container is at least equal to or in most cases higher than the pressure thereof. Therefore, the aforesaid gas gate should have such a capability so as not to diffuse the deposit film formation material gas, which is used mutually between them, by the pressure difference to be generated between the respective containers. Although the gas gate means disclosed in U.S. Pat. No. 4,438,723 is adoptable as its fundamental concept, its capability should further be improved. Specifically, it is necessary for the gas gate to withstand a pressure difference of approximately $10^6$ maximum, and as an exhaust pump, an oil diffusion pump, turbo molecular pump, mechanical booster pump, or the like having a large exhausting capability should be used suitably. Also, the cross-sectional shape of the gas gate is of a slit type or a type similar thereto, and its dimension is calculated and designed using a usual conductance equation in accordance with its total length and the exhausting capability of an exhaust pump to be used. Further, it is preferable to use gate gas in combination to enhance the separation capability. For example, Ar, He, Ne, Kr, Xe, Rn or other rare gases or the deposit film formation rare gas such as $H_2$ can be named. The gate gas flow rate is determined arbitrarily in accordance with the conductance of the gas gate as a whole and the performance of the exhaust pump to be employed, but in general, the pressure gradient should be formed as shown in FIGS. 10A and 10B. In FIG. 10A, since the greatest pressure is located almost in the center of the gas gate, the gate gas flows from the central portion of the gas gate to the vacuum containers on both side thereof, and in FIG. 10B, since the point where the pressure becomes the smallest is located almost in the central portion of the gas gate, the gate gas is also exhausted from the central portion of the gas gate together with the deposit film formation material gas which has been flown into from the container on both sides thereof. As a result, it is possible to restrain the gas diffusion to the minimum each other between the containers on both sides in the both cases. In practice, the diffusing gas in measured using a mass spectrometer or the composition analysis on the deposit film is conducted to determine the optimal conditions.

In the apparatus of the present invention, as a deposit film formation means arranged in the other vacuum container connected to the aforesaid separation container by the aforesaid gas gate means, the means for implementing a method to be used for a so-called functional deposit film formation such as RF plasma CVD method, sputtering method and reactive sputtering method, ion plating method, optical CVD method, thermal CVD method, MOCVD method, MBE method, and HR-CVD method can be named. Then, it is possible to connect the microwave plasma CVD method or any similar microwave plasma CVD method, and by selecting appropriate means for fabricating desired semiconductor devices, the connection is made using the aforesaid gas gate.

The microwave frequency to be supplied form the microwave power source to be used in the present invention should preferably be 2.45 GHz which is applied to the general public use can be named. However, any other frequency band can also be used if only such a frequency band is easily obtainable. Also, it is desirable to adopt the so-called continuous oscillation as an oscillation mode in order to gain stable discharging, and its ripple width should preferably be within 30%, and more preferably, within 10%, in the output region to be used.

In the apparatus of the present invention, it is effective for the prevention of the mixture of impurities to perform the deposit film formation continuously without causing the aforesaid film deposition chamber and/or separation container to be exposed to the atmosphere in consideration of the characteristic stability of the deposit film to be formed. However, since the length of the strip type member is limited, it is necessary to perform its connecting operation with processing by welding or the like. Specifically, such a processing chamber should be provided adjacent to the container (feeding side and widing side) storing the strip type member.

Hereinafter, using the accompanying drawings, the processing method will be described specifically.

FIGS. 9A through 9J are schematic views illustrating the aforesaid strip type member processing chamber briefly as well as the operation of the strip type member and others at the time of the film deposition.

In FIG. 9, a reference numeral 901a designates a strip type member processing chamber (A) provided on the strip type member feeding side and 901b, a strip type member processing chamber (B) provided on the strip type substrate winding side. In the inside thereof, there are accommodated Byton made rollers 907a and 907b, cutter blades 908a and 908b, welding jigs 909a and 909b.

Figure 9A:
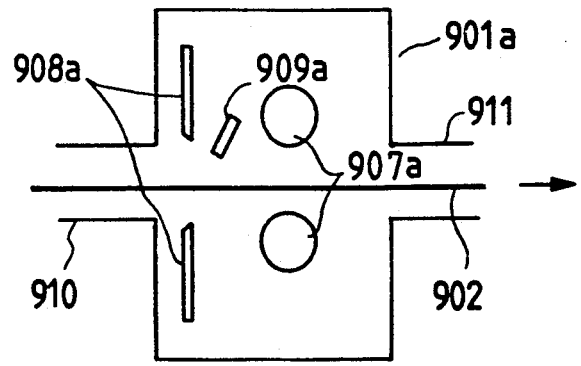
FIGS. 9A through 9J are schematic views illustrating the method for processing a strip member.

In other words, FIG. 9A represents a state of the usual film deposition. The strip type member 902 is being conveyed in the direction indicated by an arrow in FIG. 9A, and the roller 907a, cutter blade 908a and welding jig 909a are not in contact with the strip type member 902. Here, a reference numeral 910 designates a coupling means (gas gate) for the connection with a strip type member storage container (not shown) and 911, a coupling means (gas gate) for the connection with a vacuum container (not shown).

Figure 9B:
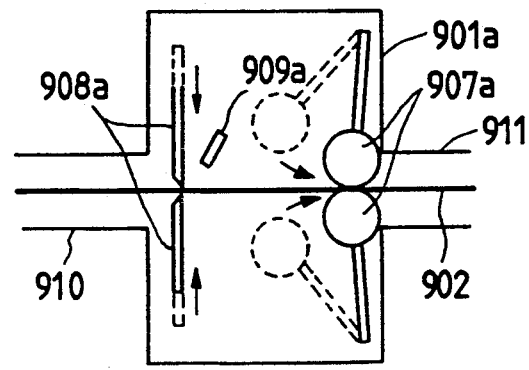

FIG. 9B illustrates a first process for replacing a new strip type member subsequent to the termination of the film deposition process of one roll of the strip type member. At first, the strip type member 902 is stopped, and the rollers 907a are moved from the position indicated by dotted lines in FIG. 9B in the direction indicated by arrows so as to allow them to be closely in contact with the strip type member 902 and the wall of the strip type member processing chamber 901a. In this state, the strip type member storage container and the film deposition chamber are separated airtightly. Then, the cutter blades 908a are moved in the direction indicated by arrows in FIG. 9B to cut the strip type member 902. The butter blades 908a comprise either mechanical, electrical, or thermal cutters which can cut the strip type member 902.

Figure 9C:
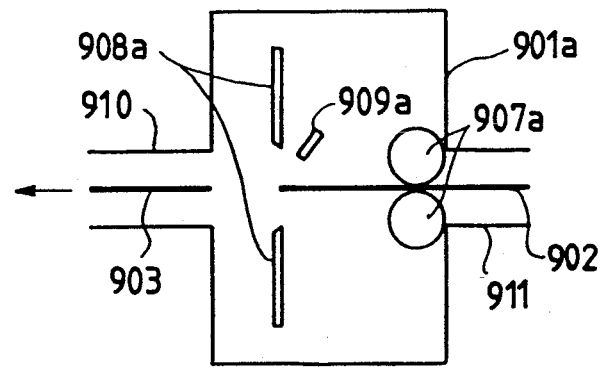

In FIG. 9C, it is shown that the strip type member 903 which has been cut is being wound up to the strip type member storage container side.

The above-mentioned cutting and winding processes can be performed with the inner state of the strip type member storage container being vacuumized or leaked to the atmospheric pressure.

Figure 9D:
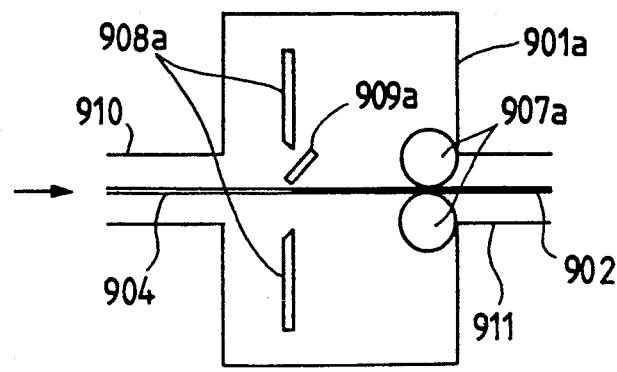

In FIG. 9D, a new strip type member 904 is being fed in and the process to connect it to the strip type member 902 is shown. The end portions of the strip type members 904 and 902 are in contact and then connected by the welding jig 909a with welding.

Figure 9E:
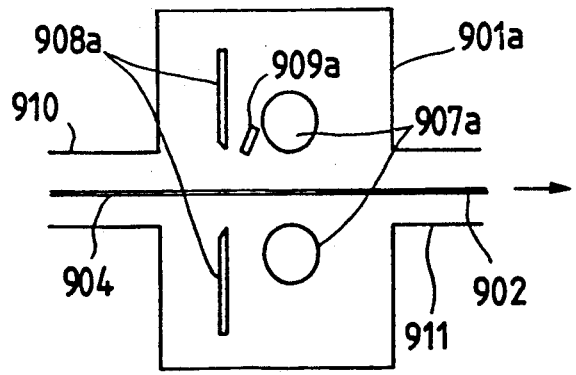

In FIG. 9E, the inside of the strip type member storage container (not shown) is vacuumized, and when the pressure difference with the film deposition chamber is sufficiently reduced, the rollers 907a are removed from the the strip type member 902 and the wall of the strip type member processing chamber (A) 901a, and the state that the strip type members 902 and 904 are being wound is shown.

Subsequently, the operation on the strip type member winding side will be described.

Figure 9F:
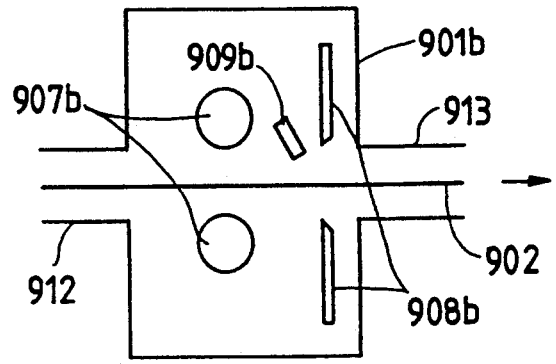

FIG. 9F represents the state at the time of usual film deposition, but each jig is arranged almost symmetrically to the one described in FIG. 9A.

Figure 9G:
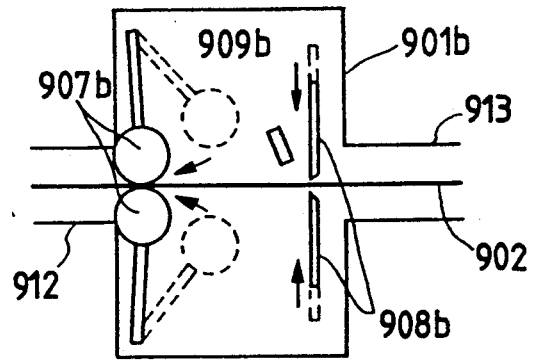

FIG. 9G illustrates the process in which subsequent to the film deposition on a one roll of the strip type member having been completed, this roll is withdrawn and replaced with an empty bobbin to wind up the next strip type member for which the film deposition process is given.

At first, the strip type member 902 is stopped. Then, the rollers 907b are moved from the position indicated by dotted lines in the direction indicated by arrows in FIG. 9G to be in close contact with the strip type member 902 and the wall of the strip type member processing chamber 901b. In this state, the strip type member storage container and film deposition chamber are separated airtightly. Subsequently, the cutter blades 908b are moved in the direction indicated by arrows in FIG. 9G to cut the strip type member 902. The cutter blades 908b comprise any one of those capable of cutting the strip type member 902 mechanically, electrically, or thermally.

Figure 9H:
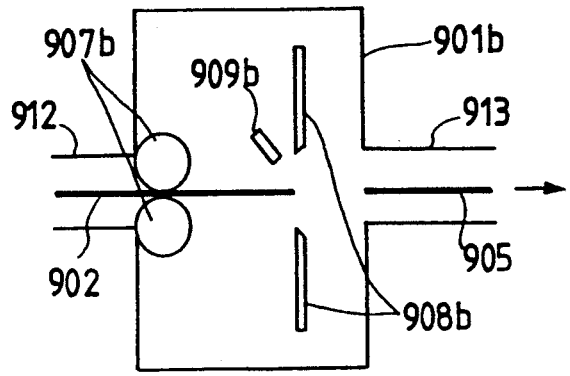

FIG. 9H shows the state that the strip type member 905 cut for separation subsequent to the film deposition having been completed is being wound up to the strip type member storage container side.

The above-mentioned cutting and winding processes can be performed in the inner state of the strip type member storage container either being vacuumized or leaked to the atmospheric pressure.

Figure 9I:
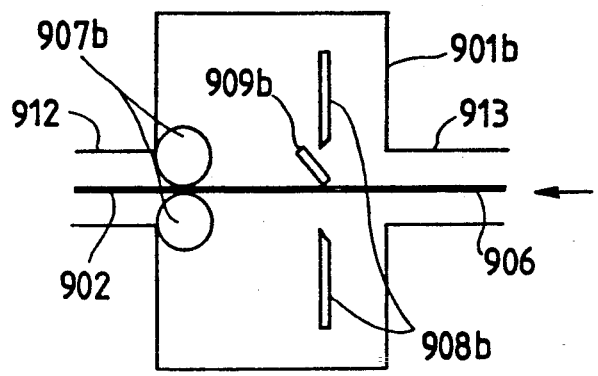

FIG. 9I illustrates the process in which the strip type member 906 for preparatory winding, which is mounted on a new winding bobbin, is being fed and the strip type member 906 for preparatory winding and the strip type member 902 are connected. Then, these are welded for connection by the welding jig 909b.

Figure 9J:
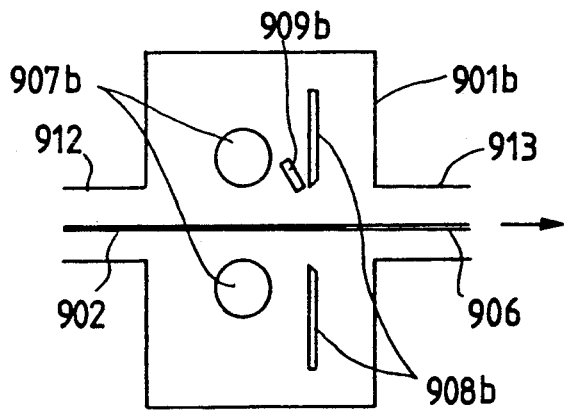

In FIG. 9J, the strip type member storage container (not shown) is vacuumized, and after the pressure difference with the film deposition chamber has been reduced sufficiently, the rollers 907b are removed from the strip type member 902 and the wall of the strip type member processing chamber (B) 901b. The state that the strip type members 902 and 906 are being wound is illustrated.

For the functional deposit film continuously formed by the method and apparatus of the present invention, the so-called IV family semiconductor thin films such as Si, Ge, and C, the so-called IV family alloy semiconductor think films such as SiGe, Sic, SiSn, the so-called III-V family compound semiconductor thin films such as GaAs, GaP, GaSb, InP, InAs, and the so-called II-VI family compound semiconductor thin films such as ZnSe, ZnS, ZnTe, Cds, CdSe, CdTe can be named irrespective of being non-crystal or crystal.

For the aforesaid material gas used for the method and apparatus of the present invention, those of the hydride, halogenide, organometallic compound, and the like which are the composition elements of the above-mentioned respective semiconductor thin films and can be introduced in gaseous state are selected and use.

These material compounds can be used not only individually but also in combination of two kinds or more as a matter of course. Also, these material compounds may be introduced in mixture with a rare gas such as He, Ne, Ar, Kr, Xe, or Rn and dilution gas such as $H_2$ HF, or HCl.

Also, for the aforesaid semiconductor thin films continuously formed, valence electron control and forbidden band control can be performed. Specifically, the material compound containing the element which can serve to be a valence electron controller or fobidden band controller should be introduced either indivdually or in mixture with the aforesaid deposit film formation material gas or dilution gas.

The aforesaid deposit film formation material gas and others are discharged into the aforesaid column-shaped film deposition chamber uniformly through a gas guide having a single or plural gas discharging ports at its leading end, which is provided in the column-shaped film deposition chamber formed by the aforesaid strip type member, and converted into plasma by the microwave energy to form a microwave plasma region. For the material making the aforesaid gas guide, those which are not damaged by the microwave plasma are suitably used. Specifically, stainless steel, nickel, titan, tangusten, vanadium, nichrome or other thermoresitive metals and those metals on which almina, silicon nitride or other ceramics are coated by the flame processing can be named.

In the apparatus of the present invention, the deposit film formation material gas introduced into the column-shaped film deposition chamber through the gas guide is partially or totally resolved to generate the precursor for the deposit film formation, and film deposition is performed. However, it is necessary to exhaust the material gas yet to be resolved or the gas which has become a different composite due to resolution to the atmosphere outside the aforesaid column-shaped film deposition chamber immediately. However, if the aforesaid exhausting outlet area should be made greater than necessary, then there is a possibility that the leakage of the microwave plasma may occur, causing the plasma to be unstable or producing adverse effects on the other electronic devices, human body, and others. Therefore, in the apparatus of the present invention, the aforesaid exhausting outlet is defined by the space between the curve starting end and curve terminating end of the aforesaid strip type member, and such space should preferably be made less than ½ wavelength of the wavelength of the microwave to be used or more preferably, less than ¼ thereof in consideration of the prevention of the microwave leakage.

APPARATUS EXAMPLES

Hereinafter, in conjunction with the accompanying drawings, specific examples of the apparatus of the present invention will be described. Such examples, however, are not exhaustive and it is to be understood that the present invention is not limited thereto.

APPARATUS EXAMPLE 1

FIG. 1 is a schematic perspective view briefly showing a microwave plasma CVD apparatus according to the present invention.

A reference numeral 101 designates a strip type member which is conveyed in the direction indicated by arrow → in FIG. 1 to form a film deposition chamber 116 continuously while maintaining a column-shaped curve by holding and conveying rollers 102 and 103 and holding and conveying rings 104 and 105. Reference numerals 106a through 106e designate a temperature control mechanism to heat or cool the strip type member 101, and the temperature control is performed individually by each of them.

In the present apparatus, a pair of the microwave applicators 107 and 108 are provided to face each other, and at the leading ends thereof, microwave transmit members 109 and 110 are provided respectively. Also, rectangle waveguides 111 and 112 are respectively arranged in such a manner that the planes including the longitudinal sides thereof are not perpendicular to the planes including the center axes of the holding and conveying rollers and further, the planes including the longitudinal sides are not in parallel to each other. Here, in FIG. 1, for the convenience of the explanation, the microwave applicator 107 is illustrated in a state where this applicator is detached from the the holding and conveying ring 104, but when the deposit film is being formed, this applicator is arranged in the direction indicated by arrow in FIG. 1.

A reference numeral 113 designates a gas inlet tube; 114, an exhaust guide which is connected to an exhaust pump (not shown); 115a and 115b are separation paths and are provided when the apparatus of the present invention in coupled to the other containers or the like including film deposition means.

In the holding and conveying rollers 102 and 103, a feeding degree detecting mechanism and tension detecting mechanism (neither shown) are incorporated to maintain the feeding degree and the curving shape of the strip type member 101 constantly.

To the waveguides 111 and 112, microwave power sources (not shown) are connected.

FIG. 2 is a cross-sectional view schematically illustrating the microwave applicator means 107 and 108 specifically.

A reference numeral 200 designates a microwave applicator to which microwave is transmitted from the microwave power source (not shown) through a square waveguide 208 from the left side in FIG. 2 as indicated by an arrow.

Reference numerals 201 and 202 designate microwave transmittable members which are fixed to an inner barrel 204 and outer barrel 205 using a metallic sealing 212 and fixing ring 206 for its vacuum sealing. Also, between the inner barrel 204 and outer barrel 205, a cooling medium 209 is allowed to flow, and the one end is sealed by an O ring 210 to cool the entire body of the microwave applicator 200 evenly. As the cooling medium 209, water, Freon, oil, cooling air, or the like is preferably used. To the microwave transmittable member 201, microwave adjustment discs 203a and 203b are fixed. To the outer barrel 205, a choke flange 207 with a groove 211 machined is connected. Also, reference numerals 213 and 214 designate inlet hole and/or exhaust hole of the cooling air, which are used for cooling the interior of the applicator.

In the present apparatus, the inner shape of the inner barrel 204 is cylindrical, and the inner diameter thereof and the length of the progressing direction of the microwave are designed to enable it to attain its function as a waveguide. In other words, the inner diameter thereof is smaller than the frequency of the microwave used for a cut-off frequency and further is made as large as possible within the scope that no plural modes can stand. Also, it is preferable to design the length to be a length whereby no standing waves result. The inner shape of the aforesaid inner barrel 204 may be of a square column type as a matter of course.

APPARATUS EXAMPLE 2

In the present apparatus, the apparatus shown in the apparatus example 1 is arranged in a separation container, and as shown in FIG. 11, an auxiliary chamber 1101 is adjacently arranged to the aforesaid separation container. Then, a microwave applicator 1104 including microwave transmittable members 1102 and 1103 is arranged to be transportable between the film deposition chamber 116 and the auxiliary chamber 1101 while maintaining airtightness therebetween to arrange such a structure that a second microwave transmittable member 1103 facing the film deposition chamber can be replaced in the auxiliary chamber 1101.

FIG. 11 is a cross-sectional view illustrating the vicinity of the auxiliary chamber observed in the direction from A in FIG. 1.

The shape of the separation container is not particularly limited as far as it is of a type in which each of the jigs shown in the apparatus example 1 can be incorporated. However, besides a cubic type, rectangular parallelopiped type, a cylindrical type or the like can be used suitable. Also, an auxiliary gas inlet tube is provided between the remaining space between the film deposition chamber 116 and the separation container to introduce rare gas, $H_2$ gas or the like for the pressure adjustment to prevent discharging in the aforesaid space. Also, the aforesaid space may be evacuated either by the exhaust pump in the film deposition chamber 116 simultaneously or by an exhaust pump which is connected thereto independently.

The auxiliary chamber 1101 is provided with an exhaust device dedicated thereto (not shown) having an opening and closing section (not shown) for the replacement of the second microwave transmittable members 1103 as well as the inlet guide for the rear gas leak or pressure adjustments.

The microwave applicator 1104 is transferred from the state B in the film deposition chamber for the state B' in the auxiliary chamber while maintaining the vacuum tightness by the use of bellows 1106. Then, the gate valve 1113 which is a separation means for separating the film deposition chamber 116 and auxiliary chamber 1101 is closed. The gate valve 1113 is sealed by the wall 1105 of the separation container and the film deposition chamber 116 and auxiliary chamber 1101 are separated airtightly by the gate valve 1113.

As a result, the deposition chamber 116 is not leaked even when the auxiliary chamber 1101 is released to the atmospheric pressure.

The microwave applicator 1104 is of the same structure as the applicator shown in FIG. 2 fundamentally, which is supported by a supporting bar 1107 and transported by a hydraulic cylinder 1108.

Also, the coupling section 1110 of the waveguide 1109 is structured to be easily detachable, and when the microwave applicator 1104 is transferred, the coupling section 1110 is removed for the transfer thereof.

APPARATUS EXAMPLE 3

For the present example, there can be cited an apparatus having the same structure as the apparatus shown in the apparatus example 1 with the exception of the shape of the microwave applicator which is now of a square column type. The cross-sectional dimension of the square column type microwave applicator may be the same as or different from the dimension of the waveguide to be employed. Also, it is desirable to make such dimension as large as possible within a scope that no plural modes can stand with respect to the frequency of the microwave to be used.

APPARATUS EXAMPLE 4

For the present example, there can be cited an apparatus having the same structure as the apparatus shown in the apparatus example 2 with the exception of the employment of the square column type microwave applicator means which is used for the apparatus example 3.

APPARATUS EXAMPLES 5 AND 6

For the present examples, there can be cited an apparatuses having the same structure as the apparatuses shown in the apparatus examples 1 and 2 with the exception of the use of oval type applicator means instead of the cylindrical type microwave applicator means used in those examples.

APPARATUS EXAMPLE 7

Figure 3:
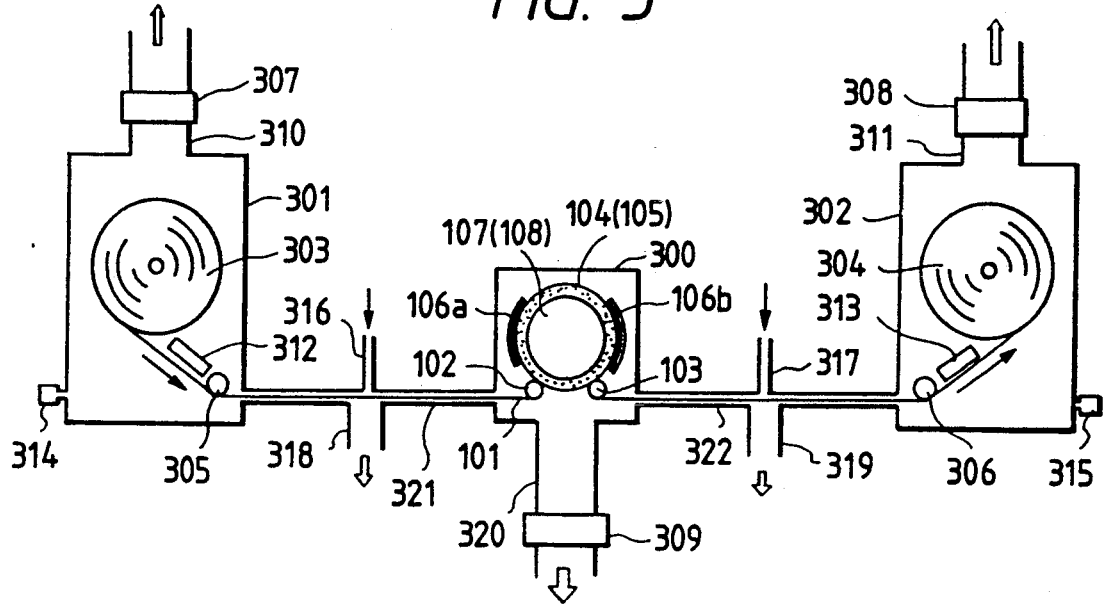
FIG. 3 through FIG. 5 are schematic views respectively illustrating an example of a microwave plasma CVD apparatus according to the present invention.

For the present example, there can be cited an apparatus as shown in FIG. 3 in which the vacuum containers 301 and 302 for feeding and winding the strip type member 101 are coupled to the deposit film formation microwave plasma CVD apparatus shown in the apparatus example 2 by the use of the gas gates 321 and 322.

A reference numeral 300 designates a separation container; 303, a strip type member feeding bobbin; and 304, a strip type member winding bobbin, and the strip type member is conveyed in the direction indicated by arrows in FIG. 3. This direction of conveyance can be reversed as a matter of course. Also, it may be possible to arrange a winding and feeding means for interleaf in the vacuum containers 301 and 302 for the surface protection of the strip type member. For the material of the aforesaid interleaf, thermoresistive resin such as polyimide, Tefron, glass wool, or the like is preferably used. Reference numerals 306 and 307 designate feed rollers which serve to adjust the tensioning adjustment and perform the positioning of the strip type member; 312 and 313, the temperature adjustment mechanisms which are used for preliminarily heating or cooling the strip type member; 307, 308, and 309, slot valves for adjusting the exhausting volume; 310, 311, and 320, exhaust guides which are respectively connected to exhaust pumps (not shown); 314 and 315, pressure gages; 316 and 317, gate gas inlet guides; and 318 and 319, gate gas exhaust guides for exhausting the gate gas and/or deposit film formation material gas by exhaust pumps (not shown).

APPARATUS EXAMPLE 8

Figure 4:
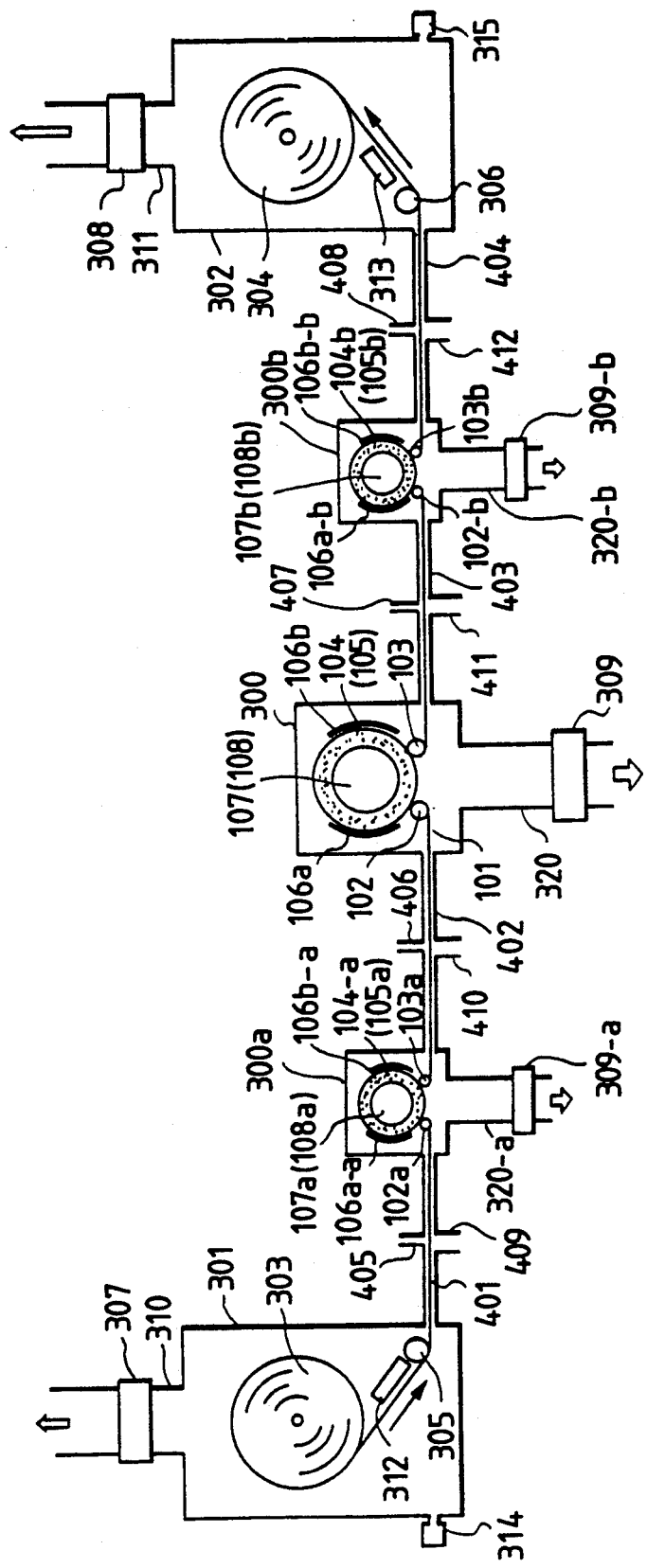

For the present example, there can be cited an apparatus as shown in FIG. 4 in which two more separation containers 300-$a$ and 300-$b$ with the microwave plasma CVD deposit film formation system according to the present invention respectively incorporated therein are coupled to the apparatus shown in the apparatus example 7 to arrange a structure for the fabrication of layer type devices.

In FIG. 4, the mechanisms designated by reference marks a and b have the same effects as those employed in the separation container 300 fundamentally.

Reference numerals 401, 402, 403, and 404 designate gas gates respectively; 405, 406, 407, and 408, gate gas inlet guides respectively; and 409, 410, 411, and 412, gate gas exhaust guides respectively.

APPARATUS EXAMPLES 9 AND 10

For the present examples, there can be cited apparatuses having the same structures as those shown in the apparatus examples 7 and 8 with the exception of the microwave applicator 201 which is now replaced with the square column type microwave applicator shown in the apparatus example 3 or 4.

APPARATUS EXAMPLES 11 AND 12

For the present examples, there can be cited apparatuses having the same structures as those shown in the apparatus examples 7 and 8 with the exception of the microwave applicator which is now replaced with the oval column type microwave applicator shown in the apparatus example 5 or 6.

APPARATUS EXAMPLE 13

Figure 5:
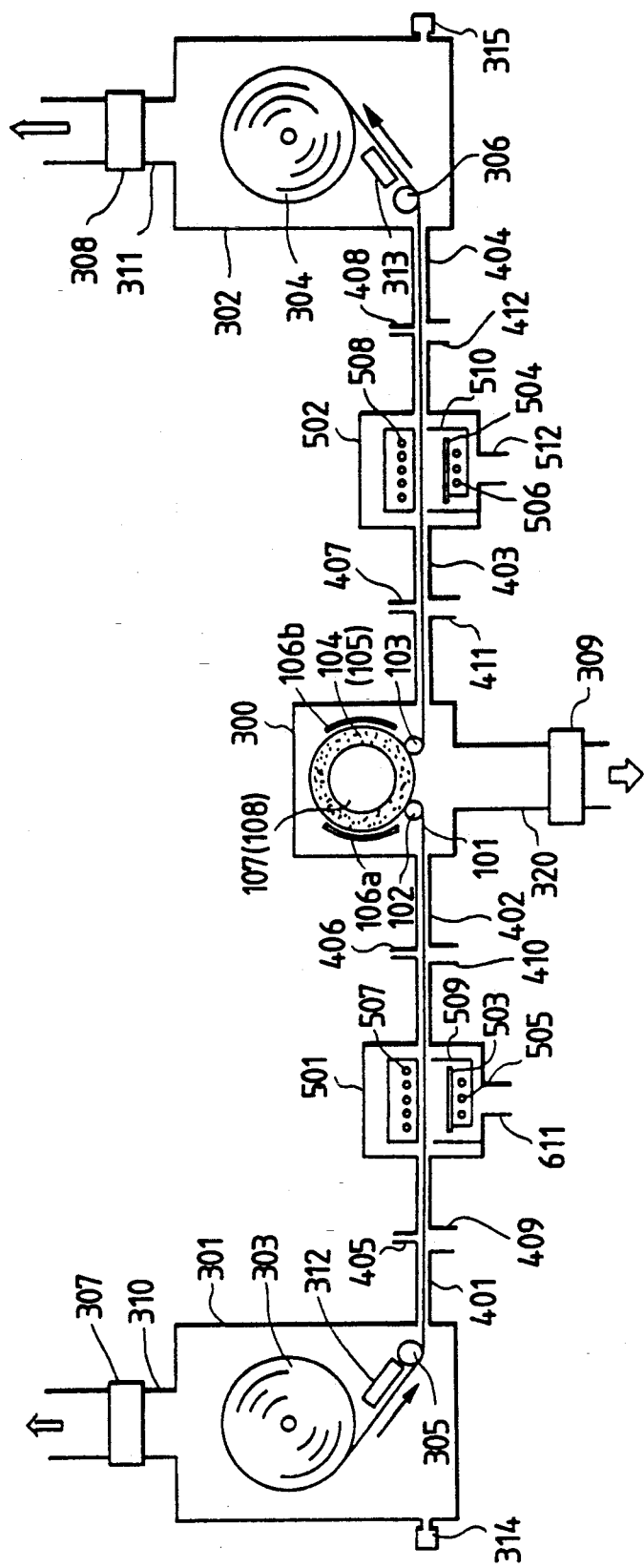

For the present example, there can be cited an apparatus as shown in FIG. 5 in which two more conventional RF plasma CVD apparatuses are coupled to both sides of the apparatus shown in the apparatus example 7 to arrange a structure for the fabrication of layer type devices.

Here, reference numerals 501 and 502 designate vacuum containers; 503 and 504, RF application cathode electrodes; 505 and 506, gas inlet guides which also function as heaters; 507 and 508, halogen lamps for heating the substrate; 509 and 510, anode electrodes; and 511 and 512, exhaust guides.

APPARATUS EXAMPLES 14 AND 15

For the present example, there can be cited apparatuses in which the microwave applicator is arranged only on one end face of the one side of the film deposition chamber in the apparatuses shown in the apparatus examples 1 and 2 in such a case where a comparatively narrow strip type member is used therefor. In this case, however, a wire netting, punching board, thin metallic plate, or the like for the microwave leakage prevention is provided for the other end face thereof.

APPARATUS EXAMPLE 16

For the present example, there can be cited an apparatus in the apparatus example 2, in which etching gas inlet guide is provided for the auxiliary chamber 1101 and subsequent to the transfer of the microwave applicator 1104, a waveguide having a different length (not shown) is again connected to make it possible to perform dry etching by microwave plasma.

APPARATUS EXAMPLE 17

For the present example, there can be cited an apparatus in the apparatus example 2, in which the shape of the microwave applicator is made different and the microwave applicator 1201 has an expanding and contracting mechanism consisting of a sleeve 1202 and others.

The microwave applicator 1201 is provided with the microwave transmittable member 1203, and the microwave transmittable member 1203 is fixed by the fixing ring 1204 to keep vacuum with a sealing member 1205 comprised of an O ring, metal seal and others.

Microwave is exchanged circularly from the waveguide 1109 by the taper guide 1206 to be emitted into the film deposition chamber from the microwave transmitting member 1203.

Also, the microwave transmittable member 1203 is cooled by the cooling gas which is introduced from the cooling gas inlet guide 1207.

Also, the sleeve 1202 is structured to be extended or contracted while maintaining electrical contact, hence being capable of transmitting microwave stably both in the expanded state B and contracted state B'.

APPARATUS EXAMPLE 18

For the present example, there can be cited an apparatus in which an etching gas inlet guide is provided for the auxiliary chamber 1101 in the apparatus example 17.

APPARATUS EXAMPLES 19 AND 20

For the present examples, there can be cited apparatuses in which an etching gas inlet guide and electrode for applying RF high frequency are provided for the auxiliary chamber 1101 in the apparatus examples 2 and 17 to arrange a structure which makes RF wave plasma dry etching possible.

OTHER APPARATUS EXAMPLES

For the other examples, there can be cited, for example, an apparatus in which the above-mentioned various microwave applicators are combinably mounted in the separation containers 300, 300-a, and 300-b for the deposit film formation in the apparatus example 8.

Also, there can be cited an apparatus in which two or three apparatuses shown in the apparatus example 8 are coupled in tandem, an apparatus in which the aforesaid deposit film formation means using the RF plasma CVD method are mixed in its connective structure, and the like.

Also, in the apparatus example 1 or 2, there can be cited an apparatus in which two or more pairs of microwave applicators are arranged on both end faces of the film deposition chamber to form a larger microwave plasma area so that a comparatively thick functional deposit film can be fabricated without changing the conveying speed of the strip type member.

As one of the examples of the semiconductor devices that can be fabricated suitably by the method and apparatus of the present invention, solar cells can be cited. FIGS. 8A through 8D illustrate the typical examples schematically as its layer structures.

Figure 8A:
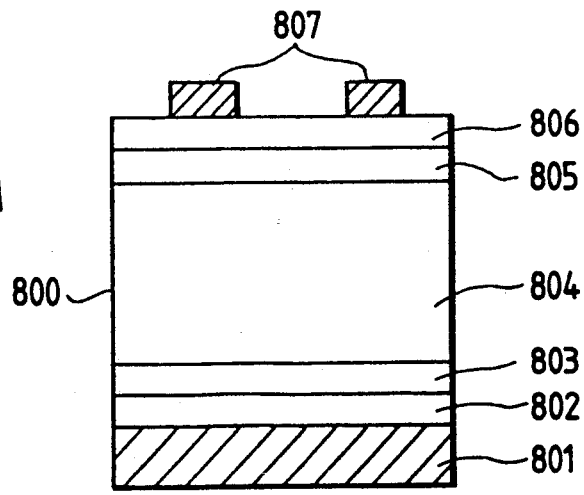
FIGS. 8A through 8D are schematic views illustrating pin type photovoltaic elements (single, tandem, and triple) fabricated by the use of the present invention.

The example shown in FIG. 8A is a photovoltaic element 800 in which there are sequentially formed by deposition on a supporting member 801, a lower electrode 802, n type semiconductor layer 803, i type semiconductor layer 804, p type semiconductor layer 805, transference electrode 806, and collecting electrode 807. In this respect, it is assumed that the incident light is given from the transference electrode 806 side of this photovoltaic element.

Figure 8B:
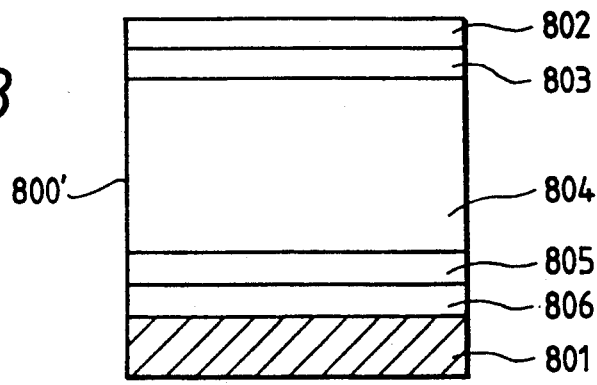

The example shown in FIG. 8B is a photovoltaic element 800' in which there are sequentially formed by deposition on a light transmittable supporting member 801, a transference electrode 806, p type semiconductor layer 805, i type semiconductor layer 804, n type semiconductor layer 803, and a lower electrode 802. In this respect, it is assumed that the incident light is given from the light transmittable supporting member 801 side of this photovoltaic element.

Figure 8C:
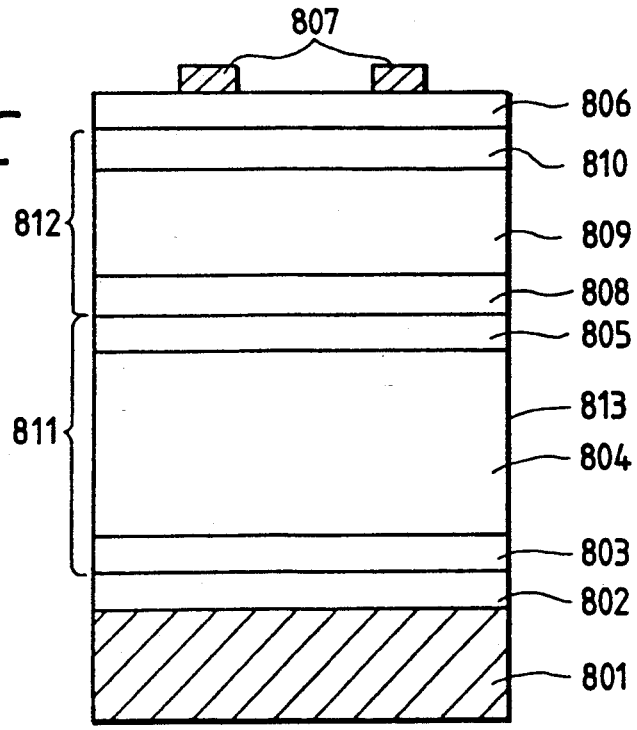

The example shown in FIG. 8C is a so-called tandem type photovoltaic element 813 which is structured with the two element layers of pin junction type photovoltaic elements 811 and 812 using band gap and/or two kinds of semiconductor layers of different layer thicknesses as its i layer. Here, a reference numeral 801 designates a supporting member on which a lower electrode 802, n type semiconductor layer 803, i type semiconductor layer 804, p type semiconductor layer 805, n type semiconductor layer 808, i type semiconductor layer 809, p type semiconductor layer 810, transference electrode 806 and collecting electrode 807 are sequentially layered. In this respect, it is assumed that the incident light is given from the transference electrode 806 side of this photovoltaic element.

Figure 8D:
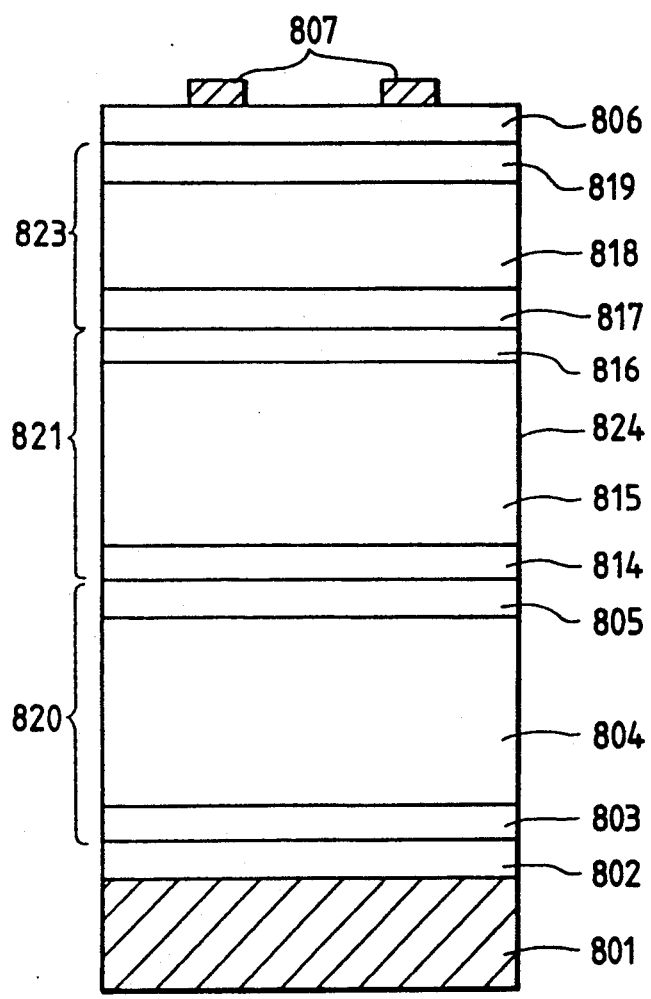

The example shown in FIG. 8D is a so-called triple type photovoltaic element 824 which is structured with the three element layers of pin junction type photovoltaic elements 820, 821, and 823 using band gap and/or three kinds of semiconductor layers of different layer thicknesses as its i layer. Here, a reference numeral 801 designates a supporting member on which a lower electrode 802, n type semiconductor layer 803, i type semiconductor layer 804, p type semiconductor layer 805, n type semiconductor layer 814, i type semiconductor layer 815, p type semiconductor layer 816, n type semiconductor layer 817, i type semiconductor layer 818, p type semiconductor layer 819, transparent electrode 806 and collecting electrode 807 are sequentially layered. It is assumed that the incident light is given from the transference electrode 806 side of this photovoltaic element.

In this respect, in every photovoltaic element, it is possible to use the n type semiconductor layer and p type semiconductor layer by changing the layer orders thereof for the purpose to be attained.

Hereinafter, the structures of these photovoltaic elements will be described.

SUPPORTING MEMBER

For the supporting member 801 used for the present invention, a flexible material capable of forming a curving shape is suitably adopted. Such a material can be electrically conductive or insulating. Further, it can be of a light transmitting type or non-transmitting type. However, in a case where the incident light is given from the supporting member 801 side, the supporting member should be of a light transmitting type as a matter of course.

Specifically, the aforesaid strip type member which is adopted for the present invention can be cited, and with the aforesaid strip type member, it is possible to implement the fabrication of a lighter solar cell, enhancement of its strength, and reduction of the space required for its transportation.

ELECTRODE

In the present photovoltaic elements, electrodes can be selected appropriately for use in accordance with the structural mode of a particular element to be adopted. As these electrodes, a lower electrode, upper electrode (transference electrode), and collecting electrode can be cited. (It is assumed, however, that the upper electrode referred to here is an electrode provided on the side from which the incident light is given, and the lower electrode is an electrode which is provided to face the upper electrode with the semiconductor layer being sandwiched therebetween.)

Now, the detailed descriptions of these electrodes will be given below.

(I) Lower Electrode

The lower electrode 802 used for the present invention has the different surface on which the rays of light are irradiated for generating photovoltaic power depending on whether the material of the above-mentioned supporting member 801 is of the light transmitting type or not (for example, if the supporting member 801 is metal or the like which is not a light transmittable material, the rays of light for generating the photovoltaic power are irradiated from the transference electrode 806 side as shown in FIG. 8A). Therefore, the location of its arrangement differs.

Specifically, in the case of the layer structures as shown in FIGS. 8A, 8C, and 8D, the lower electrode is arranged between the supporting member 801 and n type semiconductor layer 803. However, if the supporting member 801 is conductive, it may be possible to allow the aforesaid supporting member to function as a lower electrode simultaneously. However, even when the supporting member 801 is conductive, an electrode 802 may be arranged as a low resistivity electrode for drawing current or for the effective utilization of the incident light by enhancing the reflectivity on the surface of the supporting member if the sheet resistivity is high.

In the case shown in FIG. 8B, a light transmittable supporting member 801 is used, and as the incident light is given from the supporting member 801 side, the lower electrode 802 is provided to face the supporting member 801 with the semiconductor layer being sandwiched therebetween for the purpose of drawing current and optical reflection of the aforesaid electrode.

Also, when an electric insulating supporting member 801 is used, the lower electrode 802 is provided between the supporting member 801 and n type semiconductor layer 803 as an electrode for drawing current.

As the electrode material, Ag, Au, Pt, Ni, Cr, Cu, Al, Ti, Zn, Mo, W, and other metals and its alloys. A thin film of these metals is formed by vacuum deposition, electron beam deposition, sputtering, or the like. Also, consideration should be given so that the thin metallic film thus formed do not become any resistive component against the output of the photovoltaic element, and its sheet resistive value should preferably to 50Ω or less or more preferably 10Ω or less.

Although not shown in FIG. 8, it may be possible to provide a diffusion preventive layer such as conductive zinc oxide between the lower electrode 802 and n type semiconductor layer 803. As the effects of the aforesaid diffusion preventive layer, there can be cited not only the prevention of the diffusion of the metallic element constituting the electrode 802 into the n type semiconductor layer, the prevention of short that may occur due to pin holes or other defectives between the lower electrode 802 and transference electrode 806 with a semiconductor layer provided between them by giving some resistive value to the diffusion preventive layer, but also the confinement of the incident light in the photovoltaic element by generating multiple interferences by the thin film, and others.

(II) Upper Electrode (Transference Electrode)

For the transference electrode 806 used for the present invention, it is desirable to adopt a transference electrode having a light transmissibity of 85% or more to allow the solar or white luminescent light to be absorbed efficiently into the semiconductor layer as well as to use the one having a sheet resistive value of 100Ω or less so that this electrode does not become any resistive component electrically against the output of the photovoltaic element. As the material having such characteristics, there can be cited $SnO_2$, $In_2O_3$, ZnO, CdO, $Cd_2SnO_4$, ITO ($In_2O_3+SnO_2$) or other metal exides or a metallic thin film and others on which Au, Al, Cu, or other metal is deposited extremely thinly and translucently. The transference electrodes shown in FIGS. 8A, 8C, and 8D are layered on the p type semiconductor layer 805 respectively, and the one in FIG. 8B is layered on the substrate 801. Therefore it is necessary to select those having excellent adhesiveness to each other. For the fabricating method thereof, it is possible to select the resistive thermal deposition method, electron beam deposition method, sputtering method, splaying method, and the like appropriately as desired.

(III) Collecting Electrode

The collecting electrode 807 used for the present invention is provided on the transference electrode 806 for the purpose of reducing the surface resistance value of the transference electrode 806. For the electrode material, there can be cited Ag, Cr, Ni, Al, Ag, Au, Ti, Pt, Cu, Mo, W, and other metals or its alloys. These think films may be layered for use. Also, its shape and area should be designed appropriately so as to secure a sufficient luminous energy of the incident light to the semiconductor layer.

For example, it is desirable to make the shape of the collecting electrode expanded to cover evenly the light receiving surface of the photovoltaic element and its area to be preferably 15% or less or more preferably 10% or less with respect to the light receiving area thereof.

Also it is desirable to define the sheet resistive value to be preferably 50Ω or less or more preferably 10Ω or less.

i Type Semiconductor Layer

For the semiconductor material constituting the i type semiconductor layer suitably used for the fabrication of the photovoltaic element according to the present invention, there can be cited A-Si : H, A-Si : F, A-Si : H : F, A-SiC : H, A-Sic : F, A-SiC : H : F, A-SiGe : H, A-SiGe : F, A-SiGe : H : F, poly-Si : H, poly-Si : F, poly-Si : H : F and other so-called IV family and IV family alloy semiconductor materials. Besides, the so-called compound semiconductor materials of II-VI family and III-V family and others can be cited.

p Type Semiconductor Layer and n Type Semiconductor Layer

The semiconductor material constituting the p type semiconductor layer and n type semiconductor layer suitably used for the fabrication of the photovoltaic element according to the present invention can be obtained by doping valence electron controlling agent into the aforesaid semiconductor material constituting the i type semiconductor layer.

MANUFACTURING EXAMPLES

Hereinafter, the description will be made of the specific manufacturing examples using the microwave plasma CVD apparatus according to the present invention, but the examples are not exhaustive. It is to be understood, therefore, that the present invention is not limited by these manufacturing examples.

MANUFACTURING EXAMPLE 1

Using the continuous microwave plasma CVD apparatus (FIG. 3) shown in the apparatus example 7, a continuous deposition of an amorphous silicon film is performed.

At first, the bobbin 303, around which a sufficiently degreased and cleaned SUS 430 BA strip type substrate (45 cm wide×200 m long×0.25 mm thick) is wound, is set in the vacuum container 301 having the substrate feeding mechanism, and the aforesaid substrate 101 is passed through the gas gate 321 and the conveying mechanism in the separation container 300 and further through the gas gate 322 to the vacuum container 302 having the substrate winding mechanism. Then, a tensioning adjustment is performed to the extent that there is no sagging.

Now, each of the vacuum containers 301 and 302 and separation container 300 are roughly vaccumized by a rotary pump which is not shown in FIG. 3, and are further vaccumized to a condition $5\times10^{-6}$ Torr or less by a hydraulic diffusion pump (Varian HS-32) which is not shown in FIG. 3 while maintaining the surface temperature of the strip type member at 250° C. using the temperature control mechanisms 106a and 106b subsequent to having vaccumized these containers close to a condition $10^{-3}$ Torr by actuating a mechanical booster pump (not shown).

In this respect, the shape, curving shape, and other conditions required for the microwave applicator are stated in Table 7.

When the gas is sufficiently removed, $SiH_4$ 450 sccm, $SiF_4$ 5 sccm, and $H_2$ 100 sccm are introduced through a gas inlet guide (not shown), and the inner pressure of the separation container 300 is maintained at 5 m Torr by adjusting the opening of the throttle valve mounted on the aforesaid hydraulic diffusion pump. When the pressure is stabilized, the microwave having an effective power of 85 kW×2 is emitted into the film deposition chamber from a microwave power source (not shown) having a specified frequency of 2.45 GHz through a pair of applicators 107 and 108 arranged to face each other. Then, immediately, the introduced material gas is converted into plasma to form a plasma region. There is no leakage from the plasma region thus formed to the separation container side through the space between the holding and conveying rollers 102 and 103. Also, no leakage of the microwave is detected.

Then, the holding and conveying rollers 102 and 103 and holding and conveying rings 104 and 105 (no driving mechanism is shown for either of them) are actuated with a control so that the conveying speed of the aforesaid substrate 101 is set at 6 m/min.

Here, $H_2$ gas is flown at 50 sccm in the gas gates 321 and 322 as gate gas from the gate gas inlet guides 316 and 317 and exhausted by the hydraulic diffusion pump (not shown) through the exhaust holes 318 and 318 so as to cause the inner pressure of the gas gates to be controlled at 1 m Torr.

The deposit film is continuously formed in 30 minutes after the conveyance has been started. Here, since a long substrate is used, another formation of the deposit film is performed in succession subsequent to the termination of the present manufacturing example, and when the total deposition is completed, the substrate is cooled and withdrawn. Then, the film thickness distribution of the deposit film formed on the substrate in the present manufacturing example is measured in its width direction and longitudinal direction with the result that it is within 5%, and the deposition speed is 125 Å/sec on the average. Also, obtaining the cut-off portions thereof, the infrared absorption spectrum is measured by a reflection method using FT-IR (Parkin Elmer 1720 X). Then, absorption is recognized for 2,000 cm$^{-1}$ and 630 cm$^{-1}$ with the absorption pattern genuine to the A-Si : H : F film. Further, the film crystallinity is evaluated by RHEED (JEM-100SX: Nippon Denshi), and it is found to be amorphous at halo. Also, the hydrogen content in the film is determined by an analyzer for hydrogen content in metal (EMGA-1100: Horiba Seisakujo) and it is found to be 20±2 atomic %.

MANUFACTURING EXAMPLE 2

Subsequent to the deposit film formation process performed in the manufacturing example 1, the introduction of the material gas used is suspended and the inner pressure of the separation container 300 is vacuumized to a condition $5 \times 10^{-6}$ Torr or less. After that, SiH$_4$ 100 sccm, GeH$_4$ 80 sccm, SiF$_4$ 3 sccm, and H$_2$ 100 sccm are introduced from the gas inlet guide (not shown) to maintain the inner pressure at 10 m Torr, and then an amorphous silicon germanium film is continuously deposited under the same deposit film formation conditions with the exception of the microwave power being set at 0.5 kW×2 with the conveying speed at 30 cm/min.

After the present manufacturing example and another manufacturing example have been terminated, the substrate is cooled and withdrawn. Then, the film thickness distribution of the deposit film formed on the substrate in the present manufacturing example is measured in its width direction and longitudinal direction with the result that it is within 5%, and the deposition speed is 49 Å/sec on the average.

Also, obtaining the cut-off portions thereof, the infrared absorption spectrum is measured by a reflection method using FT-IR (Parkin Elmer 1720 X). Then, absorption is recognized for 2,000 cm$^{-1}$, 1,880 cm$^{-1}$, and 630 cm$^{-1}$ with the absorption pattern genuine to the A-SiGe : H : F film. Further, the film crystallinity is evaluated by RHEED (JEM-100XS: Nippon Denshi), and it is found to be amorphous at halo. Also, the hydrogen content in the film is determined by an analyzer for hydrogen content in metal (EMGA-1100: Horiba Seisakujo) and it is found to be 15±2 atomic %.

MANUFACTURING EXAMPLE 3

Subsequent to the deposit film formation process performed in the manufacturing example 1, the introduction of the material gas used is suspended and the inner pressure of the separation container 300 is vacuumized to a condition $5 \times 10^{-6}$ Torr or less. After that, SiH$_4$ 140 sccm, CH$_4$ 20 sccm, SiF$_4$ 5 sccm, and H$_2$ 300 sccm are introduced from the gas inlet guide (not shown) to maintain the inner pressure at 22 m Torr, and then an amorphous silicon carbide film is continuously deposited under the same deposit film formation conditions with the exception of the microwave power being set at 1.1 kW×2.

After the present manufacturing example and another manufacturing example have been terminated, the substrate is cooled and withdrawn. Then, the film thickness distribution of the deposit film formed on the substrate in the present manufacturing example is measured in its width direction and longitudinal direction with the result that it is within 5%, and the deposition speed is 42 Å/sec on the average.

Also, obtaining the cut-off portions thereof, the infrared absorption spectrum is measured by a reflection method using FT-IR (Parkin Elmer 1720 X). Then, absorption is recognized for 2,080 cm$^{-1}$, 1,250 cm$^{-1}$, 960 cm$^{-1}$, 777 cm$^{-1}$, and 660 cm$^{-1}$ with the absorption pattern genuine to the A-SiC : H : F film. Further, the film crystallinity is evaluated by RHEED (JEM-100SX: Nippon Dennshi), and it is found to be amorphous at halo. Also, the hydrogen content in the film is determined by an analyzer for hydrogen content in metal (EMGA-1100: Horiba seisakujo) and it is found to be 12±2 atomic %.

MANUFACTURING EXAMPLE 4

Subsequent to the deposit film formation process performed in the manufacturing example 1, the introduction of the material gas used is suspended and the inner pressure of the separation container 300 is vacuumized to a condition $5 \times 10^{-6}$ Torr or less. After that, SiH$_4$ 220 sccm, BF$_3$ (3,000 ppm, H$_2$ rare dilution) 40 sccm, SiF$_4$ 25 sccm, and H$_2$ 600 sccm are introduced from the gas inlet guide (not shown) to maintain the inner pressure at 7 m Torr, and then a p type microcrystal silicon film is continuously deposited under the same deposit film formation conditions with the exception of the microwave power being set at 1.2 kW×2.

After the present manufacturing example and another manufacturing example have been terminated, the substrate is cooled and withdrawn. Then, the film thickness distribution of the deposit film formed on the substrate in the present manufacturing example is measured in its width direction and longitudinal direction with the result that it is within 5%, and the deposition speed is 60 Å/sec on the average.

Also, obtaining the cut-off portions thereof, the infrared absorption spectrum is measured by a reflection method using FT-IR (Parkin Elmer 1720X). Then, absorption is recognized for 2,100 cm$^{-1}$, and 630 cm$^{-1}$ with the absorption pattern genuine to the $\mu$C-Si : H : F film. Further, the film crystallinity is evaluated by RHEED (JEM-100SX: Nippon Dennshi), and it is found to be ring type nonorientated polycrystalline. Also, the hydrogen content in the film is determined by an analyzer for hydrogen content in metal (EMGA-1100: Horiba Seisakujo) and it is found to be 4±1 atomic %.

MANUFACTURING EXAMPLE 5

Subsequent to the deposit film formation process performed in the manufacturing example 1, the introduction of the material gas used is suspended and the inner pressure of the separation container 300 is vacuumized to a condition $5 \times 10^{-6}$ Torr or less. After that, SiH$_4$ 320 sccm, PH$_3$ (1% H$_2$ rare dilution) 27 sccm, SiF$_4$ 5 sccm, and H$_2$ 50 sccm are introduced from the gas inlet guide (not shown) to maintain the inner pressure at 8 m Torr, and then an n type amorphous silicon film is continuously deposited under the same deposit film formation conditions with the exception of the microwave power being set at 0.8 kW×2.

After the present manufacturing example and another manufacturing example have been terminated, the substrate is cooled and withdrawn. Then, the film thickness distribution of the deposit film formed on the substrate in the present manufacturing example is measured in its width direction and longitudinal direction with the result that it is within 5%, and the deposition speed is 86 Å/sec on the average.

Also, obtaining the cut-off portions thereof, the infrared absorption spectrum is measured by a reflection method using FT-IR (Parkin Elmer 1720X). Then, absorption is recognized for 2,000 cm$^{-1}$, and 630 cm$^{-1}$ with the absorption pattern genuine to the A-Si : H : film. Further, the film crystallinity is evaluated by RHEED (JEM-100SX: Nippon Denshi), and it is found to be amorphous at halo. Also, the hydrogen content in the film is determined by an analyzer for hydrogen content in metal (EMGA-1100: Horiba Seisakujo) and it is found to be 22±2 atomic %.

MANUFACTURING EXAMPLE 6

In the manufacturing example 1, using a PET (polyethelen terephthalate) strip type substrate (45 cm wide×100 m long×0.9 mm thick) instead of the SUS 430 BA strip type substrate, an amorphous silicon film is continuously deposited exactly by the same operation except the surface temperature of the substrate which is set at 210° C.

After cooling, the substrate is withdrawn, and the thickness distribution is first measured in the width direction and longitudinal direction. Then it is found to be within 5%. The deposition speed is 120 Å/sec on the average. Also, obtaining the cut-off portion thereof, the infrared absorption spectrum is measured by a reference transmitting method using FT-IR (Parkin Elmer 1720X) with the result that the absorption is recognized for 2,000 cm$^{-1}$ and 630 cm$^{-1}$. The absorption pattern is found to be genuine to the A-Si : H : F film. Also, from the absorption assigned to the Si-H in the vicinity of 2,000 cm$^{-1}$, hydrogen content in the film is determined. Then, it is found to be 25±2 atomic %.

Further, the crystallinity is evaluated by RHEED (JEM-100SX: Nippon Denshi) and it is found to be amorphous at halo.

Also, portions at 20 other locations are cut off at random, and on each of them, an Al comb type gap electrode (250 μm wide and 5 mm long) is deposited by a resistive thermal deposition method. Then, the photoelectric current value under an irradiation of Am-1 light (100 mw/cm$^2$) and dark current value in the darkness are measured using HP 4140B to obtain the bright conductance $\sigma_P$ (S/cm) and dark conductance $\sigma_d$ (S/cm). As a result, these are respectively within the range of $(5.0\pm0.5)\times10^{-5}$ S/cm and $(1.5\pm0.5)\times10^{-11}$ S/cm.

MANUFACTURING EXAMPLE 7

Figure 7:
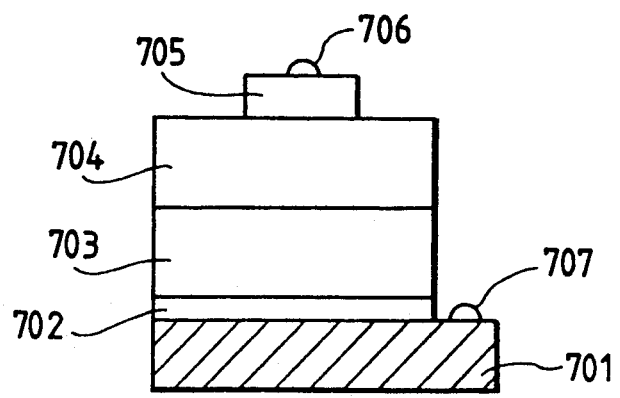
FIG. 7 is a schematic view illustrating a Schottky junction type diode fabricated by the use of the present invention.

In the present manufacturing example, a Schottky junction type diode having the layer structure illustrated by a cross-sectional schematic view shown in FIG. 7 is fabricated using the apparatus shown in FIG. 3.

Here, a reference numeral 701 designates a substrate; 702, a lower electrode; 703, an n+ type semiconductor layer; 704, non-doped semiconductor layer; 705, metal layers; and 706 and 707, terminals for drawing current.

At first, the SUS 430 BA substrate 101 which is the same type as used in the manufacturing example 1 is set in a continuous sputtering apparatus to deposit a 1,300 Å Cr thin film for the formation of the lower electrode 702 using a Cr (99.98%) electrode as target.

Subsequently, the aforesaid strip type member is set in the feeding bobbin 303 in the vacuum container 301 of the continuous deposit film formation apparatus illustrated in FIG. 3 shown in the apparatus example 7, and the leading end thereof is wound around the winding bobbin 304 in the vacuum container 302 through the separation container 300 in such a manner where the face on which the Cr thin film is deposited is placed towards the lower side. Then, a tensioning adjustment is made to remove any sagging.

In this respect, the curving shape and other conditions of the substrate in the present manufacturing example are made the same as those shown in Table 7.

After that, the rough and high vacuumings are performed as in the manufacturing example 1 through the exhaust guides 309, 310, and 311 of the respective vacuum containers using exhaust pumps (not shown). At this juncture, the surface temperature of the strip type member is controlled by the temperature control mechanisms 106a and 106b to be 250° C.

When the gas is sufficiently removed, SiH$_4$ 300 sccm, SiF$_4$ 4 sccm, PH$_3$/H$_3$ (1% H$_2$ rare dilution) 55 sccm, and H$_2$ 40 sccm are introduced from the gas inlet guide (not shown) to maintain the inner pressure of the separation container 300 at 8 m Torr by adjusting the opening of the throttle valve 709. When the pressure is stabilized, the microwave of 0.8 kW×2 from the microwave power source (not shown) is immediately emitted from the pair of microwave applicators 107 and 108. Then, at the same that the plasma is generated, the conveyance of the strip type member is started, and the deposition operation is performed for five minutes while conveying it from the left side to the right side in FIG. 3 at a conveyance speed of 60 cm/min. Hence, an n+ A-Si : H : film is formed as the n+ semiconductor layer 703 on the lower electrode 702.

Here, H$_2$ 50 sccm is flown during this period in the gas gates 321 and 322 as gate gas and exhausted from the exhaust hole 318 by the exhaust pump (not shown) to control the inner pressure of the gas gates to be 1.5 m Torr.

The supply of the microwave and the introduction of the material gas are suspended. Also, when the conveyance of the strip type member is stopped, the inner pressure of the separation container 300 is vacuumized to condition 5×10$^{-6}$ or less. Then, SiH$_4$ 320 sccm, SiF$_4$ 6 sccm, and H$_2$ 60 sccm are again introduced from the gas inlet guides and the inner pressure of the separation container 300 is maintained at 6 m Torr by adjusting the opening of the throttle valve 309. When the pressure is stabilized, the microwave of 0.7 kW×2 from the microwave power source (not shown) is immediately emitted from the pair of microwave applicators 107 and 108. Then, at the same that the plasma is generated, the conveyance of the strip type member is started, and the deposition operation is performed for 5.5 minutes while conveying it from the left side to the right side in FIG. 3 at a conveyance speed of 60 cm/min. Hence, an A-Si : H : F film which serves as the non-doped semiconductor layer 704 is formed by deposition on the n+ A-Si: H : F film.

After all the deposition operations are terminated, the supply of the microwave and the supply of the material gas are suspended. The conveyance of the substrate is also stopped. Then, remaining gas in the separation container 300 is sufficiently evacuated, and the substrate is drawn after cooling.

Permalloy masks of $\phi$ 5 mm are tightly placed on 10 locations of the aforesaid substrate at random, and an Au thin film is deposited as the metal layer 705 by the electron beam deposition method for 80 Å. Subsequently, the terminals 706 and 707 for drawing current are bonded by a wire bonder to evaluate the diode characteristic using HP 4140B.

As a result, an excellent diode characteristic is observed with a rectifying ratio of approximately six digits at the diode factor $n = 1.2 \pm 0.05, \pm 1$ V.

MANUFACTURING EXAMPLE 8

In the present manufacturing example, a pin type photovoltaic element having the layer structure illustrated by a cross-sectional schematic view shown in FIG. 8A is fabricated using an apparatus shown in FIG. 4.

The aforesaid photovoltaic element is a photovoltaic element 800 formed by depositing sequentially on a substrate 801, a lower electrode 802, n type semiconductor layer 803, i type semiconductor layer 804, p type semiconductor layer 805, transference electrode 806 and collecting electrode 807. In this respect, it is assumed that the incident light is given to this photovoltaic element from the transference electrode 806 side.

At first, the PET strip type substrate which is the same type as used in the manufacturing example 6 is set in a continuous sputtering apparatus to deposit a 1,000 Å Ag thin film using a Ag (99.99%) electrode as target, and also, in continuation, deposit a ZnO thin film of 1.2 $\mu$m using ZnO (99.999%) electrode as target for the formation of the lower electrode 802.

Subsequently, the strip type substrate for which the aforesaid lower electrode 802 has been formed is set in the continuous deposit film formation apparatus shown in FIG. 4 for the same contents as in the manufacturing example 7. The curving shape of the substrate and dielectric sheet conveyance condition and others in the separation container 300 at that time are shown in Table 8.

Also, in the separate containers 300-a and 300-b, the formation of an n type A-Si : H : F film and p+ type $\mu$c-Si : H : F film is performed under the deposit film formation conditions shown in Table 9.

At first, in each of the film deposition chambers, the microwave plasma is generated, and when the discharging and others are stabilized, the strip type member 101 is conveyed from the left side to the right side in FIG. 4 at a conveying speed of 55 cm/min to form n, i, and p type semiconductor layers continuously by deposition.

Subsequent to the deposit formation of the semiconductor layers over the total length of the strip type member 101, this member is drawn after cooling, and also, a solar cell module of 35 cm $\times$ 70 cm is continuously fabricated by a continuous module making apparatus.

The characteristic evaluation for the solar cell module thus fabricated is conducted under the irradiation of AM 1.5 (100 mW/cm$^2$) light. The result is that the photoelectric conversion efficiency of 8.3% or more is obtained while the characteristic irregularity between the modules is within 5%.

Also, the changing ratio to the initial value is measured for the photoelectric conversion efficiency after a 500-hour continuous irradiation of AM 1.5 (100 mW/cm$^2$) light and is found to be within 10%.

With these modules being connected, an electric power supply system of 3 kW can be constructed

MANUFACTURING EXAMPLE 9

In the present manufacturing example, there is shown an example in which an A-SiGe : H : F film is used for the pin type photovoltaic element fabricated in the manufacturing example 8 instead of the A-Si : H : film which serves as an i type semiconductor layer.

The formation of the A-SiGe : H : F film is performed in the same operation and method employed for the manufacturing example 2 with the exception of the conveying speed being 52 cm/min and the surface temperature of the strip type member being 200° C., and the formation processes of other semiconductor layers and module making are executed in the same operation and method employed for the manufacturing example 8 for the fabrication of solar cell modules.

The characteristic evaluation for the solar cell modules thus fabricated is made under the irradiation of AM 1.5 (70 mW/cm$^2$) light. The result is that the photoelectric conversion efficiency of 7.3% or more is obtained while the characteristic irregularity between the modules is within 5%.

Also, the changing ratio to the initial value is measured for the photoelectric conversion efficiency after a 500-hour continuous irradiation of Am 1.5 (100 mW/cm$^2$) light and is found to be within 10%. With these modules being connected, an electric power supply system of 3 kW can be constructed.

MANUFACTURING EXAMPLE 10

In the present manufacturing example, there is shown an example in which an A-SiC : H : F film is used for the pin type photovoltaic element fabricated in the manufacturing example 8 instead of the A-Si : H : F film which serves as an i type semiconductor layer.

The formation of the A-SiC : H : F film is performed in the same operation and method employed for the manufacturing example 3 with the exception of the conveying speed being 50 cm/min and the surface temperature of the strip type member being 200° C., and the formation processes of other semiconductor layers and module making are executed in the same operation and method employed for the manufacturing example 8 for the fabrication of solar cell modules.

The characteristic evaluation for the solar cell modules thus fabricated is made under the irradiation of AM 1.5 (100 mW/cm$^2$) light. The result is that the photoelectric conversion efficiency of 6.6% or more is obtained while the characteristic irregularity between the modules is within 5%.

Also, the changing ratio to the initial value is measured for the photoelectric conversion efficiency after a 500-hour continuous irradiation of AM 1.5 (100 mW/cm$^2$) light and is found to be within 10%.

With these modules being connected, an electric power supply system of 3 kW can be constructed.

MANUFACTURING EXAMPLE 11

In the present manufacturing example, a photovoltaic element having the layer structure shown in FIG. 8C is fabricated. In the fabrication thereof, there is employed an apparatus (not shown) in which separation containers 300-a', 300', and 300-b' having the same structures as the separation containers 300-a, 300, and 300-b in the apparatus shown in FIG. 8 are thus connected in sequence through gas gates.

In this respect, the strip type member of the same material as used and processed in the manufacturing example 1 is employed and its lower cell has the same layer structure as in the manufacturing example 9 while its upper cell has the same layer structure as in the manufacturing example 8. The deposit film formation conditions for each of the semiconductor layers are shown in Table 10. The module making process is performed in the same operation and method as in the manufacturing example 8 for the fabrication of the solar cell modules.

The characteristic evaluation for the solar cell modules thus fabricated is made under the irradiation of AM 1.5 (100 mW/cm$^2$) light. The result is that the photoelectric conversion efficiency of 10.3% or more is obtained while the characteristic irregularity between the modules is within 5%.

Also, the changing ratio to the initial value is measured for the photoelectric conversion efficiency after a 500-hour continuous irradiation of AM 1.5 (100 mW/cm$^2$) light and is found to be within 9%.

With these modules being connected, an electric power supply system of 3 kW can be constructed.

MANUFACTURING EXAMPLE 12

In the present manufacturing example, a photovoltaic element having the layer structure shown in FIG. 8C is fabricated. In the fabrication thereof, there is employed an apparatus (not shown) in which separation containers 300-$a'$, 300' and 300-$b'$ having the same structures as the separation containers 300-$a$, 300, and 300-$b$ in the apparatus shown in FIG. 4 are thus connected in sequence through gas gates.

In this respect, the strip type member of the same material as used and processed in the manufacturing example 1 is employed and its lower cell has the same layer structure as in the manufacturing example 8 while its upper cell has the same layer structure as in the manufacturing example 10. The deposit film formation conditions for each of the semiconductor layers are shown in Table 11. The module making process is performed in the same operation and method as in the manufacturing example 8 for the fabrication of the solar cell modules.

The characteristic evaluation for the solar cell modules thus fabricated is made under the irradiation of AM 1.5 (100 mW/cm$^2$) light. The result is that the photoelectric conversion efficiency of 10.2% or more is obtained while the characteristic irregularity between the modules is within 5%.

Also, the changing ratio to the initial value is measured for the photoelectric conversion efficiency after a 500-hour continuous irradiation of AM 1.5 (100 mW/cm$^2$) light and is found to be within 9%.

With these modules being connected, an electric power supply system of 3 kW can be constructed.

MANUFACTURING EXAMPLE 13

In the present manufacturing example, a photovoltaic element having the layer structure shown in FIG. 8D is fabricated. In the fabrication thereof, there is employed an apparatus (not shown) in which separation containers 300-$a'$, 300', and 300-$b'$ having the same structures as the separation containers 300-$a$, 300, and 300-$b$ in the apparatus shown in FIG. 4 are thus connected in sequence through gas gates.

In this respect, the strip type member of the same material as used and processed in the manufacturing example 1 is employed and its lower cell has the same layer structure as in the manufacturing example 9, intermediate cell has the same layer structure as in the manufacturing example 8, and upper cell has the same layer structure as in the manufacturing example 10. The deposit film formation conditions for each of the semiconductor layers are shown in Table 12. The module making process is performed in the same operation and method as in the manufacturing example 8 for the fabrication of the solar cell modules.

The characteristic evaluation for the solar cell modules thus fabricated is made under the irradiation of AM 1.5 (100 mW/cm$^2$) light. The result is that the photoelectric conversion efficiency of 10.4% or more is obtained while the characteristic irregularity between the modules is within 5%.

Also, the changing ratio to the initial value is measured for the photoelectric conversion efficiency after a 500-hour continuous irradiation of AM 1.5 (100 mW/cm$^2$) light and is found to be within 8.5%.

With these modules being connected, an electric power supply system of 3 kW can be constructed.

MANUFACTURING EXAMPLES 14 THROUGH 19

In the present manufacturing examples, the process to replace the aforesaid strip type member with a new strip type member in the manufacturing examples 8 through 13 is executed and at the same time, the microwave transmittable members are replaced in the processes given below.

At first, the introduction of the materials gas such as SiH$_4$, H$_2$, and SiF$_4$ to the film deposition chamber 116 is suspended. Then the film deposition chamber is vacuumized to a condition $5 \times 10^{-6}$ or less by the hydraulic diffusion pump and after Ar is introduced into the film deposition chamber 116, it is sealed at a pressure 1.0 Torr.

At the same time, the auxiliary chamber 1101 is vacuumized to a condition $5 \times 10^{-6}$ Torr or less by a turbo molecular pump (not shown) using a mechanical booster pump and a rotary pump as its back-up for the auxiliary chamber. Then, Ar is introduced and sealed at a pressure 1.0 Torr.

Subsequently, the microwave applicator 1104 including the microwave transmittable member 1103 is transferred to the auxiliary chamber 1101 (from a position B to a position B'). Then, the gate valve 1113 is closed to separate the auxiliary chamber 1101 and film deposition chamber 116 airtightly.

After that, the film deposition chamber 116 is exhausted while Ar is being introduced, and Ar is also introduced to the auxiliary chamber 1101 to make its inside pressure atmospheric. Then, the opening and closing section (not shown) is opened to replace the microwave transmittable member 1103 to which the deposit film has adhered with a new one or a member which is prepared by water cleaning and drying after the deposit film having adhered thereto is removed by wet etching.

Subsequently, after the auxiliary chamber 1101 has been vaccumized to a condition 10 m Torr or less, Ar is introduced and sealed at a pressure 10 Torr, and then vacuumized again to a condition 10 m Torr or less. Thereafter, the introduction process of Ar and exhaust process of Ar (Ar purge) are repeated for four times or more.

Then, the auxiliary chamber 1101 is vaccumized to a condition $5\times10^{-6}$ Torr or less by the aforesaid turbo molecular pump, and by the same processes as before, Ar is sealed into the auxiliary chamber 1101 and film deposition chamber 116. Thus, the gate valve 113 is opened to transfer the microwave applicator 1104 from the position B' in the auxiliary chamber to the position B in the film deposition chamber.

After that, both the auxiliary chamber and film deposition chamber are vacuumized to a condition $5\times10^{-6}$ Torr or less. Then, after $H_2$ is introduced into the film deposition chamber to a condition 1 Torr, the film deposition chamber is vaccumized again to a condition $5\times10^{-6}$ Torr or less. Thus, the gas is sufficiently removed, and when the replacing process of the strip type members is completed, the deposit film formation material gas is again introduced to resume the deposit film formation.

In this respect, the replacement of the microwave transmittable members in each of the film deposition chambers where the semiconductor layers are deposited is conducted simultaneously.

The time required for the above-mentioned microwave transmittable member replacement is approximately one hour, and the characteristic degradation of the solar cell fabricated after the resumption of the deposit film formation is rarely observed.

MANUFACTURING EXAMPLES 20 THROUGH 25

A deposit film is continuously formed in the same processes as in the manufacturing examples 14 through 19 with the exception of the dry etching by etching gas in the auxiliary chamber 1101, which is performed with respect to the deposit film having adhered to the microwave transmittable member, instead of the replacement of the microwave transmittable members therein.

TABLE 1

| | |
|---|---|
| Kinds of material gas and flow rate | $SiH_4$: 380 sccm<br>$H_2$: 70 sccm |
| Microwave frequency and power | 2.45 GHz<br>750 W × 2 |
| Space L | 3.2 cm |
| Inner diameter and width of curving shape | φ 20 cm, 45 cm |
| Inner pressure of film deposition chamber | 6 m Torr |
| Kinds of strip type member and thickness | SUS 430 BA<br>0.25 mm |
| Dimension of microwave applicator (inner diameter × length) | φ 98 mm × 150 mm |
| Microwave transmission waveguide | EIAJ, WRI-26 |

TABLE 2

| $\theta_1(°)$ | $\theta_2(°)$ | $\theta_1 + \theta_2(°)$ | Evaluation |
|---|---|---|---|
| 0 | 0 | 0 | Microwave leakage great; Discharging unstable; Source noise great (Abnormal oscillation) |
| 0 | 45 | 45 | Microwave leakage great; discharging unstable |
| 0 | 90 | 90 | Microwave leakage great; discharging unstable |
| 15 | 15 | 30 | Microwave leakage moderate; discharging unstable |
| 15 | 45 | 60 | Microwave leakage small; discharging unstable |
| 15 | 75 | 90 | Microwave leakage small; discharging unstable |
| 15 | 135 | 150 | Microwave leakage small; discharging unstable |
| 15 | 165 | 180 | Microwave leakage moderate; discharging great (abnormal oscillation) |
| 30 | 30 | 60 | Microwave leakage non; discharging stable |
| 30 | 60 | 90 | Microwave leakage non; discharging stable |
| 30 | 105 | 135 | Microwave leakage non; discharging stable |
| 30 | 150 | 180 | Microwave leakage non; discharging unstable; source noise great (abnormal oscillation) |
| 45 | 45 | 90 | Microwave leakage non; discharging stable |
| 45 | 90 | 135 | Microwave leakage non; discharging stable |
| 45 | 105 | 150 | Microwave leakage non; discharging stable |
| 45 | 135 | 180 | Microwave leakage non; discharging unstable; source noise great (abnormal oscillation) |
| 60 | 60 | 120 | Microwave leakage non; discharging stable |
| 60 | 75 | 135 | Microwave leakage non; discharging stable |
| 60 | 90 | 150 | Microwave leakage non; discharging stable |
| 60 | 120 | 180 | Microwave leakage non; discharging unstable; source noise great (abnormal oscillation) |
| 75 | 75 | 150 | Microwave leakage non; discharging stable |
| 75 | 90 | 165 | Microwave leakage non; discharging slightly unstable |
| 75 | 105 | 180 | Microwave leakage non; discharging unstable; source noise great (abnormal oscillation) |
| 90 | 90 | 180 | Microwave leakage non; discharging unstable; source noise great (abnormal oscillation) |

TABLE 3

| Specimen No. | Space L (cm) | Film deposition chamber pressure (m Torr) | Discharging state | Film thickness distribution (Width direction) (%) | Film thickness distribution (Longitudinal direction) (%) |
|---|---|---|---|---|---|
| 1 | 0.4 | 65 | Discharge is concentrated in the vicinity of the microwave applicator | 1000* | 100* |
| 2 | 0.8 | 28 | Discharge is deviated to the vicinity of the microwave applicator | 25 | 12 |
| 3 | 1.5 | 12 | Discharging is stable | 8 | 7 |
| 4 | 3.5 | 6 | " | 5 | 5 |

TABLE 3-continued

| Specimen No. | Space L (cm) | Film deposition chamber pressure (m Torr) | Discharging state | Film thickness distribution (Width direction) (%) | Film thickness distribution (Longitudinal direction) (%) |
|---|---|---|---|---|---|
| 5 | 5.0 | 4 | " | 7 | 5 |
| 6 | 7.2 | 2 | Discharging is unstable (microwave leakage is moderate) | 30 | 7 |
| 7 | 10.0 | 12 | Discharging is not generated (microwave leakage is great) | — | — |

*Almost no film is formed in the width direction and central portion of the strip type member.

TABLE 4

| Specimen No. | Inner diameter of curving shape (cm) | Discharging state | Film thickness distribution (width direction) (%) | Film thickness distribution (longitudinal direction) (%) |
|---|---|---|---|---|
| 8 | 5.5 | Discharge is not generated | — | — |
| 9 | 7 | Discharging is unstable | 20 | 12 |
| 10 | 10 | Discharging is unstable | 10 | 7 |
| 11 | 20 | " | 5 | 5 |
| 12 | 25 | " | 5 | 5 |
| 13 | 35 | Discharging is slightly unstable | 12 | 7 |
| 14 | 45 | Discharging is unstable | 25 | 12 |

TABLE 5

| Film deposition chamber pressure (m Torr) | Material gas flow rate (sccm) | Microwave power (kW) | Discharging state |
|---|---|---|---|
| 1.5 | SiH$_4$: 100 | 3.0 × 2 | ○ |
| 1.5 | SiH$_4$: 100 H$_2$: 100 | " | △ |
| 3 | SiH$_4$: 100 H$_2$: 50 | 2.5 × 2 | ○ |
| 3 | SiH$_4$: 100 H$_2$: 100 | " | △ |
| 5 | SiH$_4$: 10 H$_2$: 200 | 1.2 × 2 | ○ |
| 5 | SiH$_4$: 300 H$_2$: 100 | 0.8 × 2 | ⊙ |
| 5 | SiH$_4$: 300 H$_2$: 400 | 0.7 × 2 | ○ |
| 5 | SiH$_4$: 400 | 0.4 × 2 | ⊙ |
| 10 | SiH$_4$: 10 H$_2$: 300 | 1.0 × 2 | ○ |
| 10 | SiH$_4$: 300 H$_2$: 600 | " | ⊙ |
| 10 | SiH$_4$: 400 | 0.3 × 2 | ⊙ |
| 10 | SiH$_4$: 10 H$_2$: 800 | 1.0 × 2 | △ |
| 30 | SiH$_4$: 10 | 0.25 × 2 | ⊙ |
| 30 | SiH$_4$: 10 H$_2$: 300 | 0.7 × 2 | ○ |
| 30 | SiH$_4$: 300 H$_2$: 300 | 0.6 × 2 | ⊙ |
| 30 | SiH$_4$: 300 H$_2$: 900 | 0.8 × 2 | ○ |

TABLE 6

| Specimen No. | Width of strip type member (cm) | Discharging state | Film thickness distribution (width direction) (%) | Film thickness distribution (longitudinal direction) (%) |
|---|---|---|---|---|
| 15 | 5 | Discharging is stable | 3 | 5 |
| 16 | 10 | " | 5 | 7 |
| 17 | 25 | Discharging is slightly unstable | 8 | 7 |
| 18 | 35 | Discharging is stable | 5 | 5 |
| 19 | 45 | " | 5 | 5 |
| 20 | 60 | Discharging is slightly unstable | 10 | 7 |
| 21 | 70 | Discharging is unstable | 15 | 10 |

TABLE 7

| | |
|---|---|
| Inner diameter of curving shape | φ 20 cm |
| Space L | 3.2 cm |
| Dimension of microwave applicator (inner diameter × length) | φ 98 mm × 135 mm |
| Microwave transmission waveguide | EIAJ, WRI-32 |

TABLE 8

| Parameter | Separation container 300 |
|---|---|
| Deposit film formation material gas (sccm) | SiH$_4$ 240 H$_2$ 80 SiF$_4$ 8 |
| Pressure (m Torr) | 6 |
| Microwave power (kW) | 0.65 × 2 |
| Inner diameter of curring shape (cm) | φ 20 |
| Space L (cm) | 3.2 |
| Dimension of microwave applicator (inner diameter × length) | φ 98 mm × 135 mm |
| Microwave transmission waveguide | EIAJ, WRI-26 |
| Surface temperature of strip type member (°C.) | 210 |

TABLE 9

| Parameter | Separation container 300-a | | 300-b | |
|---|---|---|---|---|
| Deposit film formation material gas (sccm) | SiH$_4$ | 30 | SiH$_4$ | 25 |
| | H$_2$ | 100 | H$_2$ | 250 |
| | PH$_3$/H$_2$ (1% H$_2$ rare dilution) | 5 | B$_2$H$_6$/H$_2$ (3000 ppmH$_2$ rare dilution) | 20 |
| | SiF$_4$ | 3 | SiF$_4$ | 3 |
| Pressure (mTorr) | 9 | | 8 | |
| Microwave power (kW) | 0.65 × 2 | | 0.75 × 2 | |
| Inner diameter of curving shape (cm) | φ 10*) | | φ 9*) | |
| Space L (cm) | 1.0 | | 1.0 | |
| Dimension of microwave applicator (inner diameter × length) | φ 95 mm × 125 mm | | φ 85 mm × 120 mm | |
| Microwave transmission waveguide | EIAJ, WRI-26 | | EIAJ, WRI-26 | |
| Surface temperature of strip type member (°C.) | 210 | | 200 | |

*)Film thickness fine adjustment substrate cover is inserted into the curving shape

TABLE 10

| Parameter | Semiconductor layer Lower cell 300-a | | 300 | | 300-b | |
|---|---|---|---|---|---|---|
| Deposit film formation material gas (sccm) | SiH$_4$ | 30 | SiH$_4$ | 120 | SiH$_4$ | 25 |
| | H$_2$ | 100 | GeH$_4$ | 95 | H$_2$ | 250 |
| | PH$_3$/H$_2$ (1% H$_2$ rare dilution) | 5 | H$_2$ | 120 | BF$_3$/H$_2$ (3000 ppmH$_2$ rare dilution) | 20 |
| | | | SiF$_4$ | 5 | | |
| | SiF$_4$ | 3 | | | SiF$_4$ | 3 |
| Pressure (mTorr) | 9 | | 10 | | 8 | |
| Microwave power (kW) | 0.65 × 2 | | 0.6 × 2 | | 0.75 × 2 | |
| Inner diameter of curving shape (cm) | φ 10*) | | φ 20 | | φ 9*) | |
| Space L (cm) | 1.0 | | 3.2 | | 1.0 | |
| Dimension of microwave applicator (inner diameter × length) | φ 95 mm × 125 mm | | φ 98 mm × 135 mm | | φ 85 mm × 120 mm | |
| Microwave transmission waveguide | EIAJ, WRI-26 | | The same as the left side | | The same as the left side | |
| Surface temperature strip type member (°C.) | 260 | | 250 | | 240 | |
| Conveying speed | 55 cm/min | | | | | |

| Parameter | Semiconductor layer Upper cell 300-a' | | 300' | | 300-b' | |
|---|---|---|---|---|---|---|
| Deposit film formation material gas (sccm) | SiH$_4$ | 28 | SiH$_4$ | 220 | SiH$_4$ | 22 |
| | H$_2$ | 95 | H$_2$ | 70 | H$_2$ | 220 |
| | PH$_3$/H$_2$ (1% H$_2$ rare dilution) | 5 | SiF$_4$ | 7 | BF$_3$/H$_2$ (3000 ppmH$_2$ rare dilution) | 18 |
| | SiF$_4$ | 3 | | | SiF$_4$ | 2 |
| Pressure (mTorr) | 9 | | 6 | | 8 | |
| Microwave power (kW) | 0.65 × 2 | | 0.65 × 2 | | 0.75 × 2 | |
| Inner diameter of curving shape (cm) | 10*) | | φ 20 | | φ 9*) | |
| Space L (cm) | 1.0 | | 3.2 | | 1.0 | |
| Dimension of microwave applicator (inner diameter × length) | The same as 300-a | | The same as 300 | | The same as 300-b | |
| Microwave transmission waveguide | The same as the left side | | The same as the left side | | The same as the left side | |
| Surface temperature strip type member (°C.) | 240 | | 230 | | 230 | |
| Conveying speed | 55 cm/min | | | | | |

*)Film thickness fine adjustment substrate cover is inserted into the curving shape.

TABLE 11

| Parameter | Semiconductor layer Lower cell | | | | | |
|---|---|---|---|---|---|---|
| | 300-a | | 300 | | 300-b | |
| Deposit film formation material gas (sccm) | $SiH_4$ | 30 | $SiH_4$ | 260 | $SiH_4$ | 25 |
| | $H_2$ | 100 | $H_2$ | 100 | $H_2$ | 250 |
| | $PH_3/H_2$ (1% $H_2$ rare dilution) | 5 | $SiF_4$ | 10 | $BF_3/H_2$ (3000 ppm$H_2$ rare dilution) | 20 |
| | $SiF_4$ | 3 | | | $SiF_4$ | 3 |
| Pressure (mTorr) | 9 | | 6 | | 8 | |
| Microwave power (kW) | 0.65 × 2 | | 0.70 × 2 | | 0.75 × 2 | |
| Inner diameter of curving shape (cm) | φ 10*) | | φ 20 | | φ 9*) | |
| Space L (cm) | 1.0 | | 3.2 | | 1.0 | |
| Dimension of microwave applicator (inner diameter × length) | φ 95 mm × 125 mm | | φ 98 mm × 135 mm | | φ 85 mm × 120 mm | |
| Microwave transmission waveguide | EIAJ, WRI-26 | | The same as the left side | | The same as the left side | |
| Surface temperature of strip type member (°C.) | 270 | | 260 | | 260 | |
| Conveying speed | 52 cm/min | | | | | |

| Parameter | Semiconductor layer Upper cell | | | | | |
|---|---|---|---|---|---|---|
| | 300-a' | | 300' | | 300-b' | |
| Deposit film formation material gas (sccm) | $SiH_4$ | 28 | $SiH_4$ | 180 | $SiH_4$ | 22 |
| | $H_2$ | 95 | $CH_4$ | 25 | $H_2$ | 220 |
| | $PH_3/H_2$ (1% $H_2$ rare dilution) | 5 | $H_2$ | 400 | $BF_3/H_2$ (3000 ppm$H_2$ rare dilution) | 18 |
| | $SiF_4$ | 3 | $SiF_4$ | 10 | $SiF_4$ | 2 |
| Pressure (mTorr) | 9 | | 23 | | 8 | |
| Microwave power (kW) | 0.65 × 2 | | 1.3 × 2 | | 0.75 × 2 | |
| Inner diameter of curving shape (cm) | 10*) | | φ 20 | | φ 9*) | |
| Space L (cm) | 1.0 | | 3.2 | | 1.0 | |
| Dimension of microwave applicator (inner diameter × length) | The same as 300-a | | The same as 300 | | The same as 300-b | |
| Microwave transmission waveguide | The same as the left side | | The same as the left side | | The same as the left side | |
| Surface temperature of strip type member (°C.) | 250 | | 250 | | 240 | |
| Conveying speed | 52 cm/min | | | | | |

*)Film thickness fine adjustment substrate cover is inserted into the curving shape

TABLE 12

| Parameter | Semiconductor layer Lower cell | | | | | |
|---|---|---|---|---|---|---|
| | 300-a | | 300 | | 300-b | |
| Deposit film formation material gas (sccm) | $SiH_4$ | 30 | $SiH_4$ | 130 | $SiH_4$ | 25 |
| | $H_2$ | 100 | $GeH_4$ | 100 | $H_2$ | 250 |
| | $PH_3/H_2$ (1% $H_2$ rare dilution) | 5 | $H_2$ | 150 | $BF_3/H_2$ (3000 ppm$H_2$ rare dilution) | 20 |
| | $SiF_4$ | 3 | $SiF_4$ | 5 | $SiF_4$ | 3 |
| Pressure (mTorr) | 9 | | 11 | | 8 | |
| Microwave power (kW) | 0.65 × 2 | | 0.65 × 2 | | 0.75 × 2 | |
| Inner diameter of curving shape (cm) | φ 10*) | | φ 22 | | φ 9*) | |
| Space L (cm) | 1.0 | | 3.2 | | 1.2 | |
| Dimension of microwave applicator (inner diameter × length) | φ 95 mm × 125 mm | | φ 98 mm × 135 mm | | φ 85 mm × 120 mm | |
| Microwave transmission waveguide | EIAJ, WRI-26 | | EIAJ, ERI-32 | | EIAJ, WRI-26 | |
| Surface temperature of strip type member (°C.) | 280 | | 280 | | 270 | |
| Conveying speed | 54 cm/min | | | | | |

Semiconductor

TABLE 12-continued

| Parameter | Semiconductor layer Intermediate cell | | | | | |
|---|---|---|---|---|---|---|
| | 300-a' | | 300' | | 300-b' | |
| Deposit film formation material gas (sccm) | SiH$_4$<br>H$_2$<br>PH$_3$/H$_2$<br>(1% H$_2$ rare dilution)<br>SiF$_4$ | 28<br>95<br>5<br><br><br>3 | SiH$_4$<br>H$_2$<br>SiF$_4$ | 250<br>90<br>8 | SiH$_4$<br>H$_2$<br>BF$_3$/H$_2$<br>(3000 ppmH$_2$ rare dilution)<br>SiF$_4$ | 22<br>220<br>18<br><br><br>2 |
| Pressure (mTorr) | 8 | | 7 | | 8 | |
| Microwave power (kW) | 0.65 × 2 | | 0.70 × 2 | | 0.75 × 2 | |
| Inner diameter of curving shape (cm) | φ 10*) | | φ 20 | | φ 9*) | |
| Space L (cm) | 1.0 | | 3.5 | | 1.0 | |
| Dimension of microwave applicator (inner diameter × length) | The same as 300-a | | The same as 300 | | The same as 300-b | |
| Microwave transmission waveguide | The same as the left side | | EIAJ, ERI-32 | | EIAJ, WRI-26 | |
| Surface temperature of strip type member (°C.) | 270 | | 260 | | 260 | |
| Conveying speed | 54 cm/min | | | | | |

| Parameter | Semiconductor layer Upper cell | | | | | |
|---|---|---|---|---|---|---|
| | 300-a'' | | 300'' | | 300-b'' | |
| Deposit film formation material gas (sccm) | SiH$_4$<br>H$_2$<br>PH$_3$/H$_2$<br>(1% H$_2$ rare dilution)<br>SiF$_4$ | 26<br>90<br>4<br><br><br>3 | SiH$_4$<br>CH$_4$<br>H$_2$<br>SiF$_4$ | 185<br>27<br>400<br>10 | SiH$_4$<br>H$_2$<br>BF$_3$/H$_2$<br>(3000 ppmH$_2$ rare dilution)<br>SiF$_4$ | 20<br>200<br>16<br><br><br>2 |
| Pressure (mTorr) | 8 | | 22 | | 7 | |
| Microwave power (kW) | 0.65 × 2 | | 1.3 × 2 | | 0.70 × 2 | |
| Inner diameter of curving shape (cm) | φ 10*) | | φ 18 | | φ 9*) | |
| Space L (cm) | 1.0 | | 3.2 | | 1.2 | |
| Dimension of microwave applicator (inner diameter × length) | The same as 300-a | | The same as 300 | | The same as 300-b | |
| Microwave transmission waveguide | The same as the left side | | The same as the left side | | The same as the left side | |
| Surface temperature of strip type member (°C.) | 250 | | 250 | | 240 | |
| Conveying speed | 54 cm/min | | | | | |

*)Film thickness fine adjustment substrate cover is inserted into the curving shape

What is claimed is:

1. An apparatus for continuously forming a large area functional deposit film comprising:

a column-shaped film deposition chamber capable of maintaining its inside essentially in vacuum, which is formed by a strip type member as the side walls thereof through curving portion formation means for enabling said strip type member to be continuously conveyed in its longitudinal direction to form the curving portion;

microwave applicator means for emitting microwave energy in the direction parallel to the progressing direction of the microwave energy to cause microwave plasma to be generated in said film deposition chamber;

exhausting means for exhausting said film deposition chamber;

means for introducing deposit film formation material gas into said film deposition chamber; and temperature controlling means for heating and/or cooling said strip type member, and forming a deposit film continuously by deposition on the surface of said strip type member on the side which is exposed to said microwave plasma, wherein said microwave applicator means is arranged either on one side or on both sides of the both end faces of the column-shaped film deposition chamber which is formed by said strip type member as the side walls thereof, a microwave transmitting member is arranged on a leading end portion of said microwave applicator means for separating said film deposition chamber and said microwave applicator means airtightly and allowing the microwave energy emitted from said microwave applicator to be transmitted to said film deposition chamber, an auxiliary chamber which can be separated from said film deposition chamber airtightly is arranged adjacent to said film deposition chamber, and a mechanism is arranged for transferring said microwave transmitting member between said film deposition chamber and said auxiliary chamber while maintaining the airtightness of said film deposition chamber.

2. An apparatus for continuously forming a functional deposit film according to claim 1, wherein said curving portion formation means is constituted at least by a pair or more of curve starting end formation means and curve terminating end formation means, and said curve starting end formation means and said curve terminating formation means are arranged to leave a space between them in the longitudinal direction of said strip type member.

3. An apparatus for continuously forming a functional deposit film according to claim 2, wherein said curving portion formation means is constituted at least by a pair of holding and conveying rollers and holding and conveying rings, and said pair of holding and conveying rollers are arranged in parallel to leave a space in the longitudinal direction of said strip type member.

4. An apparatus for continuously forming a functional deposit film according to claim 1, wherein said microwave applicator means is arranged in the direction perpendicular to said end face.

5. An apparatus for continuously forming a functional deposit film according to claim 4, wherein the microwave energy is introduced into said microwave applicator means through a rectangular, square and/or oval waveguide.

6. An apparatus for continuously forming a functional deposit film according to claim 1, wherein a conductive process is given to at least one face of said strip type member.

* * * * *

UNITED STATES PATENT AND TRADEMARK OFFICE
CERTIFICATE OF CORRECTION

PATENT NO. : 5,296,036

DATED : March 22, 1994

INVENTOR(S) : JINSHO MATSUYAMA ET AL.          Page 1 of 11

It is certified that error appears in the above-identified patent and that said Letters Patent is hereby corrected as shown below:

On title page,

AT [54] TITLE

"MEAN" should read --MEANS--.

COLUMN 1

Line 5, "MEAN" should read --MEANS--.
    Line 36, "have" should be deleted.
    Line 37, "slow down" should read --slowdown--.
    Line 46, "effect gas" should read --effect and gas--.

COLUMN 2

Line 1, "earth" should read --earth's--.
    Line 18, "is" should read --in--.

COLUMN 3

Line 35, "passage." should read --passages.--.
    Line 49, "displine" should read --standardization--.

COLUMN 4

Line 31, "polimerization" should read --polymerization--.

COLUMN 5

Line 38, "regards" should read --regarded--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.

It is certified that error appears in the above-identified patent and that said Letters Patent is hereby corrected as shown below:

COLUMN 6

Line 40, "cyclone" should read --cyclotron--.
Line 55, "already" should read --already been--.

COLUMN 7

Line 63, "genuine" should read --generic--.

COLUMN 8

Line 60, "solves" should read --solved--.

COLUMN 9

Line 4, "strating" should read --starting--.
Line 17, "deduction;" should read --pressure;--.

COLUMN 11

Line 14, "roller" should read --rollers--.
Line 43, "slow down" should read --slowdown--.

COLUMN 12

Line 16, "comparative" should read --comparatively--.
Line 44, "EXPERIMENT" should read --EXPERIMENTS--.
Line 60, "due" should read --due to--.
Line 66, "waveguide" should read --waveguide 112--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.

It is certified that error appears in the above-identified patent and that said Letters Patent is hereby corrected as shown below:

COLUMN 13

Line 1, "wave guide 111" should read --waveguide 111--.
Line 2, "wave guide" should read --waveguide--.
Line 13, "is" (second occurrence) should read --as--.

COLUMN 16

Line 4, "are" should be deleted.
Line 40, "with" should be deleted.
Line 52, "allopanic" should read --allotropic--.
Line 53, "terephtalate)" should read --terephthalate)--.
Line 56, "affects" should read --effects--.

COLUMN 17

Line 5, "slow down" should read --slowdown--.
Line 49, "slow down" should read --slowdown--.

COLUMN 18

Line 44, "to" should be deleted.
Line 46, "ari-" should read --air- --.
Line 49, "slow down" should read --slowdown--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.                Page 4 of 11

It is certified that error appears in the above-identified patent and that said Letters Patent is hereby corrected as shown below:

COLUMN 20

Line 9, "rear" should read --rare--.
    Line 11, "rear" should read --rare--.
    Line 30, "rear" should read --rare--.
    Line 35, "eitched." should read --etched.--.
    Line 48, "rear" should read --rare--.
    Line 55, "rear" should read --rare--.
    Line 56, "rear" should read --rare--.

COLUMN 22

Line 58, "optical" should read --optimal--.

COLUMN 23

Line 8, "uniforming" should read --uniformity--.
    Line 15, "event" should read --feature--.
    Line 37, "remaining" should read --retaining--.
    Line 63, "is not functioned" should read
            --does not function--.

COLUMN 24

Line 35, "set up" should read --setup--.
    Line 43, "a" should read --an--.
    Line 44, "exhuasted" should read --exhausted--.
    Line 52, "made" should read --make--.
    Line 54, "a" should read --an--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.       Page 5 of 11

It is certified that error appears in the above-identified patent and that said Letters Patent is hereby corrected as shown below:

COLUMN 26

Line 4,  "uniformly" should read --uniformity--.
    Line 6,  "exellent" should read --excellent--.
    Line 16, "a" (first occurrence) should be deleted.
    Line 20, "function" should read --functions--.
    Line 33, "vaccumized" should read --vacuumized--.
    Line 51, "a" should read --an--.

COLUMN 27

Line 23, "rephtalate," should read --rephthalate,--.
    Line 33, "an enough" should read --a sufficient--.

COLUMN 28

Line 21, "be" should read --the--.
    Line 43, "defective" should read --defects--.
    Line 52, "titan," should read --titanium,-- and
             "tangusten," should read --tungsten,--.
    Line 53, "obum" should read --obium--.
    Line 55, "almina," should read --alumina,--.
    Line 56, "magunesia," should read --magnesia,--.

COLUMN 29

Line 12, "roller" should read --rollers--.
    Line 18, "crawn" should read --curved--.
    Line 67, "Sn, $O_2$, $In_2$, $O_3$," should read --$SnO_2$, $In_2$, $O_3$,--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.     Page 6 of 11

It is certified that error appears in the above-identified patent and that said Letters Patent is hereby corrected as shown below:

COLUMN 30

Line 7, "a" should read --an--.
Line 21, "from" (second occurrence) should be deleted.
Line 51, "almina," should read --alumina,--.
Line 52, "berylium," should read --beryllium,--.

COLUMN 31

Line 8, "replace or etching" should read
        --replaced or etched--.
Line 12, "a" should read --an--.
Line 54, "perform" should read --reform--.

COLUMN 32

Line 22, "applicator" should read --applicator means--.
Line 44, "company own" should read --company owned--.
Line 54, "stab" should read --stub--.
Line 58, "waves" should read --wave--.
Line 62, "curb" should read --curve--.

COLUMN 33

Line 25, "Futhermore," should read --Furthermore,--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.

It is certified that error appears in the above-identified patent and that said Letters Patent is hereby corrected as shown below:

COLUMN 34

Line 39, "side" should read --sides--.
Line 47, "each" should read --between each--.
Line 48, "in" should read --is--.
Line 67, "form" should read --from--.

COLUMN 35

Line 29, "FIG. 9," should read --FIG. 9A,--.
Line 34, "Byton made" should read --by--.

COLUMN 36

Line 65, "think" should read --thin-- and "Sic," should read --SiC,--.

COLUMN 37

Line 1, "Cds," should read --CdS,--.
Line 9, "use." should read --used.--.
Line 14, "$H_2$ HF," should read --$H_2$, HF,--.
Line 18, "Specifially," should read --Specifically,--.
Line 20, "fobidden" should read --forbidden--.
Line 21, "indivdually" should read --individually--.
Line 36, "almina," should read --alumina,--.
Line 34, "titan," should read --titanium,--.
Line 35, "tangusten," should read --tungsten,-- and "thermoresitive" should read --thermoresistive--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.

It is certified that error appears in the above-identified patent and that said Letters Patent is hereby corrected as shown below:

COLUMN 38

Line 20, "rectangle" should read --rectangular--.
Line 36, "in" should read --is--.

COLUMN 39

Line 35, "suitable." should read --suitably.--.

Line 51, "for" should read --to--.

COLUMN 40

Line 26, "an" should be deleted.
Line 50, "Tefron," should read --Teflon,--.

COLUMN 41

Line 45, "example," should read --examples,--.

COLUMN 44

Line 52, "to" should read --be--.
Line 62, "defectives" should read --defects--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.   Page 9 of 11

It is certified that error appears in the above-identified patent and that said Letters Patent is hereby corrected as shown below:

COLUMN 45

Line 5, "transmissibity" should read --transmissivity--.
    Line 12, "Sno$_2$, In$_2$O$_3$, Zno, Cdo," should read
        --SnO$_2$, In$_2$O$_3$, ZnO, CdO,--.
    Line 13, "Cd$_2$Sno$_4$, ITO (In$_2$O$_3$+Sno$_2$)" should read
        --Cd$_2$SnO$_4$, ITO (In$_2$O$_3$+SnO$_2$)-- and
        "exides" should read --oxides--.
    Line 23, "splaying" should read --spraying--.
    Line 31, "Ag," (second occurrence) should be deleted.
    Line 33, "think" should read --thin--.
    Line 53, "A-Sic :F," should read --A-SiC :F,--.

COLUMN 46

Line 27, "vaccumized" should read --vacuumized--.
    Line 29, "vaccumized" should read --vacuumized--.
    Line 34, "vaccumized" should read --vacuumized--.
    Line 66, "holes 318 and 318" should read
        --holes 318 and 319--.

COLUMN 48

Line 21, "seisakujo)" should read --Seisakujo)--.

COLUMN 49

Line 25, "lyethelen" should read --lyethylene--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.

It is certified that error appears in the above-identified patent and that said Letters Patent is hereby corrected as shown below:

COLUMN 50

Line 51, "$5 \times 10^{-6}$" should read --$5 \times 10^{-6}$ Torr--.

COLUMN 51

Line 4, "drawn" should read --withdrawn--.
Line 57, "drawn" should read --withdrawn--.

COLUMN 52

Line 4, "constructed" should read --constructed.--.
Line 29, "Am 1.5" should read --AM 1.5--.

COLUMN 54

Line 37, "$5 \times 10^{-6}$" should read --$5 \times 10^{-6}$ Torr--.
Line 65, "vaccumized" should read --vacuumized--.

COLUMN 55

Line 3, "vaccumized" should read --vacuumized--.
Line 7, "valve 113" should read --valve 1113--.

COLUMN 56
Line 18
   Table 2, "discharging" should read
Line 46
         --discharging unstable; source noise--.
   Table 8, "curring" should read --curving--.

UNITED STATES PATENT AND TRADEMARK OFFICE
CERTIFICATE OF CORRECTION

PATENT NO. : 5,296,036
DATED : March 22, 1994
INVENTOR(S) : JINSHO MATSUYAMA ET AL.

It is certified that error appears in the above-identified patent and that said Letters Patent is hereby corrected as shown below:

COLUMN 64

Line 67, "applicator" should read --applicator means--.

COLUMN 65

Line 16, "terminating" should read --terminating end--.

Signed and Sealed this

Fourth Day of April, 1995

BRUCE LEHMAN

Attest:

Attesting Officer

Commissioner of Patents and Trademarks